United States Patent
Luan et al.

(10) Patent No.: US 9,741,413 B2
(45) Date of Patent: Aug. 22, 2017

(54) METHODS OF READING SIX-TRANSISTOR CROSS-COUPLED THYRISTOR-BASED SRAM MEMORY CELLS

(71) Applicant: Kilopass Technology, Inc., San Jose, CA (US)

(72) Inventors: Harry Luan, Saratoga, CA (US); Bruce L. Bateman, Fremont, CA (US); Valery Axelrad, Woodside, CA (US); Charlie Cheng, Los Altos, CA (US)

(73) Assignee: Kilopass Technology, Inc., San Jose, CA (US)

( * ) Notice: Subject to any disclaimer, the term of this patent is extended or adjusted under 35 U.S.C. 154(b) by 0 days.

(21) Appl. No.: 15/216,652

(22) Filed: Jul. 21, 2016

(65) Prior Publication Data

US 2016/0329094 A1 Nov. 10, 2016

Related U.S. Application Data

(63) Continuation-in-part of application No. 14/740,209, filed on Jun. 15, 2015, and a continuation-in-part of
(Continued)

(51) Int. Cl.
*G11C 11/00* (2006.01)
*G11C 11/419* (2006.01)
(Continued)

(52) U.S. Cl.
CPC .............. *G11C 11/00* (2013.01); *G11C 5/148* (2013.01); *G11C 11/39* (2013.01); *G11C 11/41* (2013.01);
(Continued)

(58) Field of Classification Search
CPC ....... G11C 11/00; G11C 11/39; G11C 11/419; G11C 11/416; G11C 11/4113; G11C 11/418
See application file for complete search history.

(56) References Cited

U.S. PATENT DOCUMENTS 4,257,059 A * 3/1981 Herndon ............. G11C 11/4113
257/525
4,598,390 A 7/1986 Chan
(Continued)

FOREIGN PATENT DOCUMENTS

EP 0066429 12/1982

OTHER PUBLICATIONS

Nemati, F. (2001). A static random access memory cell based on a thin capacitively coupled thyristor device (Order No. 3000073). Available from ProQuest Dissertations & Theses Global: Science & Technology. (220060761). Retrieved from http://search.proquest.com/docview/220060761?accountid=14753.*
(Continued)

*Primary Examiner* — Harry W Byrne
*Assistant Examiner* — Ajay Ojha
(74) *Attorney, Agent, or Firm* — Aka Chan LLP

(57) ABSTRACT

A six-transistor memory cell based upon a thyristor for an SRAM integrated circuit is described together with methods of operation. Methods of increasing the operational speed in reading the contents of a selected memory cell in an array of such memory cells while lowering power consumption, and of avoiding an indeterminate memory cell state when a memory cell is "awakened" from Standby are described.

19 Claims, 52 Drawing Sheets

Related U.S. Application Data application No. 14/740,186, filed on Jun. 15, 2015, now Pat. No. 9,496,020, and a continuation-in-part of application No. 14/607,023, filed on Jan. 27, 2015, now Pat. No. 9,460,771, and a continuation-in-part of application No. 14/590,834, filed on Jan. 6, 2015, now Pat. No. 9,449,669, and a continuation-in-part of application No. 14/740,197, filed on Jun. 15, 2015, now Pat. No. 9,564,198, and a continuation-in-part of application No. 14/607,025, filed on Jan. 27, 2015, now Pat. No. 9,564,441, and a continuation-in-part of application No. 14/590,852, filed on Jan. 6, 2015, now Pat. No. 9,613,968.

(60) Provisional application No. 62/055,582, filed on Sep. 25, 2014.

(51) Int. Cl.
  G11C 11/39    (2006.01)
  G11C 11/418   (2006.01)
  H01L 21/8249  (2006.01)
  H01L 27/06    (2006.01)
  H01L 27/102   (2006.01)
  H01L 27/11    (2006.01)
  G11C 5/14     (2006.01)
  G11C 11/41    (2006.01)
  G11C 11/411   (2006.01)
  G11C 11/416   (2006.01)
  H01L 27/082   (2006.01)

(52) U.S. Cl.
  CPC .......... *G11C 11/411* (2013.01); *G11C 11/418* (2013.01); *G11C 11/419* (2013.01); *H01L 21/8249* (2013.01); *H01L 27/0623* (2013.01); *H01L 27/1027* (2013.01); *H01L 27/1104* (2013.01); *G11C 11/416* (2013.01); *G11C 11/4113* (2013.01); *H01L 27/0821* (2013.01); *H01L 27/0826* (2013.01)

(56) References Cited

U.S. PATENT DOCUMENTS

| | | | |
|---|---|---|---|
| 4,754,430 A | 6/1988 | Hobbs | |
| 4,769,785 A | 9/1988 | Guo | |
| 4,794,561 A | 12/1988 | Hsu | |
| 4,858,181 A | 8/1989 | Scharrer et al. | |
| 5,163,022 A | 11/1992 | Homma | |
| 5,204,541 A | 4/1993 | Samyling et al. | |
| 5,289,409 A | 2/1994 | Reinschmidt | |
| 5,981,335 A | 11/1999 | Chi | |
| 6,026,042 A | 2/2000 | Shirley et al. | |
| 6,225,165 B1 | 5/2001 | Noble, Jr. et al. | |
| 6,229,161 B1 | 5/2001 | Nemati et al. | |
| 6,295,241 B1 | 9/2001 | Watanabe et al. | |
| 6,556,471 B2 | 4/2003 | Chappell et al. | |
| 6,703,646 B1 | 3/2004 | Nemati | |
| 6,933,541 B1 | 8/2005 | Huang | |
| 6,944,051 B1 | 9/2005 | Lee | |
| 6,958,931 B1 | 10/2005 | Yoon et al. | |
| 7,081,378 B2 | 7/2006 | Zheng et al. | |
| 7,157,342 B1 | 1/2007 | Tarabbia | |
| 7,279,367 B1 | 10/2007 | Horch et al. | |
| 7,324,394 B1 | 1/2008 | Yoon et al. | |
| 7,456,439 B1 | 11/2008 | Horch | |
| 7,474,583 B2 | 1/2009 | Yamamura | |
| 7,738,274 B1 | 6/2010 | Nemati et al. | |
| 7,786,505 B1 | 8/2010 | Yang et al. | |
| 7,893,456 B1 | 2/2011 | Nemati et al. | |
| 7,894,225 B2 | 2/2011 | Park | |
| 7,969,777 B1 | 6/2011 | Cho et al. | |
| 8,035,126 B2 | 10/2011 | Nguyen et al. | |
| 8,093,107 B1 | 1/2012 | Nemati et al. | |
| 8,441,881 B1 | 5/2013 | Nemati | |
| 8,576,607 B1 | 11/2013 | Nemati | |
| 8,630,113 B1 | 1/2014 | Xu et al. | |
| 8,837,204 B2 | 9/2014 | Asa | |
| 2001/0002062 A1 | 5/2001 | Noble, Jr. et al. | |
| 2002/0033516 A1 | 3/2002 | Choi et al. | |
| 2002/0036327 A1 | 3/2002 | Fazan et al. | |
| 2002/0045301 A1 | 4/2002 | Sicard et al. | |
| 2002/0190265 A1 | 12/2002 | Hsu et al. | |
| 2002/0191476 A1 | 12/2002 | Kojima | |
| 2004/0056270 A1 | 3/2004 | Hsu et al. | |
| 2005/0167786 A1 | 8/2005 | Gill et al. | |
| 2006/0011940 A1 | 1/2006 | Nemati et al. | |
| 2007/0189067 A1 | 8/2007 | Goodwin | |
| 2007/0300100 A1 | 12/2007 | Foss | |
| 2008/0104481 A1 | 5/2008 | Ito | |
| 2008/0239803 A1 | 10/2008 | Cho | |
| 2008/0279017 A1 | 11/2008 | Shimano et al. | |
| 2009/0108287 A1 | 4/2009 | Nguyen et al. | |
| 2009/0121296 A1 | 5/2009 | Kwon et al. | |
| 2010/0110773 A1 | 5/2010 | Sachdev et al. | |
| 2010/0232200 A1 | 9/2010 | Shepard | |
| 2010/0246277 A1 | 9/2010 | Widjaja et al. | |
| 2010/0312996 A1 | 12/2010 | Aymeric et al. | |
| 2010/0315871 A1 | 12/2010 | Nemati et al. | |
| 2011/0116300 A1 | 5/2011 | Maejima | |
| 2011/0121744 A1 | 5/2011 | Salvestrini et al. | |
| 2011/0249499 A1 | 10/2011 | Fisch et al. | |
| 2011/0299327 A1 | 12/2011 | Asa | |
| 2012/0140546 A1 | 6/2012 | Scheuerlein | |
| 2012/0256292 A1 | 10/2012 | Yu et al. | |
| 2012/0314472 A1 | 12/2012 | Chung | |
| 2012/0314485 A1 | 12/2012 | Cai et al. | |
| 2013/0083613 A1 | 4/2013 | Phan et al. | |
| 2013/0163330 A1 | 6/2013 | Sharon | |
| 2013/0228855 A1 | 9/2013 | Molin et al. | |
| 2013/0322194 A1 | 12/2013 | Rachamadugu et al. | |
| 2014/0104926 A1 | 4/2014 | Sutardja et al. | |
| 2014/0117454 A1 | 5/2014 | Liu et al. | |
| 2014/0153346 A1 | 6/2014 | Roy et al. | |
| 2014/0160871 A1 | 6/2014 | Zimmer et al. | |
| 2014/0167101 A1 | 6/2014 | Bobde et al. | |
| 2014/0191295 A1 | 7/2014 | Greene et al. | |
| 2014/0269018 A1 | 9/2014 | Jin et al. | |
| 2015/0179649 A1 | 6/2015 | Tang | |
| 2015/0339068 A1 | 11/2015 | Cudak et al. | |

OTHER PUBLICATIONS

W. H. Herndon, "Trends in bipolar static random access memory (SRAM) design," Bipolar Circuits and Technology Meeting, 1989., Proceedings of the 1989, Minneapolis, MN, 1989, pp. 203-208.*

International Search Report, PCT Application PCT/US2015/052493, Jan. 7, 2016, 7 pages.

Written Opinion, PCT Application PCT/US2015/052493, Jan. 7, 2016, 4 pages.

Jutzi, et al., "Cross-Coupled Thyristor Storage Cell," IBM J. Res. Develop., Jan. 1972, pp. 35-44.

Tong, et al., "Two-Terminal Vertical Memory Cell for Cross-Point Static Random Access Memory Applications," J. Vac. Sci. Technol. B 32(2), Mar./Apr. 2014, 2014 American Vacuum Society, pp. 021205-1 to 021205-7.

Sugizaki, et al., "Ultra High-Speed Novel Bulk Thyristor-sRAM (BT-RAM) Cell with Selective Epitaxy Anode (SEA)," Sony Corporation, Japan, 4 pages.

International Search Report, PCT Application PCT/US2015/052480, Feb. 10, 2016, 5 pages.

Written Opinion, PCT Application PCT/US2015/052480, Feb. 10, 2016, 8 pages.

International Search Report, PCT Application PCT/US2015/052497, Jan. 28, 2016, 11 pages.

Written Opinion, PCT Application PCT/US2015/052497, Jan. 28, 2016, 13 pages.

International Search Report (Corrected Version), PCT Application PCT/US2015/052468, Jan. 27, 2016, 10 pages.

(56) References Cited

OTHER PUBLICATIONS

Written Opinion (Corrected Version), PCT Application PCT/US2015/052468, Jan. 27, 2016, 8 pages.
International Search Report, PCT Application PCT/US2015/052488, Jan. 31, 2016, 12 pages.
Written Opinion, PCT Application PCT/US2015/052488, Jan. 31, 2016, 8 pages.
International Search Report, PCT Application PCT/US2015/052499, Jan. 28, 2016, 6 pages.
Written Opinion, PCT Application PCT/US2015/052499, Jan. 28, 2016, 4 pages.
International Search Report, PCT Application PCT/US2015/052505, Jan. 27, 2016, 8 pages.
Written Opinion, PCT Application PCT/US2015/052505, Jan. 27, 2016, 3 pages.
International Search Report, PCT Application PCT/US2015/052507, Feb. 2, 2016, 5 pages.
Written Opinion, PCT Application PCT/US2015/052507, Feb. 2, 2016, 3 pages.

\* cited by examiner

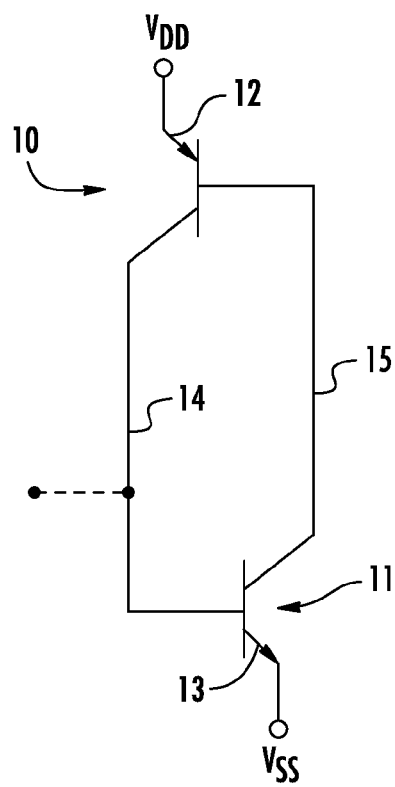
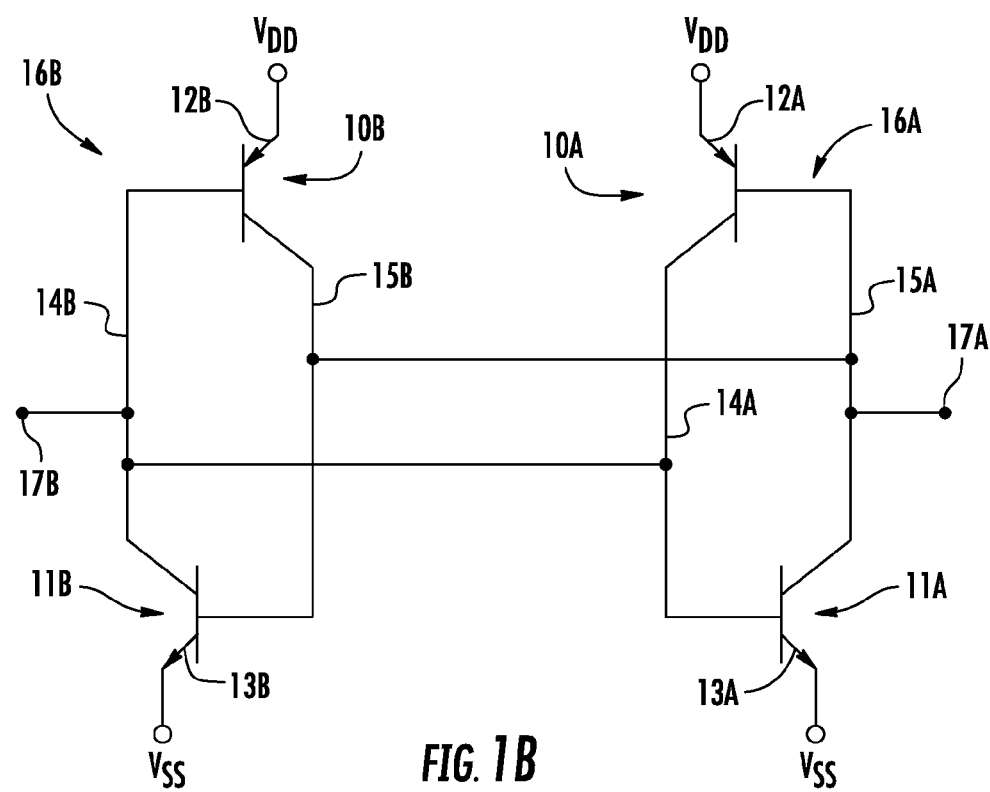
FIG. 1A
FIG. 1B

PEAK CURRENT RISES
AND FALLS AS BIT LINE
VOLTAGE FALLS

PEAK CURRENT RISES
AND FALLS AS BIT LINE
VOLTAGE RISES

PEAK CURRENT RISES
AND FALLS AS BIT LINE
VOLTAGE FALLS

PEAK CURRENT RISES
AND FALLS AS BIT LINE
VOLTAGE RISES

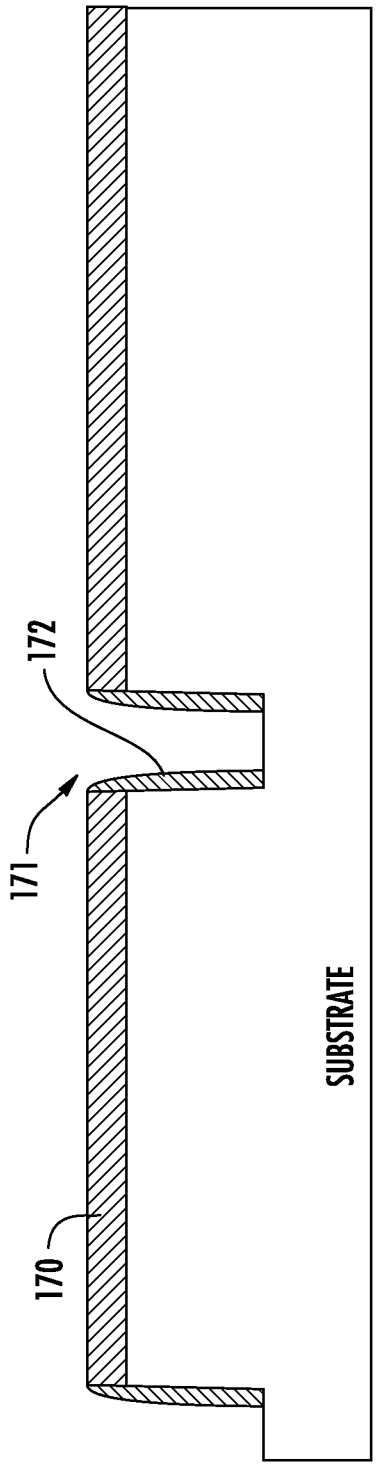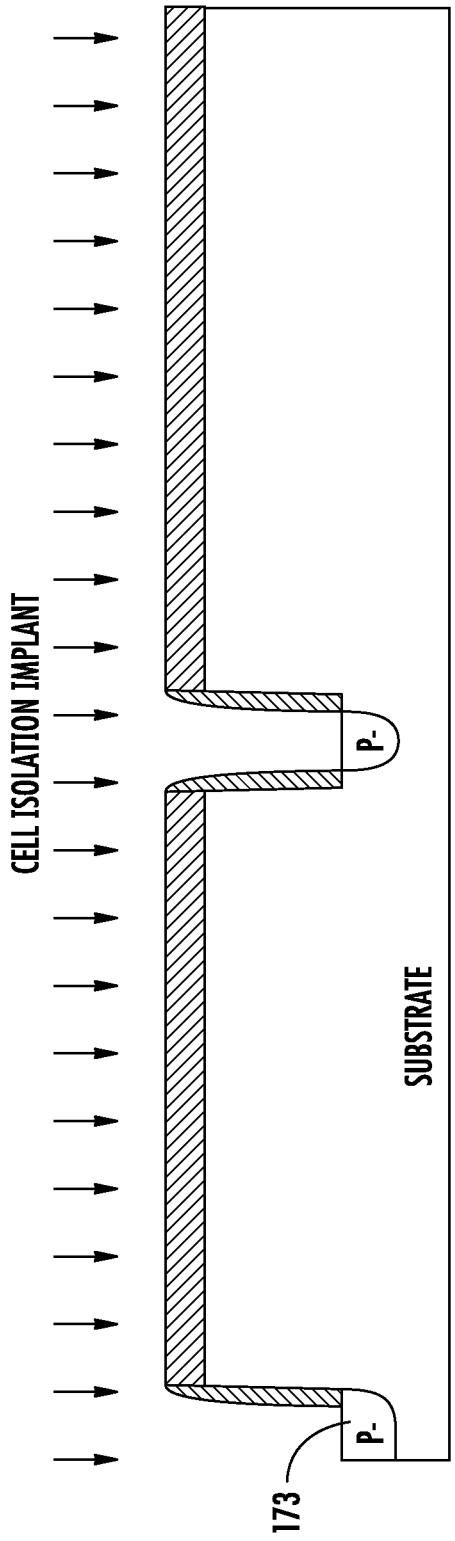

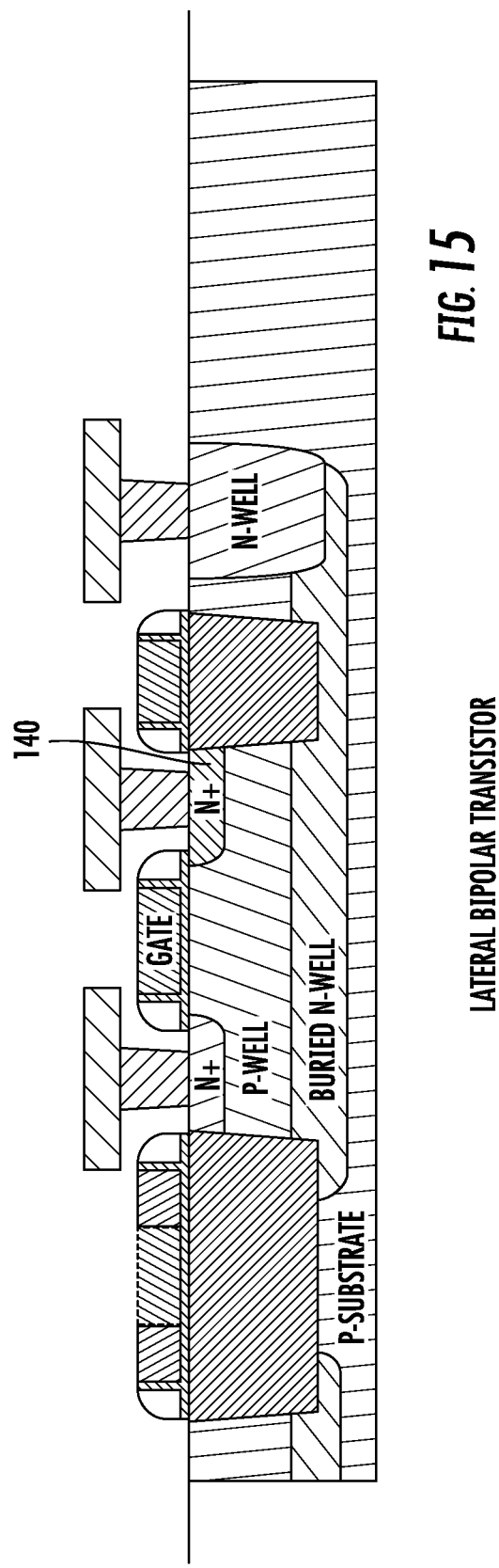

NMOS FET AND MERGED NPN BIPOLAR TRANSISTOR PROCESS

NMOS FET AND MERGED NPN BIPOLAR TRANSISTOR PROCESS

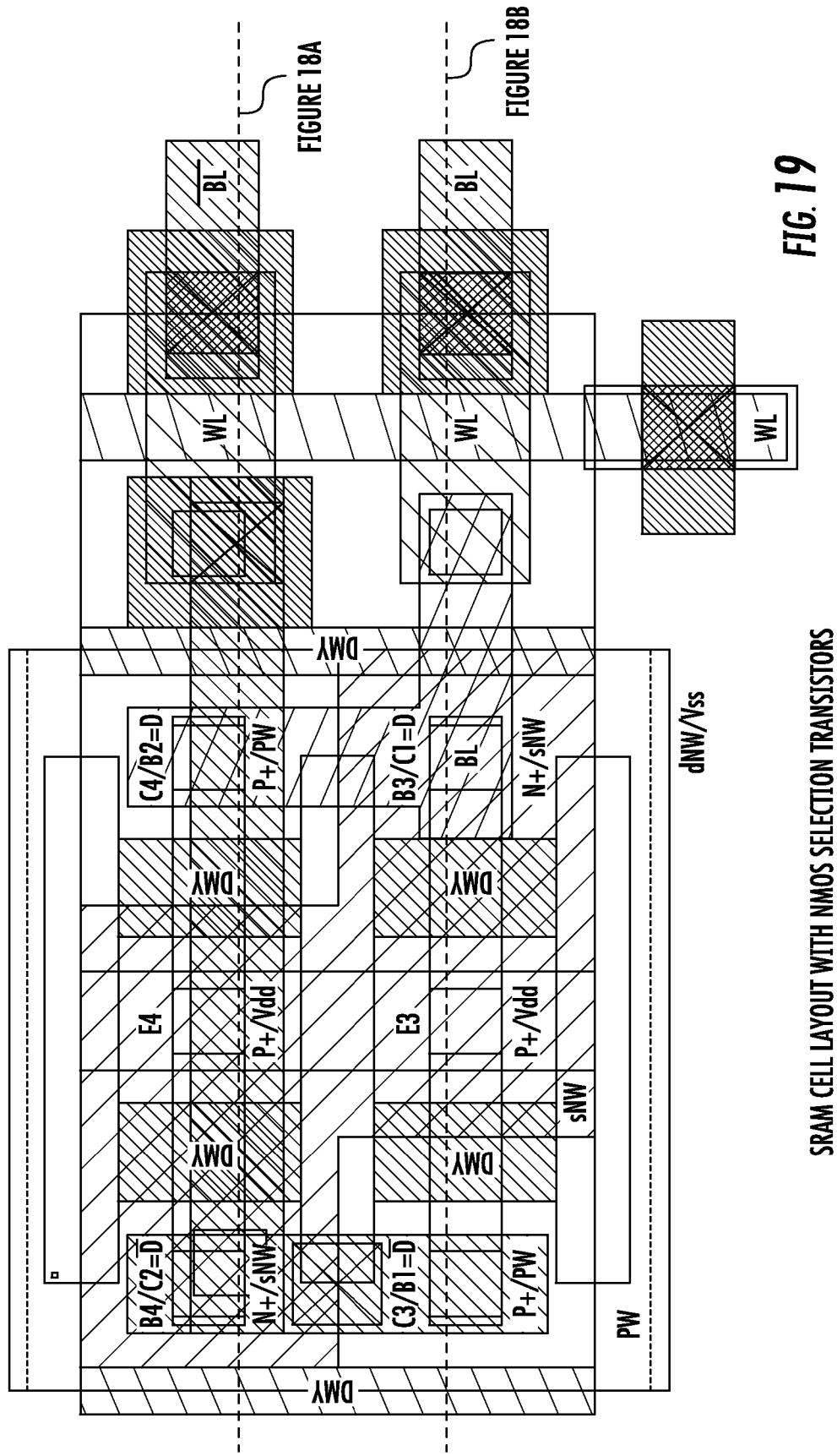

SIX TRANSISTOR CELL LAYOUT WITH BIPOLAR SELECT TRANSISTORS

THREE-TRANSISTOR CELL LAYOUT

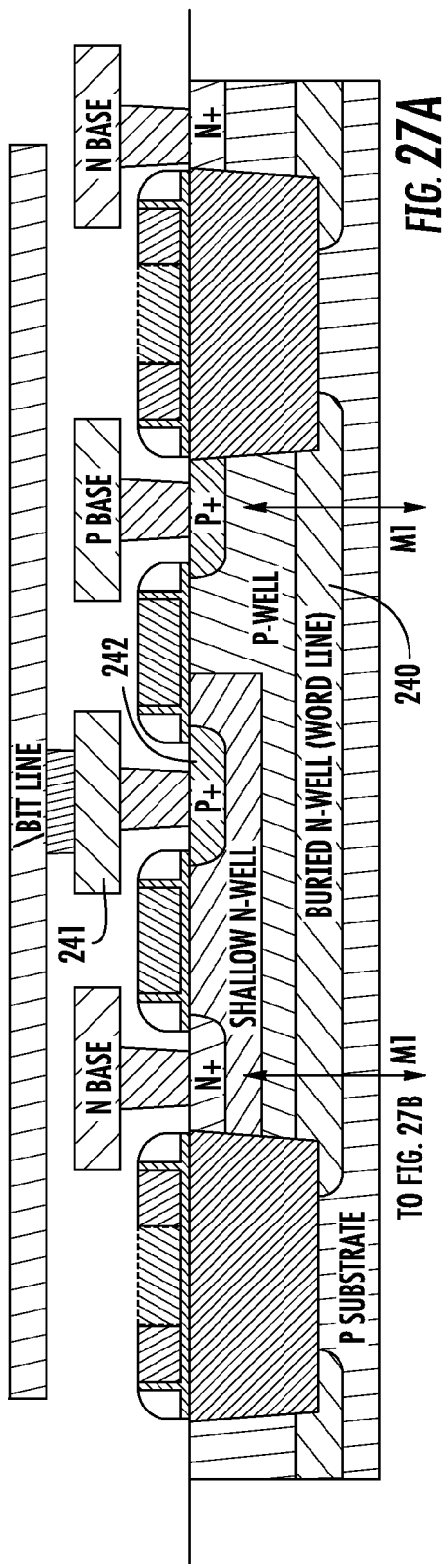
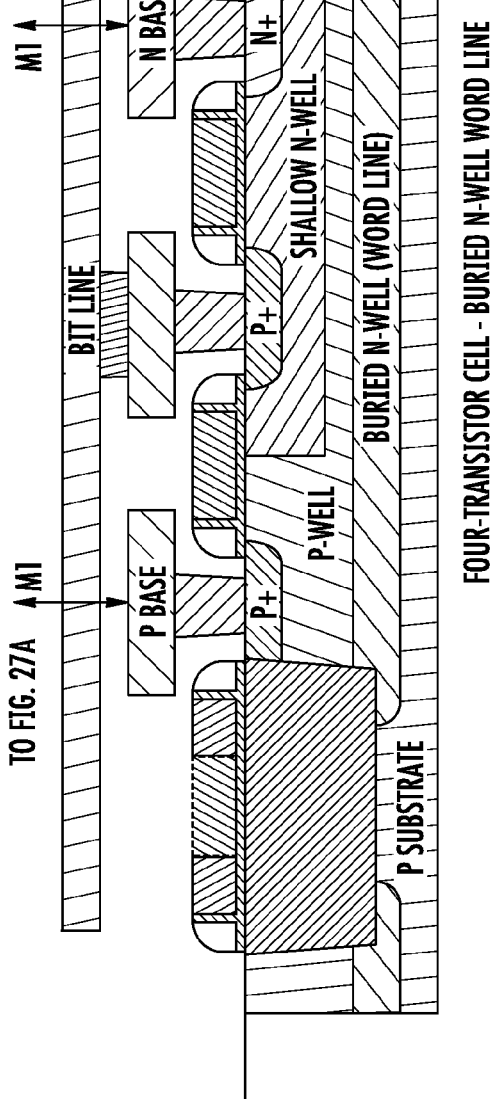

FOUR-TRANSISTOR CELL - BURIED N-WELL WORD LINE - LAYOUT

FOUR-TRANSISTOR CELL LAYOUT - WRITE-ASSIST FETs

TWO TRANSISTOR SRAM CELL WITH WRITE-ASSIST FETs
(WORD LINE ON TOP CONFIGURATION)

METHODS OF READING SIX-TRANSISTOR CROSS-COUPLED THYRISTOR-BASED SRAM MEMORY CELLS

CROSS-REFERENCE TO RELATED APPLICATIONS

This patent application is a continuation-in-part of all of the following patent applications: U.S. patent application Ser. No. 14/740,209, filed Jun. 15, 2015 and entitled "Write Assist SRAM Circuits and Methods of Operation" and U.S. patent application Ser. No. 14/740,186, filed Jun. 15, 2015 and entitled "Six-Transistor SRAM Circuits and Methods of Operation"; which are continuations of U.S. patent application Ser. No. 14/607,023, filed Jan. 27, 2015 and entitled "Two-Transistor SRAM Circuits and Methods of Operation"; which is a continuation of U.S. patent application Ser. No. 14/590,834, filed Jan. 6, 2015 and entitled "Cross-Coupled Thyristor SRAM Circuits and Methods of Operation"; U.S. patent application Ser. No. 14/740,197, filed Jun. 15, 2015 and entitled, "Six-Transistor SRAM Semiconductor Structures and Methods of Fabrication"; which is a continuation of U.S. patent application Ser. No. 14/607,025, filed Jan. 27, 2015 and entitled "Two-Transistor SRAM Semiconductor Structure and Methods of Fabrication"; which is continuation of U.S. patent application Ser. No. 14/590,852, filed Jan. 6, 2015 and entitled "Cross-Coupled SRAM Semiconductor Structures and Methods of Fabrication"; each of which claims the benefit of U.S. Provisional Patent Application No. 62/055,582, filed Sep. 25, 2014, which is incorporated by reference along with all other references cited in this application.

BACKGROUND OF THE INVENTION

This invention is related to integrated circuit devices having memory functions and, in particular, to static random access memory (SRAM) devices.

From the invention of the integrated circuit in the late 1950's, circuit designs have been in constant development, particularly for integrated devices, in keeping with the developing semiconductor technologies. An early technology was bipolar technology which, compared to later integrated circuit technologies, occupied much space on a semiconductor substrate surface and required large amounts of electrical current with resulting high power consumption. Later field-effect technologies, particularly MOS (Metal-Oxide-Semiconductor) technology, used transistors which were much smaller than their bipolar counterparts with lower currents and consequently lower power consumption. CMOS (Complementary MOS) technology lowered currents and power consumption in an integrated circuit even further. Currently nearly all large-scale integrated circuits have turned to complementary metal oxide semiconductor (CMOS) technology.

Bipolar technology for semiconductor memory has been investigated over the years. But this research has typically focused upon the individual memory cell and has stopped at the conclusion that the memory cell could be part of an array. Further research and development of a bipolar memory cell array has been hampered by the longstanding belief that the CMOS memory cells occupied less space and consumed less power than any bipolar memory cell and that any bipolar memory cell array would necessarily be inferior to a CMOS array. Progress in recent years has relied upon relentless scaling in semiconductor processing technology, thus shrinking memory cell dimensions for greater circuit densities and higher operational speeds.

One integrated circuit implemented in CMOS technology is the SRAM, a circuit which employs bistable latching circuitry in its memory cells, enabling an SRAM memory cell to stay in a logic "1" or a logic "0" state as long as power is applied to the cell. Two cross-coupled inverters, each of which includes an active transistor and a complementary load transistor, and two select transistors, form the six-transistor CMOS SRAM cell which has been used for decades. Many integrated circuits in use today require a combination of CMOS logic circuits and on-chip high performance memories. Modern high performance processors and System-on-Chip (SoC) applications demands more on-chip memory to meet the performance and throughput requirements. For example, one integrated circuit can include 32 megabytes of CMOS SRAM as a cache memory on the chip. With a $V_{DD}$ of 0.9 volts and a leakage current of 25 nanoamperes per memory cell, such a circuit consumes 7 amperes just from the memory array, without considering the power consumption of the logic portion of the chip. In addition, as the size of such circuits shrink with continued scaling in process technology used to manufacture the circuits, the stability and power consumption of the memory cells have become one of the limiting factors in process cost and circuit complexity, making the designers of such chips reluctant to use the latest process technology.

The CMOS SRAM in such devices typically has an access time on the order of 200 picoseconds with a standard deviation of 30 picoseconds. Thus to obtain 6-σ sigma reliability an additional allowance of 6×30 picoseconds is necessary, resulting in a requirement to allow 380 picoseconds for access to the memory cells. The use of faster bipolar technology in such devices is typically limited to driver circuits in the SRAM memory, and even when used there, a more complicated bipolar CMOS (BiCMOS) fabrication process is used, requiring additional thermal cycles and making the fabrication of the MOS devices more difficult and expensive.

As semiconductor processes shrink down to nanometer generations, however, both leakage and active currents through MOS transistors are particularly susceptible to wide variations compared to the currents comparably sized bipolar transistors. Projections indicate that with increased packing densities and statistical deviations in electrical current the operation of future CMOS SRAM devices is problematical. It is desirable that an alternative approach be found.

The present invention provides for an SRAM memory cell that is based upon a thyristor, one form of bipolar technology and often represented by two coupled bipolar transistors. The memory cell is highly adaptable with many variations and the resulting SRAM integrated circuit can be designed for high-speed operation, or for lower speed operation if less power is required, or even for higher integration if a tightly packed SRAM integrated circuit is required. Furthermore, the SRAM memory cell can be manufactured with conventional CMOS technologies to avoid the development costs of a new technology.

BRIEF SUMMARY OF THE INVENTION

The present invention provides for a method of reading an SRAM cell in an integrated circuit array of such cells. The array of SRAM cells is interconnected by a plurality of complementary bit line pairs and a plurality of word lines. Each SRAM cell has a pair of cross-coupled thyristors, each thyristor having first and second semiconductor regions intermediate an anode and a cathode, a first intermediate region of one thyristor connected to the second intermediate region of the other thyristor and a second intermediate region of the one thyristor connected to the first intermediate region of the other thyristor, each thyristor having an anode connected to a first supply voltage and a cathode connected to a second supply voltage, and a pair of bipolar select transistors, each bipolar select transistor having a collector region connected to one of a complementary bit line pair, and an emitter region connected to the first intermediate region of one of the thyristors, and having a base region connected to a word line. The method comprises the steps of: selecting at least one SRAM cell; raising a first supply voltage from a standby mode voltage of the at least one selected SRAM cell; and raising the voltage on the word line connected to the bipolar select transistors of the at least one selected SRAM cell after a delay; whereby a state of the at least one selected SRAM cell is read through a complementary bit line pair connected to the bipolar select transistors of the at least one selected SRAM cell.

The present invention also provides for another method of reading an SRAM cell in the integrated circuit array of such cells. The method comprises the steps of: selecting at least one SRAM cell; raising the voltage on the word line connected to the bipolar select transistors of the selected SRAM cell from a word line standby voltage; and raising the first supply voltage from a first supply standby voltage, the first supply voltage below the raised word line voltage; whereby a state of the at least one selected SRAM cell is read through a complementary bit line pair connected to the bipolar select transistors of the at least one selected SRAM cell.

Other objects, features, and advantages of the present invention will become apparent upon consideration of the following detailed description and the accompanying drawings, in which like reference designations represent like features throughout the figures.

BRIEF DESCRIPTION OF THE DRAWINGS

Herein the same reference numerals are often used in different drawings where the numbered element serves the identical or similar function and helps the reader's understanding of the described subject matter.

FIG. 1A is a circuit diagram of a thyristor; and FIG. 1B shows a circuit diagram of cross-coupled thyristors that form a memory cell.

FIGS. 11A and 11B illustrates a process for forming shallow trench isolation regions.

FIG. 15 illustrates a lateral bipolar transistor.

FIG. 19 is a top view of the structures shown in FIGS. 18A and 18B.

FIGS. 27A and 27B illustrate cross-sectional views of a four-transistor SRAM cell.

DETAILED DESCRIPTION OF THE INVENTION

Figure 2:
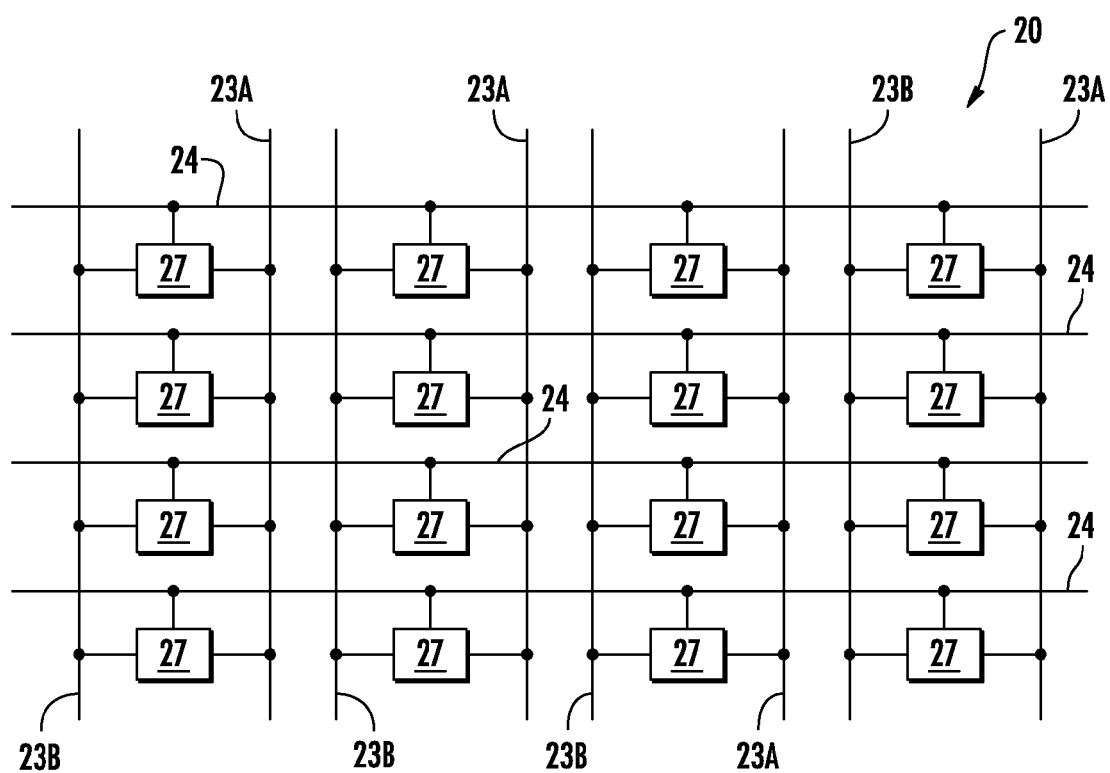
FIG. 2 illustrates an array of SRAM memory cells.

I. Description of Circuits and their Operation a. Description and Operation of a Thyristor As observed earlier, as semiconductor processes shrink the statistical variations of MOS transistors increase. This is not the case with bipolar transistors. In fact, at a certain point, which is believed to be processes having a critical dimension of 55 nm, often termed "55 nm processes," many of the traditional advantages of MOS transistors over bipolar transistors disappear. That is, bipolar transistors have a comparable size to MOS transistors, and carry current with less statistical variation than their MOS transistor counterparts. Hence one observation of the present invention is that with 55 nm processes or smaller, SRAM memory arrays are better suited with bipolar technology.

The SRAM memory cells of the present invention are based upon a thyristor. A thyristor, also termed a silicon-controlled rectifier, are normally used for power applications. A thyristor is a four-layer (PNPN), three-junction device typically with two terminals, an anode and a cathode. In power applications there is typically a third terminal, called a control terminal for controlling the currents between the anode and cathode. FIG. 1A is a circuit diagram of a thyristor as represented by two bipolar transistors, a PNP transistor 10 and a NPN transistor 11, which when merged form a PNPN thyristor. The emitter terminal 12 of the PNP transistor 10 forms the anode, and the emitter terminal 13 of the NPN transistor 11 forms the cathode. For purposes of completeness, a control terminal is shown in the drawing by a dotted line.

With the thyristor appropriately powered between two voltage supplies, e.g., at voltages $V_{DD}$ and $V_{SS}$, the thyristor can be in one of two states, either "ON" and conducting current, or "OFF" and non-conducting. If the thyristor in FIG. 1A is conducting, the base region of the NPN transistor 11/collector region of PNP transistor 10 (indicated by reference numeral 14) is high, i.e., the base-emitter junction of the transistor 11 is forward-biased. The collector region of the NPN transistor 11/base region of the PNP transistor 10 (indicated by the reference numeral 15) is low, i.e., the base-emitter junction of the transistor 10 is also forward-biased. Both transistors 10 and 11 are in saturation mode and current flows through the thyristor. If the thyristor is "off," the base region of the NPN transistor 11/collector region of PNP transistor 10 is low, i.e., the base-emitter junction of the transistor 11 is not forward-biased. The collector region of the NPN transistor 11/base region of the PNP transistor 10 is high, i.e., the base-emitter junction of the transistor 10 is also not forward-biased. Both transistors 10 and 11 are off mode and no current flows through the thyristor (except for leakage currents).

At the scale of integrated circuits the thyristor is compatible with current conventional CMOS manufacturing technologies, as explained below, and is surprising adaptable to different circuit configurations to emphasize speed, power and integration as demanded by a user's application of an SRAM memory, whether as an SRAM integrated circuit or as a part of an integrated circuit.

b. Description and Operation of Cross-Coupled Thyristors

In one preferred embodiment of the present invention a pair of thyristors, each thyristor 16A, 16B formed by a PNP transistor 10A, 10B and an NPN transistor 11A, 11B, are cross-coupled as shown in FIG. 1B to form a memory cell. Where the memory cell includes select transistors, the P-type emitter terminals 12A, 12B of both transistors 10A, 10B are connected to a voltage supply line at $V_{DD}$, the memory high power supply voltage, while the N-type emitter terminals 13A, 13B of the transistors 11A, 11B are connected to a second power line at $V_{SS}$, the memory low power supply voltage. The two thyristors 16A and 16B are cross-coupled by the connection of the merged N-type base of the transistor 10A and collector of the transistor 11A to the merged P-type collector of the transistor 10B and the base of the transistor 11B, and the connection of the merged N-type collector of the transistor 11B and base of the transistor 10B to the merged P-type collector of the transistor 10A and base of the transistor 11A. A terminal 17A to the merged N-type base of the transistor 10A and collector of the transistor 11A is connected to a select transistor for the memory cell (not shown in the drawing), and a second terminal 17B to the merged N-type base of the transistor 10B and collector of the transistor 11B is connected to a second select transistor for the memory cell.

Operationally, the described cross-coupled thyristor memory cell core can be in one of two logic states, one arbitrarily termed "1" and the other "0". Using the circuit of FIG. 1B as an example, if the thyristor 16A is ON, with the transistor 10A in saturation mode, the merged P-type collector of the transistor 10A and base of the transistor 11A is high (to forward-bias the base-emitter junction). By the cross-coupling, the collector of the transistor 11B and base of the transistor 10 is high, and the base-emitter junction of the transistor 10B in the thyristor 15B cannot be forward-biased to turn the transistor 10B off. The thyristor 15B is OFF. Conversely, if the thyristor 15B is ON, the thyristor 15A is OFF.

Arranging a plurality of SRAM memory cells into an array provides an integrated circuit memory that can be combined with other circuits, for example, logic circuits. The memory cells are interconnected by sets of electrically conducing lines running in perpendicular directions. FIG. 2 illustrates one such general arrangement with an array 20 of SRAM cells 27, each cell having a cross-coupled thyristor core. A set of horizontal word lines 24 and a set of vertical bit lines 23A, 23B interconnect the SRAM cells. Each cell 27 is connected to a word line 24, which in the drawing runs horizontally, and a bit line 23A and its complementary bit line 23B that run vertically in the drawing. Conventionally, a bit line is understood to carry data, a bit of information, to and from a memory cell. A word line is understood to activate a memory cell for the data to be carried into the memory cell, a Write operation, or for data to be carried from the memory cell, a Read operation. In a Write operation the bit lines 23A and 23B carry complementary voltages, representing either a digital logic "1" or a "0" state, to be written into the selected memory cell 31 for storage. In a Read operation the bit lines 23A and 23B start at equal voltages and then tip high or low depending upon the digital signal stored in the memory cell 27. The bit line 23B carries the signal complementary to that carried by the bit line 23A so that if the bit line 23A is at a "high" voltage, the bit line 23B is at a "low" voltage, and vice versa. If the memory cells 27 are neither being written nor being read, the memory cells are in Standby by which they are kept in a steady state condition to maintain their respective stored logic states.

c. SRAM Cell with Cross-Coupled Thyristors and Select Transistors

Figure 3A:
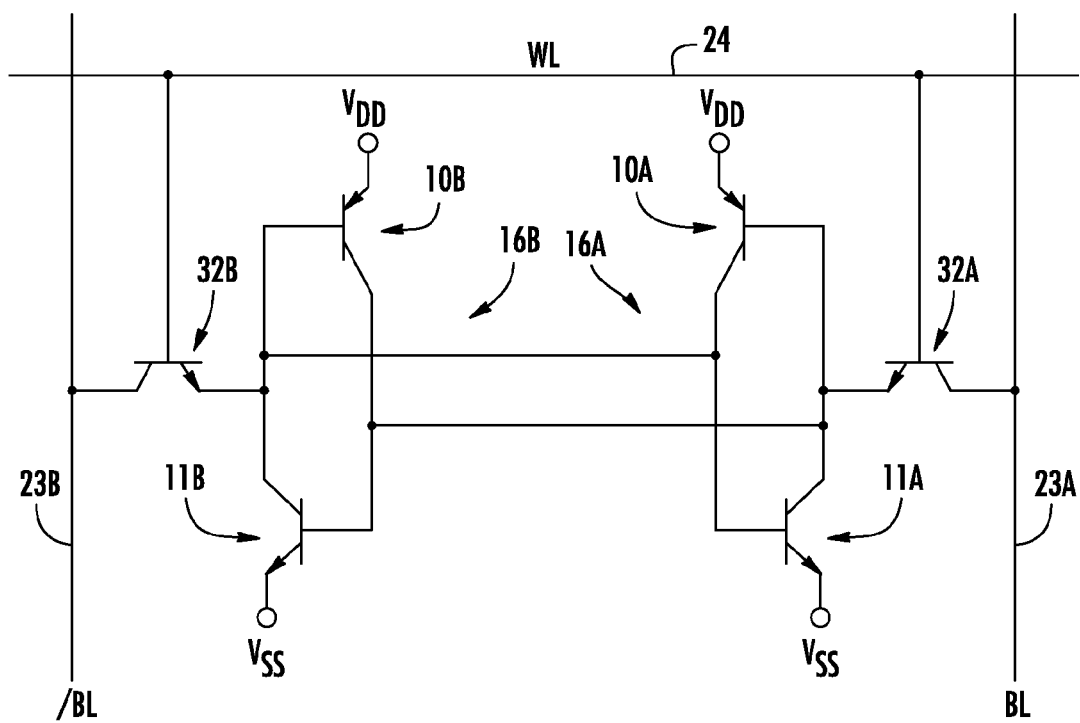
FIG. 3A is a circuit diagram of a cross-coupled thyristor memory cell with bipolar select transistors.

In one arrangement select transistors are used to connect the cross-coupled thyristors to the bit lines to form a six-transistor memory cell, i.e., four transistors forming the cross-coupled thyristor core and two select or access transistors. This is illustrated in FIG. 3A in which the same reference numerals as in FIG. 1B are used for the cross-coupled thyristors 16A and 16B. Bipolar transistors 32A and 32B are used for select transistors to the cross-coupled thyristors 16A and 16B to form an SRAM cell. The emitter region of the NPN select transistor 32A is connected to the merged collector region of the NPN transistor 10A/base region of the PNP transistor 11A of the thyristor 16A and also to the merged base region of the NPN transistor 11B/collector region of the PNP transistor 10B of the thyristor 16B. The collector region of the NPN select transistor 32A is connected to the bit line 23A and the base region of the transistor 32A is connected to the word line 24. In a similar fashion the emitter region of the NPN select transistor 32B is connected to the merged collector region of the NPN transistor 11B/base region of the PNP transistor 10B of the thyristor 16B and also to the merged base region of the NPN transistor 11A/collector region of the PNP transistor 10A of the thyristor 16A. The collector region of the NPN select transistor 32B is connected to the bit line 23B and the base region of the transistor 32B is connected to the word line 24. To power the memory cell, the emitter regions of the PNP transistors 10A and 10B are connected to the upper power supply at voltage $V_{DD}$ and the emitter regions of the NPN transistors 11A and 11B are connected to the lower power supply at voltage $V_{SS}$.

For the SRAM cell to function properly, the memory cell requires a voltage higher than standard core logic voltage, i.e., the voltage used by the logic circuits of the integrated circuit to which the SRAM cell belongs. Standard core logic circuits, which are CMOS, typically operate in a range from 0 to 1 volt. Such SRAM memory supply voltage requirements can be met by using a higher voltage for the SRAM power supply, for example, the voltage used by the Input/Output circuits of the integrated circuit, $V_{ddIO}$, or a voltage derived from $V_{ddIO}$. But in one embodiment of the present invention, the requirement for extra circuitry can be avoided. In the construction of the memory cell, the SRAM memory cell can be placed in P-type tub in a deep N-type well in the semiconductor substrate. See FIG. 24 and related description of the structure and process for the deep N-type well. The P-type tub is biased negatively so that the bipolar select transistors 32A and 32B can use the standard logic core voltages. Thus where the word lines are typically driven between the upper supply voltage $V_{DD}$ and the lower supply voltage $V_{SS}$ for the SRAM cells, the voltage swing for the word lines connected to the select bipolar transistors 32A and 32B is limited to 0.5V above $V_{SS}$(=0V or ground) and 1.5V with respect to $V_{DD}$ in one embodiment of the invention. This arrangement enables the circuits which drive the word lines to be constructed directly from core logic circuitry, i.e., no intervening voltage translation circuitry is required between the core logic and the bit lines.

Figure 3B:
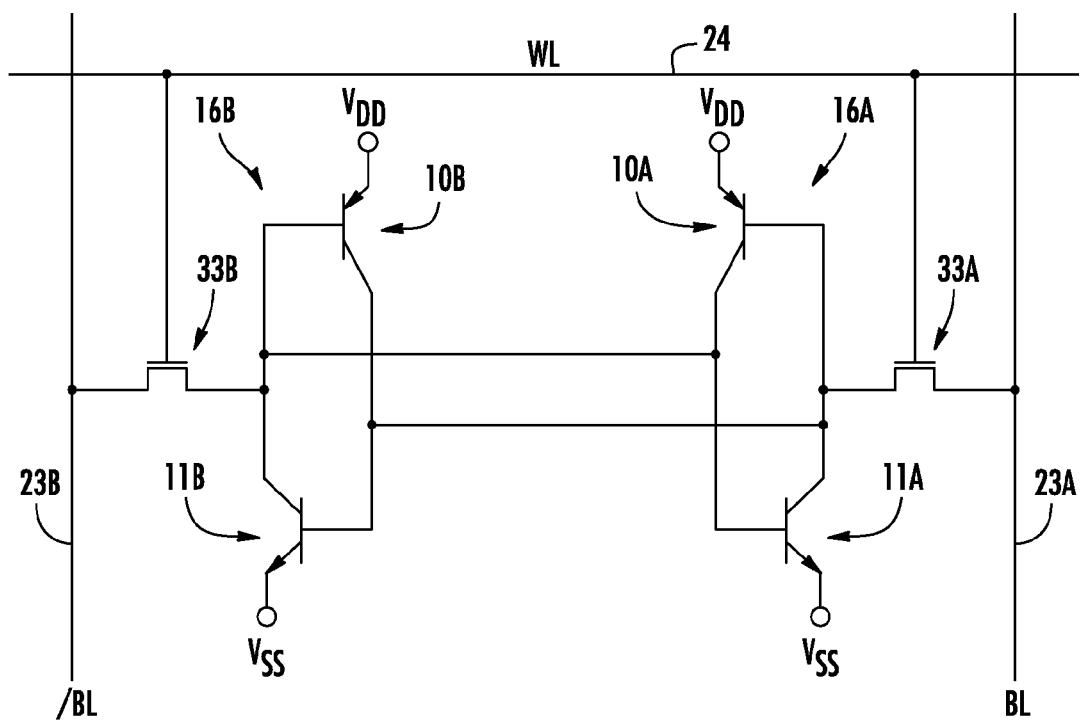
FIG. 3B is circuit diagram of a memory cell with MOS select transistors.

Field effect transistors can also be used for the select transistors as shown in FIG. 3B. NMOS(FET) transistors 33A and 33B respectively connect the word lines 23A and 23B to the cross-coupled thyristors 16A and 16B, as illustrated in FIG. 3B with many of the same reference numerals as in FIG. 3A. A source/drain region of the NMOS select transistor 33A is connected to the merged collector region of the NPN transistor 11A/base region of the PNP transistor 10A of the thyristor 16A and also to the merged base region of the NPN transistor 11B/collector region of the PNP transistor 10B of the thyristor 16B. The other source/drain region of the NMOS select transistor 33A is connected to the bit line 23A and the gate of the transistor 33A is connected to the word line 24. In a similar fashion one source/drain of the NMOS select transistor 33B is connected to the merged collector region of the NPN transistor 11B/base region of the PNP transistor 10B of the thyristor 16B and also to the merged base region of the NPN transistor 11A/collector region of the PNP transistor 10A of the thyristor 16A. The other source/drain region of the transistor 33B is connected to the complementary bit line 23B and gate of the transistor 33B is connected to the word line 24. To power the memory cell, the emitter regions of the PNP transistors 10A and 10B are connected to the upper power supply at voltage $V_{DD}$ and the emitter regions of the NPN transistors 11A and 11B are connected to the lower power supply at voltage $V_{SS}$. Below (FIG. 26 et seq.) we describe how the circuit of FIG. 3B is implemented and manufactured.

Whether bipolar or field effect transistors are used as select transistors for the memory cell is dependent upon various design "trade-offs." The field effect transistor is smaller than the bipolar transistor with a resulting desirable smaller cell size. But there are major disadvantages to using FETs as the select devices. (1) They limit the access speed of the memory cell to being the same as a CMOS counterpart. In addition, FETs as select devices limit the amount of current that can be provided by a memory cell to raise or lower the voltages on the bit line capacitance. The bipolar NPN select devices can provide much more current and thus swing the voltage on the bit line much faster. (2) FETs manufactured with advanced processing are subject to a high degree of random variation from cell to cell, as described earlier. This degrades the operating margins of the memory cell which often must be countered by either exotic circuit design approaches in the word line and bit line drive circuits or by increasing transistor sizes in the memory cell, thus increasing the cell size. The random variations in the NPN select devices are much smaller. (3) The standby current of the unselected memory cells is controlled by the undesired leakage of the "OFF" FET devices in the memory cell. In advanced processed devices this leakage gets very large. Using an MOS select transistor with the thyristor-based memory cell introduces this source of unwanted leakage current into the cell design, whereas an NPN select device avoids this unwanted leakage current.

A memory cell in an operational array is either in Standby mode, Write mode or Read mode. For the memory cell with cross-coupled thyristors and select transistors in Standby, the bit lines 23A and 23B and word line 24 are held at voltages so that the memory cell maintains its stored logic state indefinitely. In a Write operation, one or more memory cells are selected by the input of bits into the memory array address decoder(s). The word line of a selected memory cell is driven high to select the cross-coupled thyristor 16A, 16B and the complementary bit lines are driven high/low to place the cell into the desired logic state. The bit and word lines of the other memory cells which are not to be written into are kept at the Standby voltages to remain unchanged. The voltages on the selected memory cell for the Write operation must be sufficiently large so as to drive the cell into the desired logic state, yet not so large so to change the logic states of the other cells which are also connected to the bit and word lines of the selected memory cell. In a Read operation the complementary bit lines 23A, 23B of the memory cell are both driven high and the word line 24 of the memory cell is driven to a voltage to allow the logic state of the cell to pull the voltage of one of the complementary bit lines 23A, 23B to allow the memory cell to be read by a differential amplifier. The bit and word lines of the other memory cells, on the other hand, are kept at the Standby voltages to maintain their logic states.

As stated above, the Standby mode maintains the logic states of the memory cells of the array between Write and Read operations. To save power, the upper and lower supply voltage difference, i.e., the difference between $V_{DD}$ and $V_{SS}$, is minimized, yet the voltage is just sufficiently large so that a memory cell in Standby is "kept alive" and does not switch logic states. In an embodiment of the present invention, exemplary Standby mode voltages are 0.7 volts for $V_{DD}$, and 0 volts or ground for $V_{SS}$, 0.7 volts for the complementary bit lines 23A and 23B, and 0.7 volts for the word line 24. For a Write or Read operation on a memory cell, the voltage difference is increased, typically by raising the upper supply voltage $V_{DD}$ to 1.4 volts for a Write operation and 1.2 volts for a Read operation. The raised $V_{DD}$ increases the currents through the cross-coupled thyristors of the cell (or, more precisely, through the ON thyristor of the cross-coupled thyristor) for higher switching speeds for Writing or larger currents to drive the bit lines for Reading. The voltage on the word line is increased to turn on the select transistors, 1.4 volts in the case of the bipolar transistors 32A, 32B in FIG. 3A, to connect the cross-coupled thyristors 16A, 16B of the memory cell to the complementary bit lines 23A, 23B. In a Write operation the bit lines 23A and 23B are set at 1.4/1.7 volts, the particular voltages for the bit lines dependant upon what value is to be written into the selected memory cell. In a Read operation, both bit lines 23A and 23B are raised to 1.4 volts, after which the cross-coupled thyristors pull one of the bit lines down creating a voltage difference which can be read by a differential amplifier connected to the two bit lines.

Nonetheless, despite the straightforward requirements for a Write or Read operation, there are some surprising subtleties for optimal operations. For an optimal Read operation for the memory cell with bipolar select transistors, as illustrated in FIG. 3A, it has been found that: 1) the upper supply voltage $V_{DD}$ should be biased at level lower than the raised voltage of the word line for the memory cell(s) selected to be read; and 2) the rising edge of word line voltage should be delayed slightly from the rising edge in the $V_{DD}$ voltage.

The lowered biasing of the cell $V_{DD}$ reduces the voltage drop across the thyristors with the obvious effect of lowering the component of the selected cell's ON thyristor current and thus lowering power consumption. But a less intuitive side effect is that the lower thyristor current reduces the IR drop in the thyristor buried N-well resistance (see the parts of the thyristor in FIGS. 21A and 21B) and thus lowers the voltage of the "low" node in the cell. That in turn increases the $V_{be}$ of the select NPN transistor which increase the Read current (the collector current $I_c$ of the NPN transistor), speeding up the transition. This lead to the unexpectedly result that a lower "total" current speeds things up. A secondary effect is that the thyristor current in the selected cell is much higher than the Read current through the select NPN transistor—greater than 100 µA versus 15-20 µA for the Read current. This high thyristor current pushes it into the high injection range where the thyristor current tends to flatten out as the voltage is increased. Basically the PNP/NPN devices in the thyristor are approaching their maximum values. Then when the word line goes high, the select NPN transistor dumps its Read current into the collector of the NPN device of the ON thyristor. Since this device is already near maximum capacity, it has difficulty sinking the added current from the select NPN transistor. This causes the collector of the ON thyristor NPN (the shallow N-well shown in FIGS. 21A and 21B) to rise in voltage. This is also the emitter of the select NPN transistor so this rise in voltage limits the select NPN transistor $V_{be}$ and thus the Read current. By reducing the current in the ON thyristor, its NPN device is better able to hold the shallow N-well region low against the added current from the select transistor, so the Read current is improved.

To ensure that the selected memory cell is powered up properly for the Read operation, it has been found the word line voltage should not raised simultaneously with the rising upper supply voltage $V_{DD}$ but delayed slightly. It appears that the rising word line voltage tries to couple both of the interior nodes of the cell (the cross-coupled thyristors 16A, 16B) through the base-emitter junction of the select NPN transistor. This seems to be due primarily to the capacitive coupling through the select NPN "$C_{je}$" junction capacitance, but there may be some base current through the base-emitter diode as well if the voltage rises high enough. If the cell is in deep Standby mode when this happens, the problem is that the "low" node of the cross-coupled thyristors is being held "low" by the very low Standby current through the ON thyristor. Specifically, the collector of the NPN in the ON thyristor pulls the shallow N-well (see FIGS. 21A and 21B) of that thyristor (and thus the cell "low" node) down to about 50 mV or less which is deep saturation for the NPN device. A few pico-amps of cell current in Standby flows through this path to hold the "low" node down. When the base of the select NPN transistor, i.e., the word line, rises while the cell is in this deep Standby state, the combined displacement current and the injection current through the select NPN transistor's base-emitter junction overwhelms this very small pull-down current of the ON thyristor's NPN device and that node is pulled sharply upward. If unchecked, this starts to weakly turn on the OFF thyristor and the cell goes into an ambiguous state in which both thyristors power up in a weakly ON state rather than the desirable "one thyristor ON/the other thyristor Off" condition. Thus there is virtually no Read current from the cell. The logic state of the cell may survive, but it won't be read in a reasonable amount of time.

One solution is to increase the Standby voltage of the cell, the $V_{DD}$ level in Standby, to increase the Standby current to a level that would prevent the rising word line from coupling the "low" level of the cell so sharply upward. However, this requires placing the Standby current much above its minimum holding value, a few pico-amps. In contrast, the Standby current would be 100's of pico-amps higher in Standby to ensure that the cell powers up properly.

A better solution is to delay the rising edge of the word line so that it trails the rising edge of the cells' $V_{DD}$ node slightly—in the range of 10-60 ps depending upon how deeply the cell is pushed into Standby prior to this select operation. This allows the cell to move into the <10 pA Standby range with minimal push-out in the Read delay of the cell.

d. SRAM Cell with Cross-Coupled Thyristors and No Select Transistors

Figure 4A:
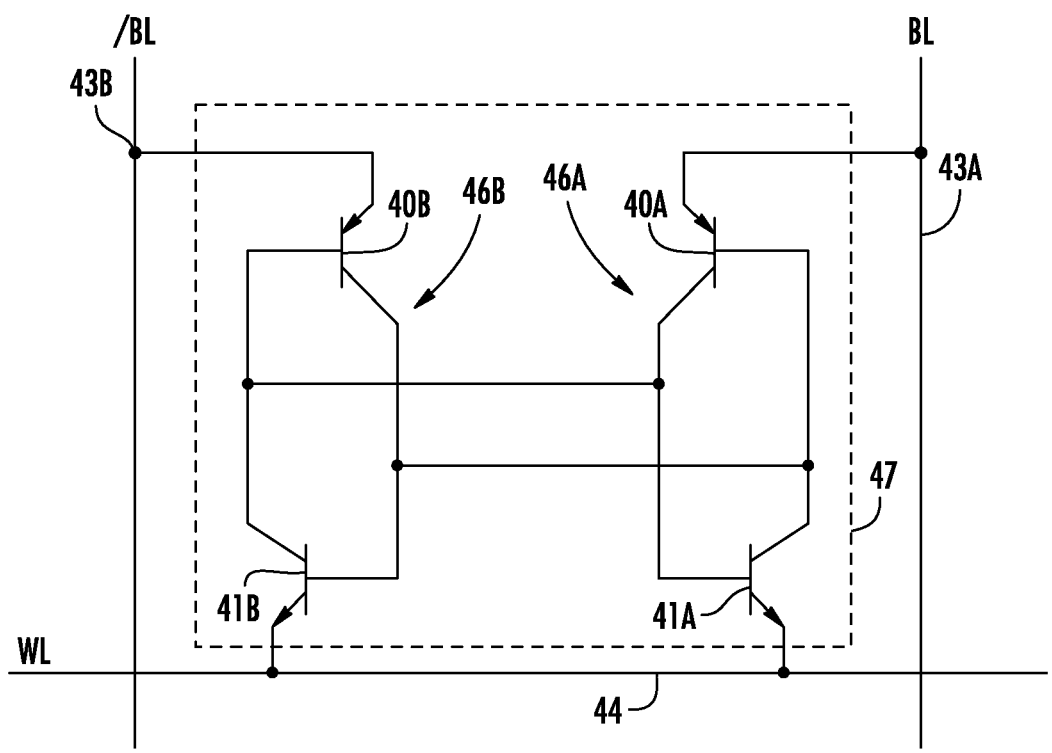
FIG. 4A is a circuit diagram of a cross-coupled memory cell without select transistors.
Figure 4B:
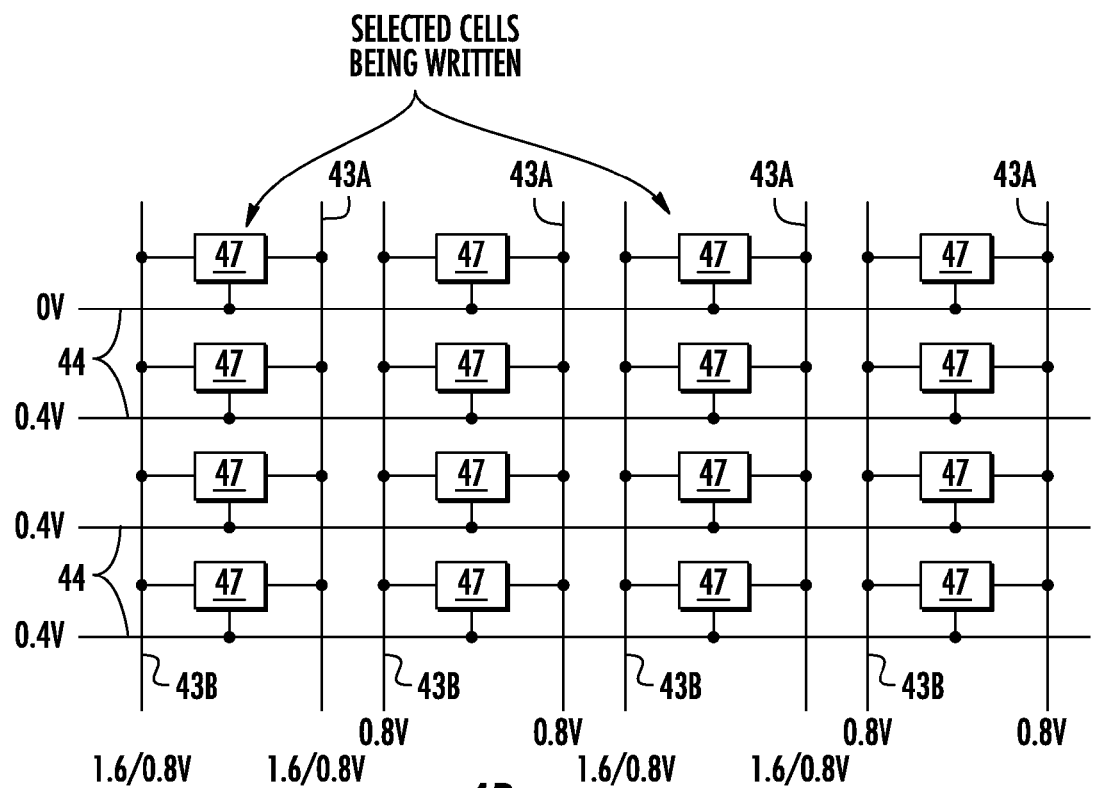
FIG. 4B illustrates a cross point array of FIG. 4A memory cells with voltages on bit and word lines for a Write operation.
Figure 4C:
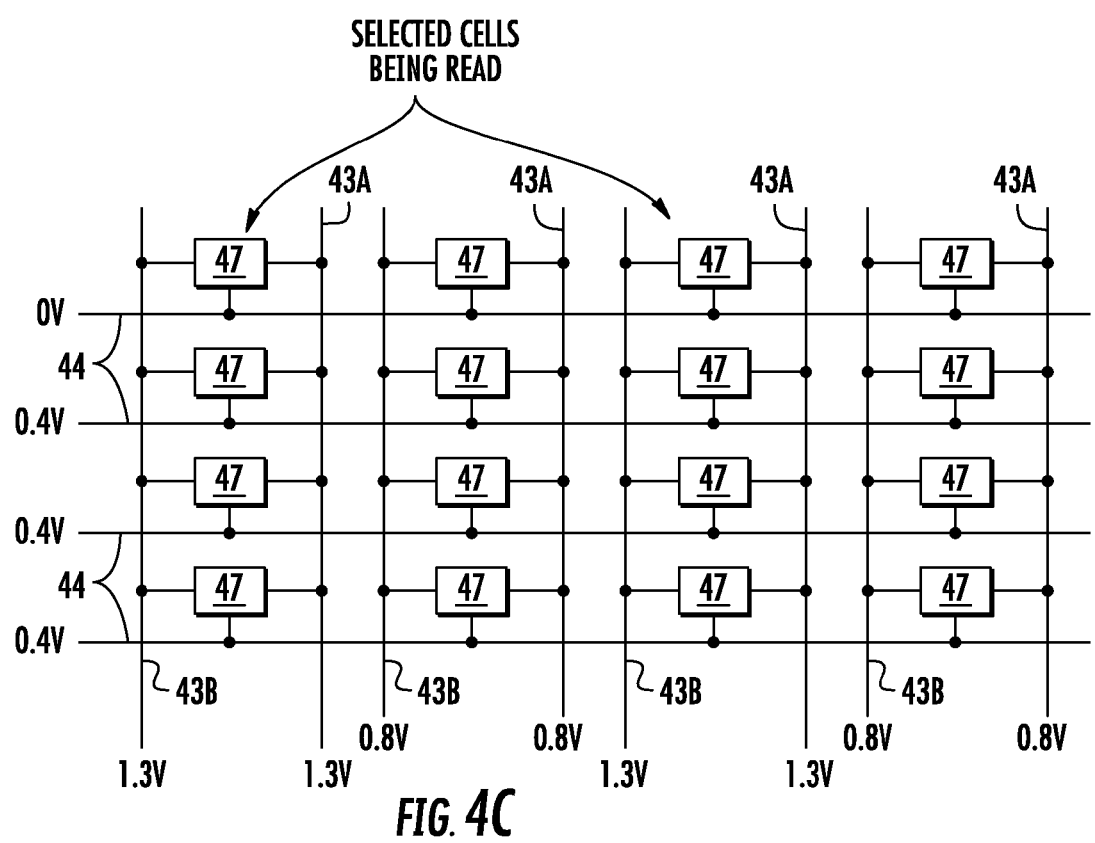
FIG. 4C illustrates the cross point array of FIG. 4A memory cells with voltages on bit and word lines for a Read operation.

In another embodiment of the present invention, the SRAM memory cell has no select transistors to access the memory cell. Rather, cross-coupled thyristors 46A and 46B are connected directly to the word line 44 and the bit lines 43A and 43B, as shown in FIG. 4A to form a cross point memory cell array. In this arrangement, where nominally connected to an upper SRAM supply voltage $V_{DD}$, the anodes, the emitter regions of the PNP transistors 40A and 40B, of the thyristors 35A and 35B are connected respectively to the bit lines 43A and 43B and where nominally connected to the lower SRAM supply voltage $V_{SS}$, the cathodes, the emitter regions of the NPN transistors 41A and 41B, of the thyristors 35A and 35B are connected to the word line 44. Since the word and bit lines provide power to the memory cell, the voltage operations on these lines in an array of such memory cells must be carefully choreographed. These operations are described with reference to an array of SRAM memory cells 47 with no select transistors. The cells are interconnected by bit lines 43A, 43B and word line 44, as shown in FIGS. 4B and 4C.

It should also be noted that voltage and current values are given in this text to better explain the invention and the values should be considered approximate. The voltages and currents can be varied or changed to accommodate the electrical characteristics of the specific devices being used on the integrated circuit. As an example, FIG. 4H shows a thyristor-based SRAM integrated circuit at the block-level. An array of SRAM cells is addressed by signals from a Row Decoder block, conventionally for the word lines of the array, and signals from a Column Decoder, Write & Sense Amplifier block, conventionally for the bit line(s) of the array. These address signals and control signals are carried by an Address Block address, Control and I/O Bus, which passes the signals to a Row Pre-decode block and a Column Pre-decoder & Control block. These blocks process the signals and send their signals to the Row Decoder block and Column Decoder, Write & Sense Amplifier block, as is well known to practitioners in the art. The arrows in FIG. 4H are shown as pointing toward the array because this example operation is an addressing operation where particular memory cells in the array are selected, whether for a Read or Write operation.

To turn a thyristor on, the voltage imposed across the thyristor, i.e., between the anode and the cathode, should be at least the sum of a forward-biased PN junction plus the emitter-collector voltage of a PNP transistor in saturation. Thus the imposed voltage can vary quite a lot, starting from about 0.8V and larger. The larger the imposed voltage, the quicker the thyristor turns fully on. As shown in FIG. 4H, 1.4V is selected as the best compromise for optimum thyristor response at a fairly low voltage. But the blocks surrounding the array operate with CMOS logic circuits and current CMOS logic voltage range is approximately from 0 to 1.0 volts. One way to allow the CMOS logic circuits in the Row Decoder block and the Column Decoder, Write & Sense Amplifier block to interface properly is to raise or shift the CMOS logic voltage range in the Row Decoder block upwards 0.4 volts. That is, while the CMOS logic circuits still operate in a 1.0 volt range, the range extends between 0.4 to 1.4 volts. This is achieved by a voltage Level Shift block between the Row Pre-decoder block and the Row Decoder block. The Level Shift block can use the special voltages from the other blocks, such as the I/O (Input/Output) block.

Another way for the thyristor-based memory cell array to interface properly with the CMOS logic circuits in the Row Decoder block and the Column Decoder, Write & Sense Amplifier block is to bias the array at a desired voltage. In the exemplary voltages of FIG. 4H, the array and the Column Decoder, Write & Sense Amplifier block can be biased by a negative 0.4 volts in the manner described above with respect to the cross-coupled thyristor cell with select transistors and the material related to FIG. 3I. With the proper bias the Level Shift block shown in FIG. 4H is not required, but another level shift block for the column signals to shift the voltage swing in the described 0 to +1.0V range down to the −0.4 to +0.6V range. These alternatives consume different amounts of circuit resources, such as layout area, which must be considered and balanced by the design architect of the SRAM integrated circuit.

Returning to the operations of the cross-coupled thyristor memory cell array itself, in Standby the bit lines 43A and 43B and word line 44 are held at voltages so that the memory cells of the array maintain their stored logic states indefinitely, i.e., each of the memory cells are "kept alive" and none switches states. In a Write operation the complementary bit lines and the word line of the selected memory cell(s) are driven high and low to place the selected cell(s) in the desired logic state(s). The bit and word lines of the unselected memory cells are kept at the Standby voltages to remain unchanged. Difficulties occur for the memory cells which are "half-selected," i.e., memory cells which have either their bit lines or their word lines (but not both) connected to the selected memory cells. The voltages on the selected memory cells for the Write operation must be sufficiently large so as to drive the selected cells into the desired logic states, yet not so large so to change the logic states of the half-selected cells.

In a Read operation the complementary bit lines of the selected memory cell(s) are driven high and the word line of the selected memory cell(s) are driven low for the selected memory cell(s) to allow the state of the cell to tip the voltages of the complementary bit lines for reading of the memory cell state by a differential amplifier. The bit and word lines of the unselected memory cells, on the other hand, are kept at the Standby voltages to remain unchanged. For the half-selected memory cells, the voltages on the selected memory cells for the read operation must be sufficiently large so that the state of a selected memory cell can affect the voltages on the bit lines. But the voltages should not be so high so as to affect the logic states of the other memory cells, the half-selected cells, which have either their bit lines or their word lines (but not both) connected to the selected memory cells.

A Write operation is illustrated by FIG. 4B with an array of memory cells 47, such as connected to the word and bit lines shown in FIG. 4A. In this example, the first and third memory cells in the first row are to be written and the bit lines 43A and 43B for the selected memory cells are respectively driven to 1.6V (or 0.8V) and 0.8V (or 1.6V), depending upon the states to be written. The word line 44 for the selected memory cells is driven low from 0.4V to 0V so that a bias of 1.6V is applied across one thyristor in each selected memory cell while the second thyristor sees a bias of 0.8V. These voltages drive the memory cell into the desired state accordingly. The unselected memory cells see the Standby voltages of 0.8V on their bit lines 43A, 43B and 0.4V on their word line 44. The resulting voltage of 0.4V maintains the unselected memory cells in their present state. The half-selected memory cells, on the other hand, see a voltage of 0.8V for cells connected to the same word line as the selected cells, or a voltage of 1.2V (1.6-0.4V) or 0.4V (0.8-0.4V) for the cells connected to the same bit lines as the selected cells. These voltages are insufficient to "flip" or change the state of a half-selected memory cell.

In a Read operation the bit lines 43A and 43B for the selected memory cell are both driven to 1.3V and the word line 44 for the selected memory cell is driven to 0V. This is illustrated in the example of FIG. 4C. The state of the selected memory cell "tips" the voltages on the bit lines 43A and 43B one way or the other so that the memory cell can be read. The bit lines 43A and 43B for the unselected memory cells are left at 0.8V and the word line 44 for the unselected memory cells 0.4V to maintain these memory cells in their present state. The half-selected memory cells that are connected to the same word line as the selected memory cells see a voltage of 0.8V, while the half-selected memory cells which are connected to the same bit lines as the selected cells, see a voltage of 0.9V. Neither of these voltages is sufficient to "flip" or change the state of a memory cell.

The voltages above should be understood as compromises between operating speeds and power dissipation. The 0.8V voltage, for example, is slightly above the 0.7V silicon junction turn-on voltage and may result in some leakage current through the half-selected memory cells during read or write operations. However, speed is optimized. A higher bias results in higher speeds, but higher leakage (power dissipation) on the selected lines. The particular application for the SRAM helps determine the trade-off between speed and power dissipation. Furthermore, the relative biasing of the word lines and bit lines for the selected memory cells and for the unselected memory cells may be adjusted to minimize leakage or to optimize compatibility with other circuits. For example, during a Read operation the word line for the selected memory cells could be set at 0V and the bit lines at 1.3V, or the word line at 0.3V and the bit lines at 1.6V, while holding the word lines for the unselected memory cells at 0.4V and bit lines at 0.8V. Both of these operating parameters work but they result in different leakage currents through the word and bit lines for the selected memory cell. If multiple cells are read simultaneously, extra current is carried on the word and bit lines for the selected memory cells. The biases for the word and bit lines can be adjusted to minimize the voltage drop or the maximum current through the memory array lines. In conjunction with FIG. 34 et seq. below we describe the structure and manufacture of a cell such as depicted in FIG. 4A.

It should also understood that the description and voltage values above were given for one arrangement of the connections between the word and bit lines and the anodes and cathodes of a cross-coupled thyristor memory cell. The connections illustrated in FIG. 4A can be reversed, i.e., the anodes of the thyristors connected to the word line and the cathodes connected to the complementary bit line pair with the operations and voltages correspondingly changed to reflect the reversed connections.

e. Reduced Power Write Operations for Cross-Coupled Thyristor SRAM Cells

In the Write operation description above the bit line connected to the "OFF" thyristor in the memory cell which is to be written to is held high to guarantee that the thyristor receives the maximum Write voltage during the duration of the Write operation pulse to turn the thyristor "ON". Once the memory cell, i.e., the "OFF" thyristor turns "ON" and its cross-coupled counterpart turns "OFF", the newly "ON" thyristor conducts the maximum "ON" current while the thyristor's bit line is held high. This increases the power consumption during the Write operation. More importantly, the word line must carry away the current from all the cells on the row so that this current can be very large. This can cause a significant voltage drop along the word line due to the electrical resistance of the line and may result in instability in the memory array.

This situation can be ameliorated by pre-charging the bit line to the "OFF" thyristor high prior to the Write pulse in a fashion similar to a Read operation described above as illustrated in FIG. 4D. FIG. 4E is a representation of the voltages at various locations of the FIG. 4D memory cell. After the pre-charge, the pre-charge is turned off to allow the bit line to "float" until the memory cell flips state. At that point the current through the newly "ON" thyristor pulls the bit line low (similar to a Read operation). As the bit line voltage falls, the voltage drop across the thyristor decreases and the current falls toward the minimum holding current. This has three benefits. First, the peak current is reduced because the bit line voltage starts to drop before the internal voltages in the memory cell turn the thyristor fully "ON". Secondly, the now narrow current pulse (shown by the shape of $I_{ThyL}$ in Figure E) reduces the power dissipated in the Write operation. Thirdly, since from a statistical standpoint the various cells in the row being written flip at different times, the peak current in the word line is reduced and spread over a larger time interval, further minimizing the undesirable voltage drop along the word line.

Figure 4D:
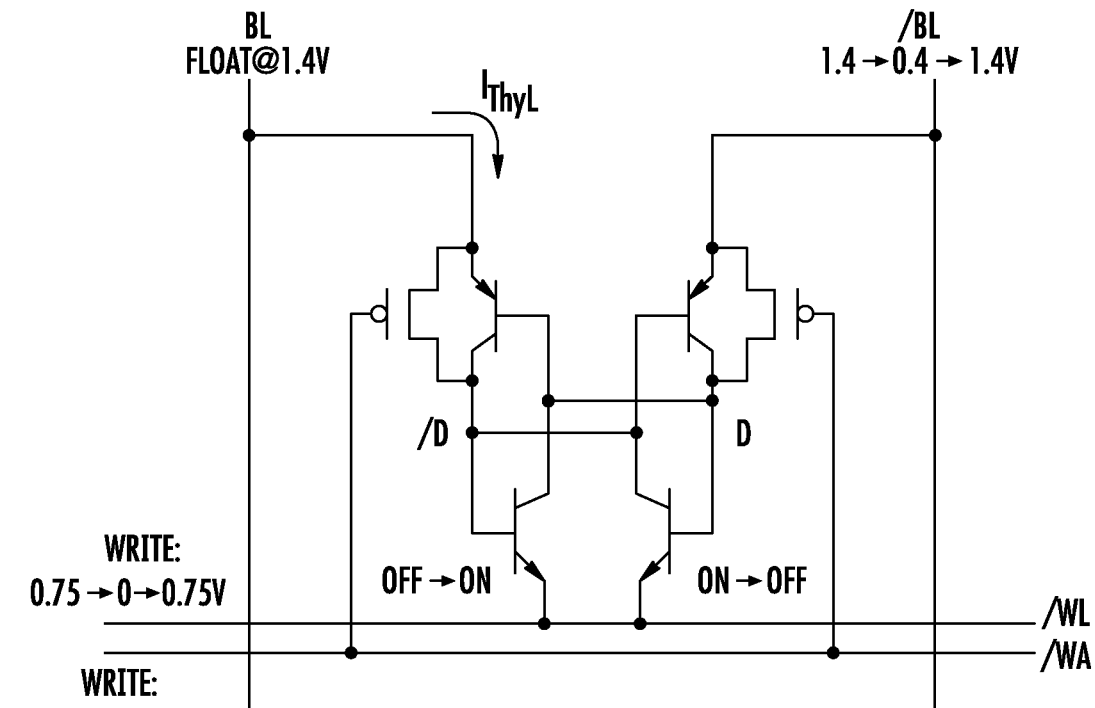
FIG. 4D shows a low-power Write operation for a cross-coupled thyristor memory cell array connected to complementary bit lines and word lines in one configuration.
Figure 4E:
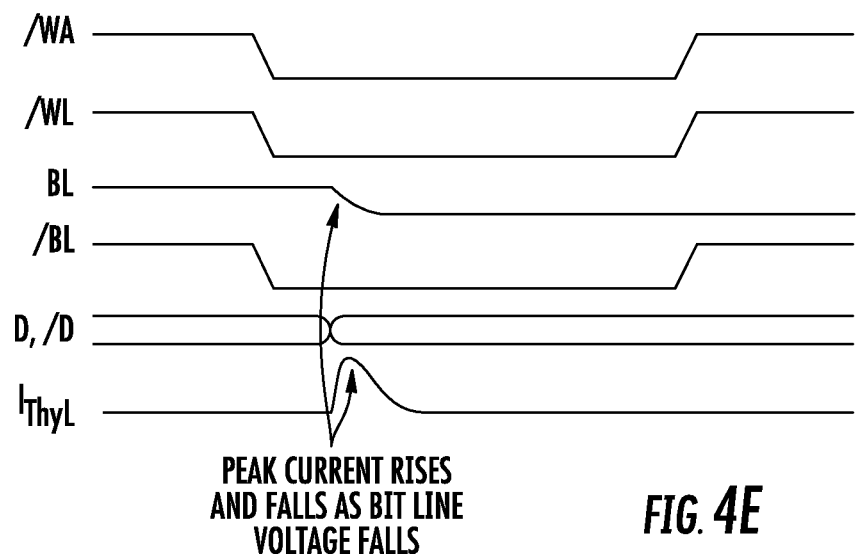
FIG. 4E is a representative timing diagram at various points of the memory cell in FIG. 4D.
Figure 4F:
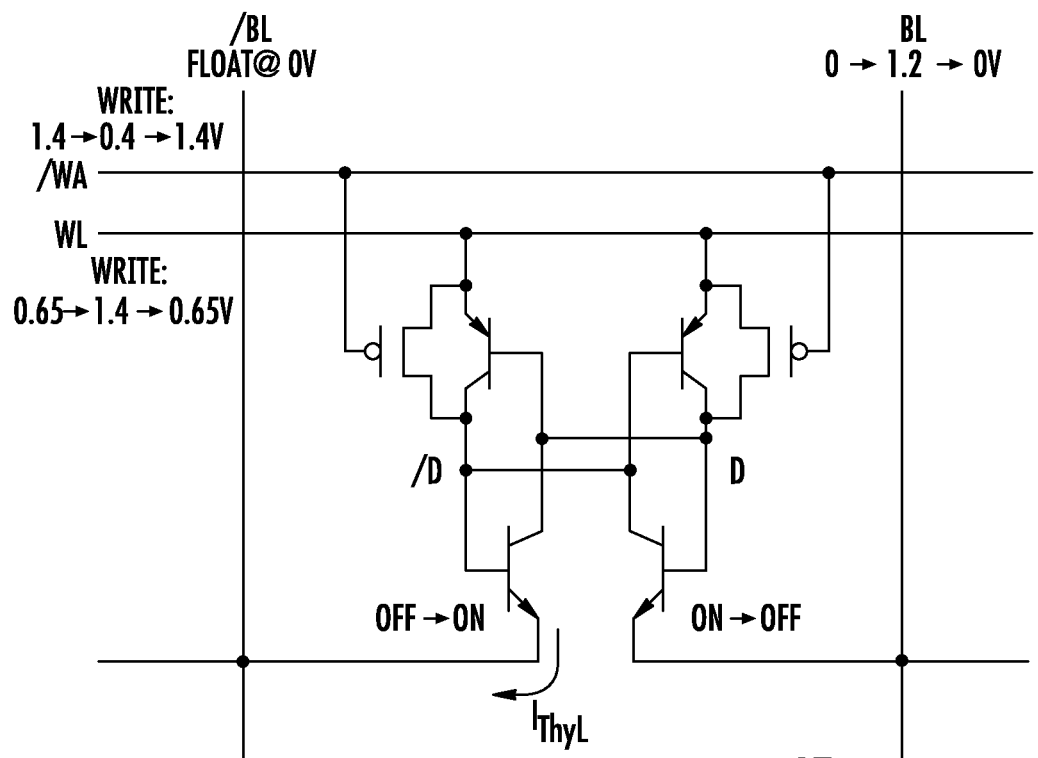
FIG. 4F shows a low-power Write operation for a cross-coupled thyristor memory cell array connected to complementary bit lines and word lines in a reverse configuration to that of FIG. 4D.
Figure 4G:
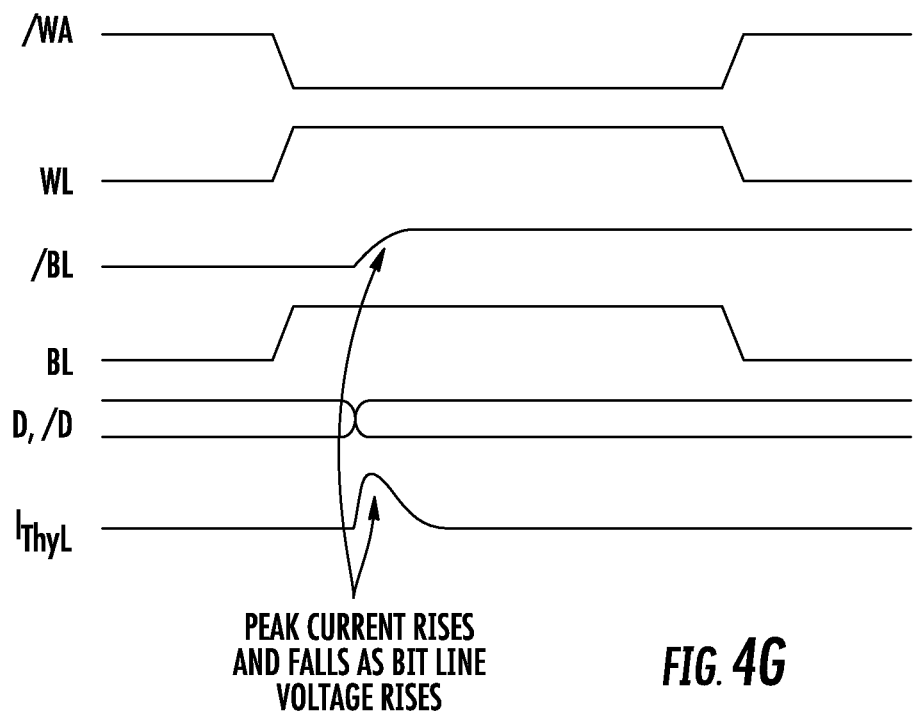
FIG. 4G is a representative timing diagram at various points of the memory cell in FIG. 4F.
Figure 4H:
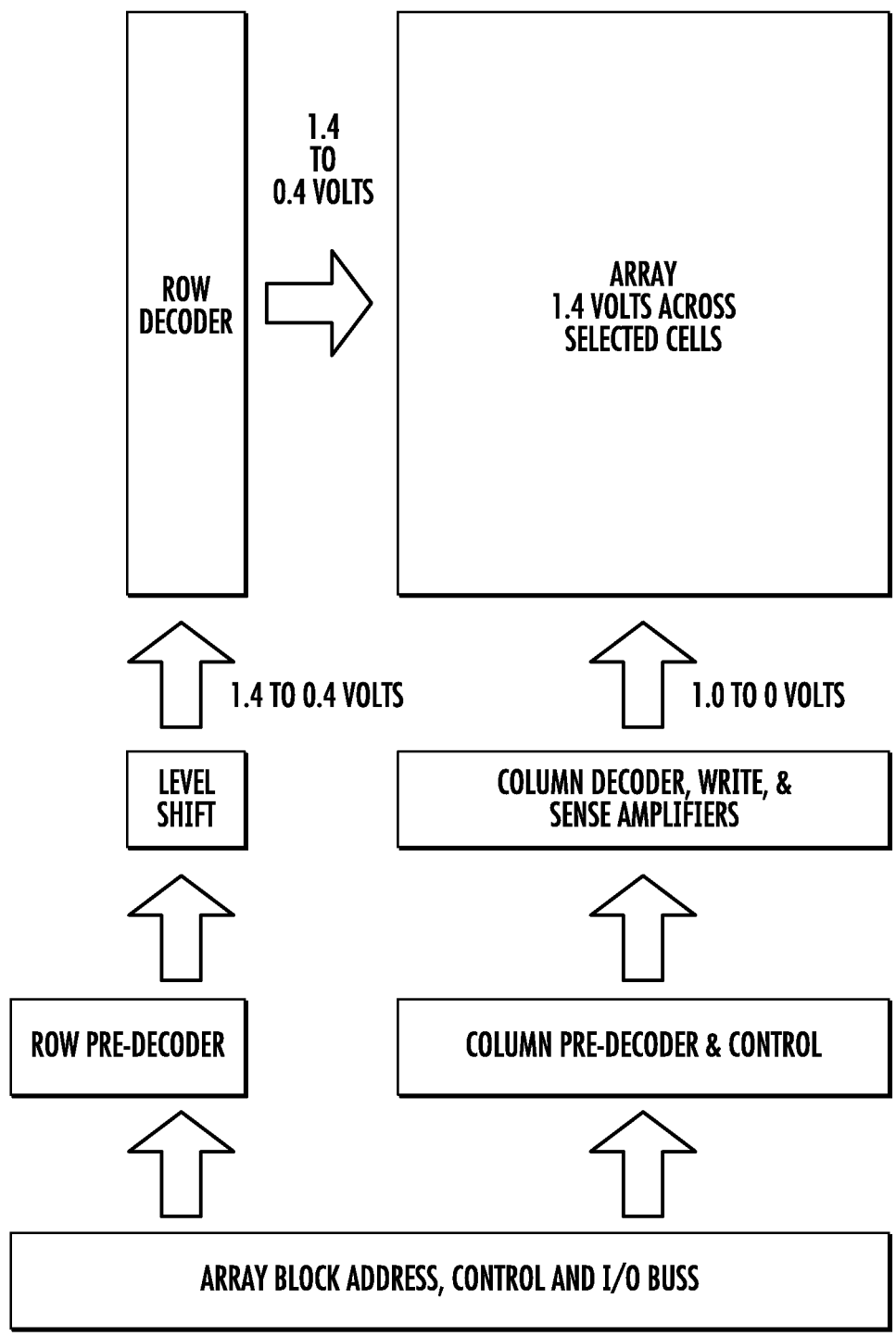
FIG. 4H is a representative diagram of circuit blocks supporting an SRAM memory array for one embodiment of the invention.

FIG. 4F illustrates the low power Write operation for a cross-coupled thyristor cell in which the connections to the word and bit lines are reversed compared to that of FIG. 4D. That is, the FIG. 4F memory cell has its anodes connected to the word line and its cathodes to respective bit lines. FIG. 4G is a representation of the voltages at various locations of the FIG. 4F memory cell. In this example, the bit line to the "OFF" thyristor is pre-charged low prior to the Write pulse (similar to a Read operation). Then the pre-charge path is turned off to allow the bit line to "float" until the memory cell flips state. At that point current through the newly "ON"

thyristor pulls the bit line high (similar to a Read operation). As the bit line rises, the voltage drop across the thyristor decreases and the current drops toward the minimum holding current. The same benefits as described in the previous paragraph are achieved. First, the peak current is reduced because the bit line voltage starts to rise before the internal voltages in the memory cell turn the thyristor fully "ON". Secondly, the now narrow current pulse (shown by the shape of $I_{ThyL}$ in Figure G) reduces the power dissipated in the Write operation. Thirdly, since from a statistical standpoint the various cells in the row being written flip at different times, the peak current in the word line is reduced and spread over a larger time interval, further minimizing the undesirable voltage drop along the word line.

f. Reduced Power Standby Operation for Cross-Coupled Thyristor SRAM Cells

Figure 5A:
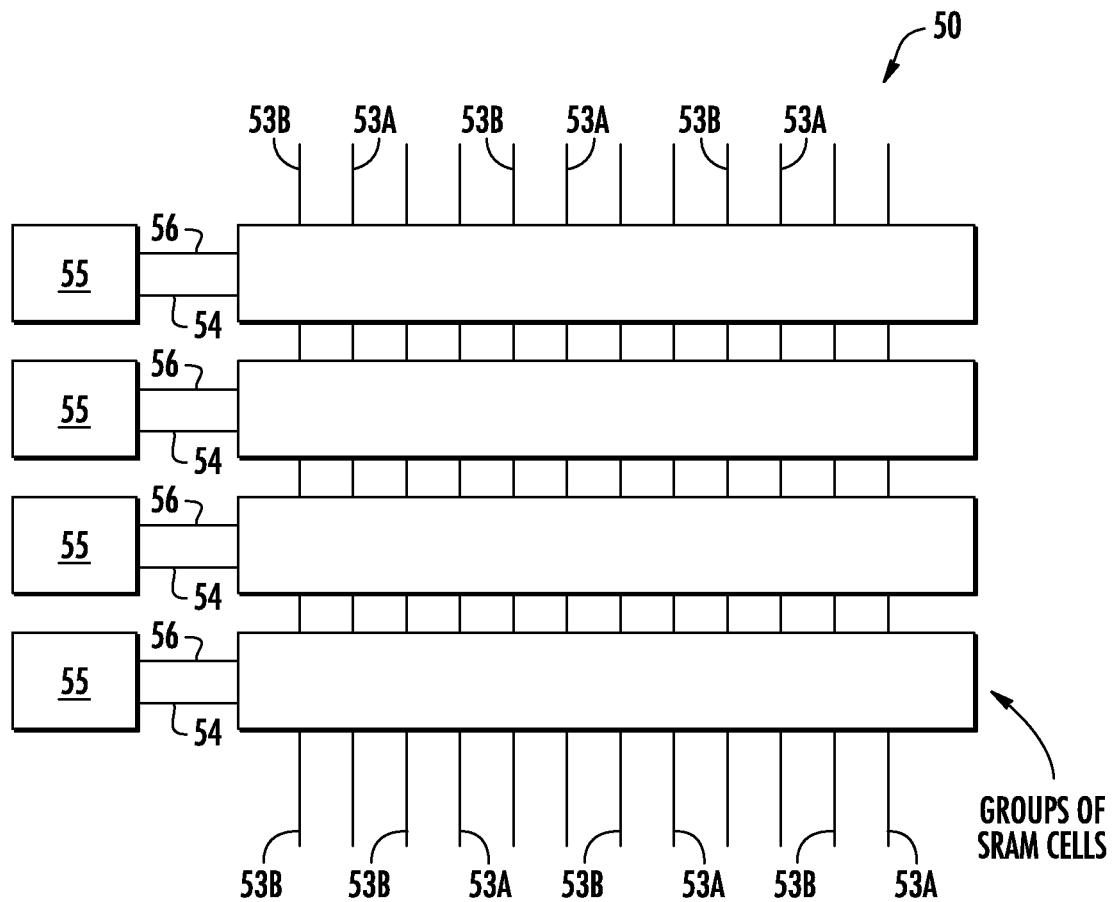
FIG. 5A is a block diagram of an array of SRAM cells with current sources to maintain the memory cells in Standby mode by row.

Rather than using fixed voltages (between 0.3 to 0.8V) to maintain the memory cells (see FIG. 4A) of the array in their various states between Read and/or Write operations, an alternative approach regulates the voltage with a current source to maintain the memory cell states in Standby mode. The current source provides enough current for all of the connected memory cells and sufficient current so that the weakest memory cell does not "flip." The memory cell array is divided into partial arrays. Since typically multiple cells are read along a single word line, the array is divided along the word line direction as illustrated in FIG. 5A. In the memory array 50 pairs of bit lines 53A and 53B intersect word lines 54 at SRAM memory cells as previously described. Parallel to the word lines 54 are upper power supply lines 56 which are connected to the SRAM memory cells; pairs of word lines 54 and power supply lines 56 are connected to a current source circuit 55. Current control is placed along the word line so that selection is made along the word line or world lines being read.

Figure 5B:
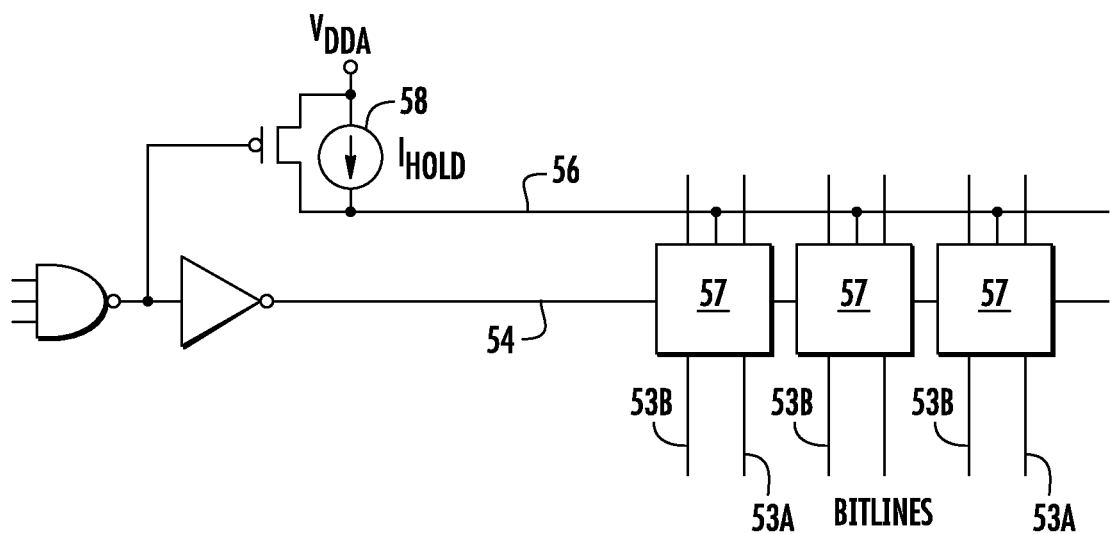
FIG. 5B is a circuit diagram of the current sources in FIG. 5A.

FIG. 5B shows the current source circuit 55 in greater detail. When address signals to a decoder represented by a NAND gate turn on the word line 54, the same output signal from the NAND gate turns on the PMOS transistor that short-circuits the current source 58. The power supply line 56 is pulled up to $V_{DDA}$ for the connected memory cells 57 to be read. Otherwise, when the word line 54 is off and the row of memory cells is not selected, the PMOS transistor is off and the current source 57 at voltage $V_{DDA}$ supplies the necessary current to maintain the memory cells 57 in their respective logic states. Given current technologies, the required current from the current source 57 for a single row of memory cells in standby mode is in the range of 1-10 pA per bit.

Figure 5C:
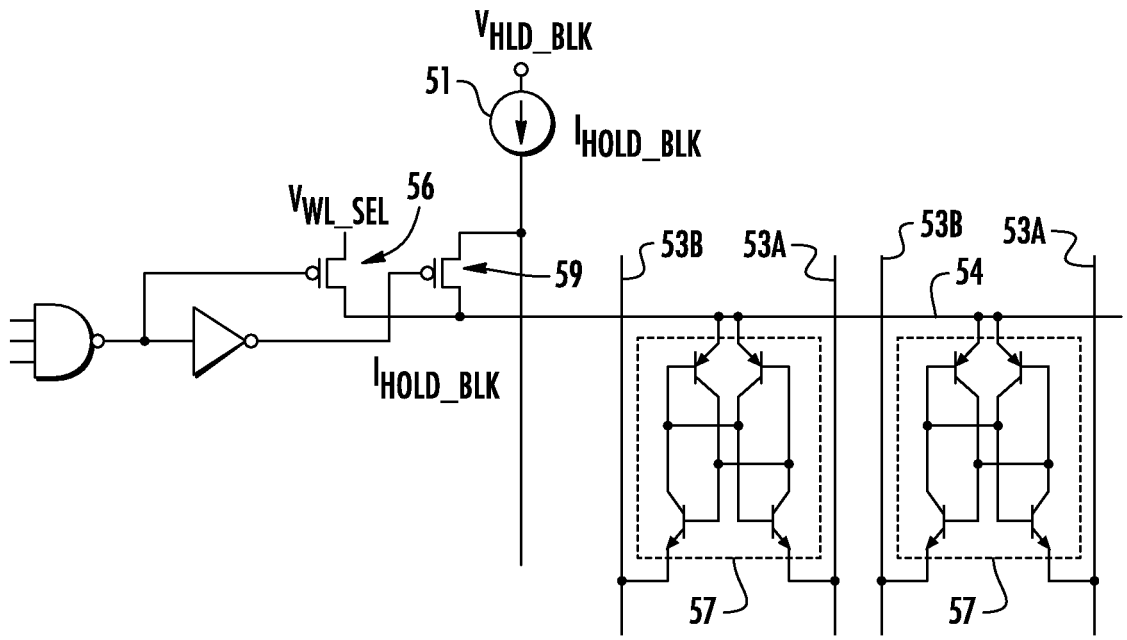
FIG. 5C is a circuit diagram of Standby current sources for SRAM cells with cross-coupled thyristors in a cross point configuration in which the cathodes of the thyristors are connected to the complementary bit lines and the anodes are connected to the word line.

FIG. 5C shows a standby current source arrangement for memory cells 57 with cross-coupled thyristors in a cross point array. In this embodiment the cathodes of the thyristors are connected to complementary bit line pairs 53A, 53B and the anodes of the thyristors are connected to the word line 54. The current source 51 is connected to the word line 54 by a PMOS transistor 59. In Standby mode, the PMOS transistor 59 is on and the current source 51 supplies a maintenance current to the memory cells 57 through the word line 54 and out through the bit lines 53A, 53B. When the address signals to a decoder represented by the NAND gate turn on the PMOS transistor 56 and turn off the PMOS transistor 59, the current source 51 is disconnected from the word line 54 and the word line 54 is raised to a word line selection voltage, represented by $V_{WL\_SEL}$, for a Read or Write operation.

Figure 5D:
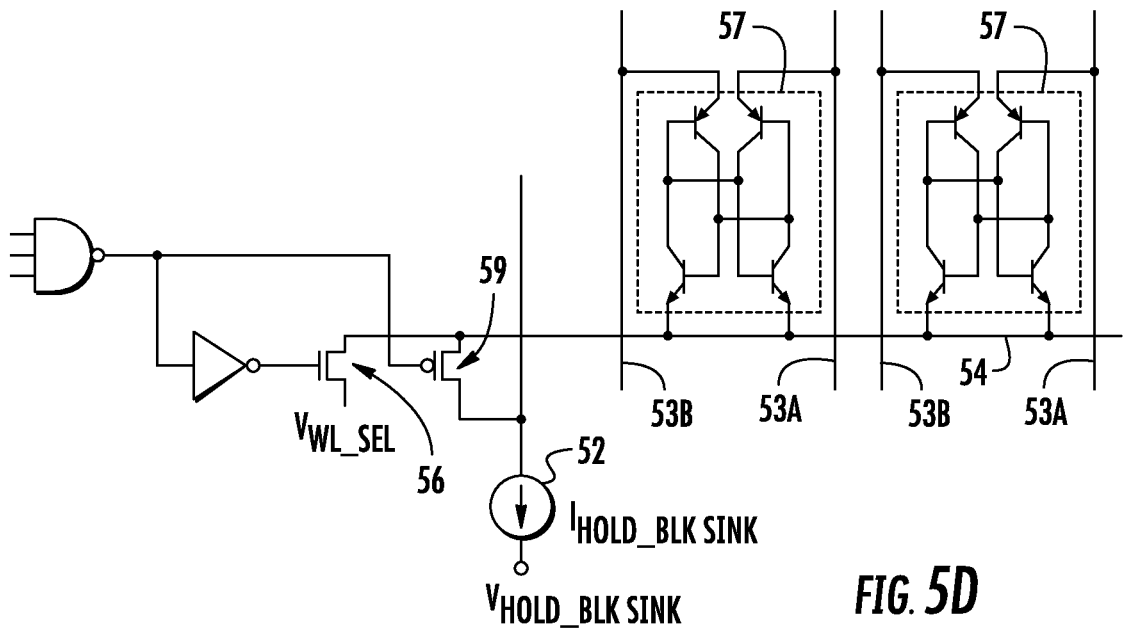
FIG. 5D is a circuit diagram in which the connection of the cross-coupled thyristors to the bit and word lines are reversed.

FIG. 5D shows another standby current source arrangement for & memory cells 57 with cross-coupled thyristors in a cross point array, similar to that of FIG. 5C. In this embodiment, however, the anodes of the thyristors are connected to the complementary bit line pair 53A, 53B, and the cathodes of the thyristors are connected to the word line 54. The current source, now a current sink 52, is connected to the word line 54. In Standby mode, the PMOS transistor 59 is on and the current sink 57 pulls a maintenance current through the memory cells 57 from the bit lines 53A, 53B through the cells 57 and out to the word line 54. When the address signals to a decoder represented by the NAND gate turn on the PMOS transistor 56 and turn off the PMOS transistor 59, the current sink 52 is disconnected from the word line 54 and the word line 54 is raised to the word line selection voltage for a Read or Write operation.

Figure 6:
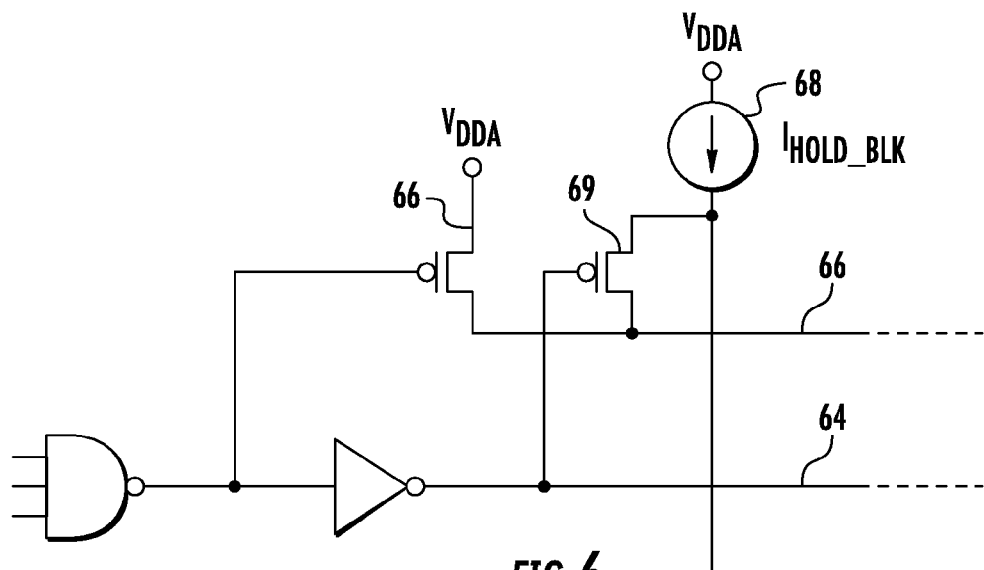
FIG. 6 is a circuit diagram of the current source for a block of SRAM cells to maintain the memory cells in Standby mode.

It should be noted that the arrangements shown in FIGS. 5C and 5D provide for a current source/sink for more than one word line in the cross point array. Rather, the current source/sink works for a block with many word lines. In a similar fashion, FIG. 6 shows a current source circuit for blocks of memory cells which have fixed voltage supplies. See FIG. 5B. In FIG. 6, the current source 68 supplies the current for the plurality of rows of memory cells in the block. When a particular row, i.e., word line 64, is selected, a second MOS transistor 69 turns off to decouple the current source 68 from the power supply line 66, while a first MOS transistor 66 turns on to pull the power supply line 66 to voltage $V_{DDA}$. When the particular word line is not selected, the first MOS transistor 66 is off and the second MOS transistor 69 connects the power supply line 66 to the current supply 68 at voltage $V_{DDA}$. The current supply 68 supplies the current to a block of several rows of unselected memory cells; the total current is about 1 μA at current technology levels. Such a current supply is relative easy to design compared to a current supply in the range of 1 nA.

g. Cross-Coupled Thyristor SRAM Cell with Write Assist Circuitry

Figure 7A:
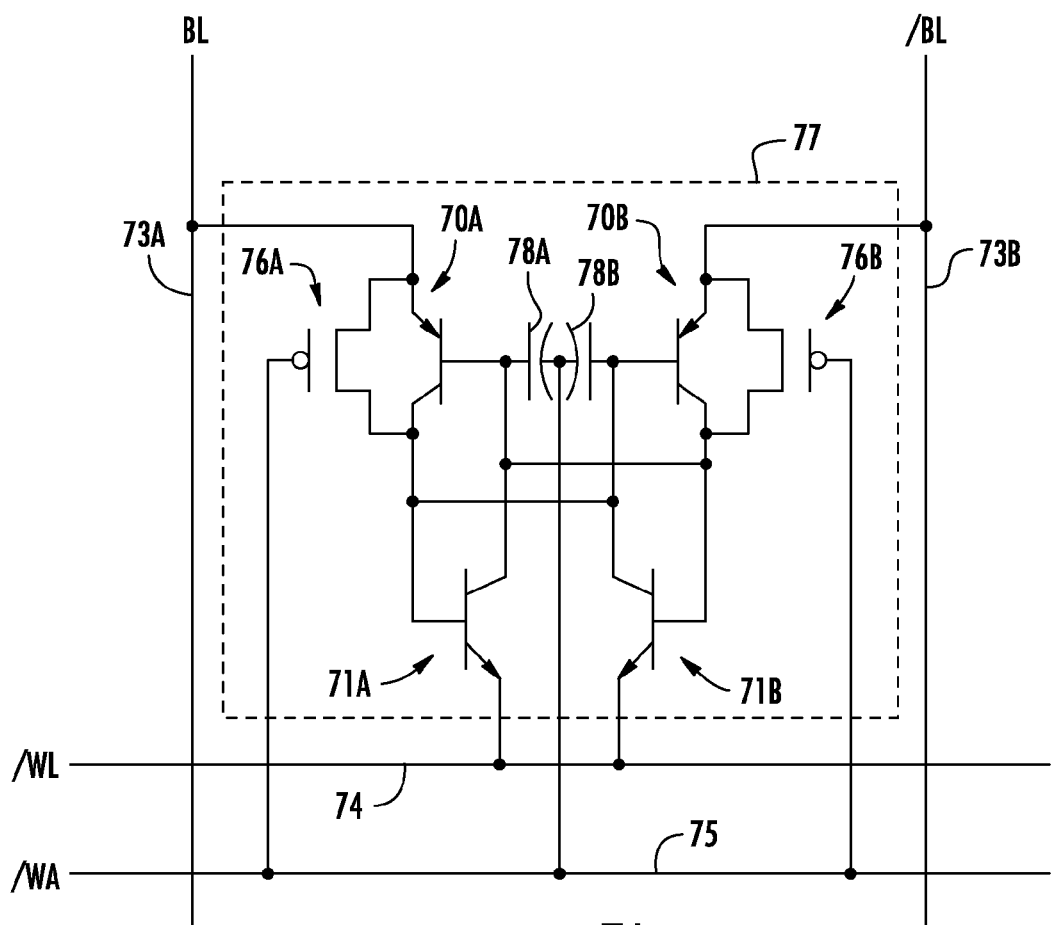
FIG. 7A is a circuit diagram of a cross-coupled thyristor SRAM memory cell with write-assist transistors and capacitors.

To speed the operations of the thyristor-based memory cell, Write assist circuitry can be added to the memory cell. In the example of FIG. 7A, the anodes of the cross-coupled thyristors of the memory cell 77 are respectively connected to a complementary bit line pair, 73A and 73B, and the cathodes of the thyristors are connected a word line 74. Two PMOS transistors 76A and 76B are respectively connected to the emitter and collector regions of the PNP transistors 70A and 70B. That is, a source/drain region of the PMOS transistor 76A (76B) is connected to, or part of, the emitter region of the PNP transistor 70A (70B), i.e., the anodes of the cross-coupled thyristors, and the second source/drain region of the PMOS transistor 76A (76B) is connected to, or part of, the collector region of the PNP transistor 70A (70B). The gates of the PMOS transistors 76A and 76B are connected to a Write assist line 75. Additionally, the two capacitors 78A and 78B each have a terminal connected to the Write assist line 75; the other terminal of each capacitor 878A and 78B are respectively connected to the base regions of the PNP transistor 70A and 70B/collector regions of the NPN transistor 71A and 71B.

When the signal on the Write assist line 75 is low, the PMOS transistor 76A short-circuits the P-type emitter and collector regions of the transistor 70A. Likewise the PMOS transistor 76B short-circuits the P-type emitter and collector regions of the transistor 70B. The N-type carriers are driven from the base regions of the transistors 70A and 70B into the capacitors 78A and 78B respectively. The Write assist transistors 76A and 76B provide a conduction path from the anode of the individual thyristor to its P-well region (the collector region of the PNP transistor 70A, 70B and the base region of the NPN transistor 71A, 71B). If the thyristor is "OFF", then its shallow N-well, the base region of the PNP transistor 70A, 70B/collector region of NPN transistor 71A, 71B, is at a higher voltage—somewhere near but not necessarily equal to the voltage on the anode. It is high enough that the magnitude of $V_{be}$, the base-emitter voltage, is not sufficient to cause the PNP transistor 70A, 70B to conduct more than background leakage current. Similarly the P-well region, the collector region of the PNP transistor 70A, 70B and the base region of the NPN transistor 71A, 71B, is at a lower voltage—somewhere near but not necessarily equal to the voltage on the cathode. It is low enough that the magnitude of $V_{be}$ is not sufficient to cause the NPN transistor 71A, 71B to conduct more than background leakage current. In order to cause a thyristor to turn "ON," either the voltage of the shallow N-well must be lowered to turn on the PNP transistor 70A, 70B, or the voltage of the P-well must be raised to turn on the NPN transistor 71A, 71B. One approach is to increase the voltage between the anode and the cathode to larger values. This increases the background leakage currents through the PNP and NPN transistors which eventually causes one of the thyristor component transistors to turn "ON" and then the feedback loop in the thyristor snaps the device into the fully "ON" state. However, this approach requires either a large anode-cathode voltage (higher than may be provided with the CMOS circuits) or long write times at the applied voltage (longer than desired for SRAM operation).

Thus the PMOS transistors 76A, 76B are added to assist the Write operation to the "ON" state. When a normal operating voltage from the anode to the cathode (approx. 1.2-1.4V) is applied and the voltage on the gate of the MOS transistor low enough to turn on the PMOS transistor, a conduction path is provided between the anode voltage and the P-well, the collector region of the PNP transistor 70A, 70B/base region of the NPN transistor 71A, 71B. This conduction path pulls the voltage on the P-well upward towards the anode and when it reaches the normal PN-diode turn-on voltage, the NPN base-emitter junction (P-well to cathode) starts to conduct, turning on the NPN transistor 71A, 71B and then the feedback of the thyristor kicks it into the fully "ON" state.

If the thyristor is in the "ON" state, voltage of the shallow N-well, the base region of the PNP transistor 70A, 70B/collector region of NPN transistor 71A, 71B, is relatively low (sufficient to place the PNP transistor 70A, 70B in the "ON" state) and the P-well, the collector region of the PNP transistor 70A, 70B/the base region of the NPN transistor 71A, 71B, is relatively high (sufficient to place the NPN transistor 71A, 71B in the "ON" state.)

To switch the thyristor into the "OFF" state, the direct current flow through the thyristor must first be stopped by reducing the voltage between the anode and the cathode to sufficiently low voltage to eliminate the "turn-on" forward biasing of the base-emitter junctions of both the PNP (sNW to anode) transistors 70A, 70B and the NPN (PW to cathode) 71A, 71B transistors. However, this is not sufficient. Even though current flow through the thyristor is stopped by the reduced voltage between the anode and the cathode, there is a large amount of charge (minority carriers) stored in the N base region of the PNP transistor 70A, 70B and P base region of the PNP transistor 70A, 70B which internally holds them very near but slightly less than the $V_{be}$ turn-on point of the PNP and NPN devices. If the anode-cathode voltage are increased again, these junctions quickly forward bias again and the thyristor turns back "ON". Thus without some "assistance," a thyristor must be held in this "OFF" state for a sufficiently long time for all the stored charge to dissipate through background leakage and recombination.

The Write assist PMOS transistor 76A, 76B help in removing charge from the thyristor P-well, the collector region of the PNP transistor 70A, 70B/the base region of the NPN transistor 71A, 71B. In the "Write-to-OFF" operation, the voltage on the cathode is driven up to near or perhaps even above the voltage on the anode. With the charge stored in the P-well, this pushes via capacitive coupling the voltage in the P-well to above the voltage on the anode. Thus when the gate of the Write assist PMOS transistor 76A, 76B is pulled low and the transistor is turned on, the charge stored in the P-well gets drained out through the PMOS transistor 76A, 76B to the anode which brings the voltage drop between the P-well and the anode to well below the NPN base-emitter turn-on voltage, $V_{be}$. There is still the charge stored in the shallow N-well, the base region of the PNP transistor 70A, 70B/collector region of NPN transistor 37A, 37B, to contend with. But the P-well being discharged through the PMOS transistor 76A, 76B, the overall redistribution of voltage in the PNPN thyristor stack helps shorten the time needed for the shallow N-well to reach a voltage that keeps the thyristor "OFF".

The memory cell 77 of FIG. 7A has two cross-coupled thyristors with shallow N-well of one thyristor connected to the P-well of the other. In this configuration one of the thyristors is always "ON" and the other thyristor is always "OFF". The "lower" shallow N-well in the "ON" thyristor re-enforces the "lower" voltage of the P-well in the "OFF" thyristor and vise-versa. The Write operation to the memory cell actually involves doing two simultaneous thyristor writes—turning "ON" the "OFF" thyristor by putting the full access voltage across it, and at the same time turning "OFF" the "ON" thyristor by putting near 0V across it. In this example of a cross-coupled thyristor memory cell, the word line 74 is connected to the two cathodes and the BL/BL_N lines 73A, 73B to the respective anodes. The bit line 73A, 73B connected to "ON" thyristor anode is low and the bit line 73B, 73A connected to the "OFF" thyristor anode is high. This puts that maximum available turn-on voltage across the "OFF" thyristor and a low enough voltage drop (~0.2-0.3V) across the "ON" thyristor to turn off its current flow. At the same time the voltage on the gates of the 2 PMOS Write assist transistor 76A and 76B is pulled low so that they can operate as described above. But with the addition of the cross-coupling of the two thyristors there are additional paths for the charge stored in the "OFF" thyristor to be removed—namely through the cross connections to the thyristor that is being turned on. The "OFF" thyristor is switched on almost the exact manner described above. The turn-on of the PMOS Write assist transistor 76A, 76B provides a path for the "low" P-well to be pulled up toward the anode voltage, turning on the NPN transistor 71A, 71B. This actually takes a little longer because this PMOS transistor now has to pull-up not only P-well in the "OFF" thyristor, but also the "low" shallow N-well in the "ON" thyristor through the cross connecting wire. But in doing this the charge stored in this shallow N-well is removed. Thus a small push-out in the time to turn on the "OFF" NPN transistor 71A, 71B is exchanged for a large improvement in the time to eliminate the stored charge in the base of the PNP transistor 70B, 70A of the "ON" thyristor. As the "OFF" NPN transistor 71A, 71B turns on, its collector current pulls down the base (shallow N-well) of the "OFF" PNP transistor 70A, 70B turning it on and then its collector current supplies the base of the NPN transistor 71A, 71B, re-enforcing the "ON" state (i.e.—the thyristor feedback loop). At the same time, the collector current of the newly turned on NPN transistor 71A, 71B also pulls down the "high" P-well of the "ON" thyristor, removing its stored charge and re-enforcing the effort to fully turn that thyristor "OFF". So the cross-coupling of two thyristors solves the write-speed problem in the isolated single thyristor described above.

Capacitors, such as shown in FIG. 7A, can also be used in Write assist operations. As illustrated by the capacitors 78A and 78B, capacitance is added between the Write assist line 75 and the shallow N-well region, the base of the PNP transistor 70A, 70B/collector of the NPN transistor 71A, 71B, of a thyristor. It is theoretically possible to utilize these capacitors by capacitively coupling a voltage shift into the shallow N-well from either the rising or falling transitions of the Write assist line 75. A falling transition of the Write assist line 75 pushes the shallow N-well downward to a lower voltage by some percentage of the change in voltage on the Write assist line 75. This percentage is determined by the ratio of the Write assist gate capacitance to the total capacitance seen by the shallow N-well. If the thyristor is in the "OFF" state, this downward coupling of the voltage on the shallow N-well increases the magnitude of the $V_{be}$ of the PNP transistor 70A, 70B which can possibly help turn transistor on, resulting in the thyristor switching from the "OFF" to the "ON" state.

Conversely, if the thyristor is in the "ON" state, a rising transition on the Write assist line 75 couple a voltage upward into the shallow N-well by some percentage (as described above). In a Write operation where the voltage between the anode and the cathode of the "ON" thyristor has been reduced to near 0V or even to a negative voltage, and the current flow through the "ON" thyristor has ceased, the thyristor is not truly "OFF" because of the charge still stored in the shallow N-well region (base of the PNP transistor 70A, 70B) and the P-well region (base of the NPN transistor 71A, 71B). The effect of the upward coupling of the shallow N-well voltage after the DC current flow has been cut off helps remove some of the charge stored in the shallow N-well, thus helping truly turn "OFF" the thyristor.

Figure 7B:
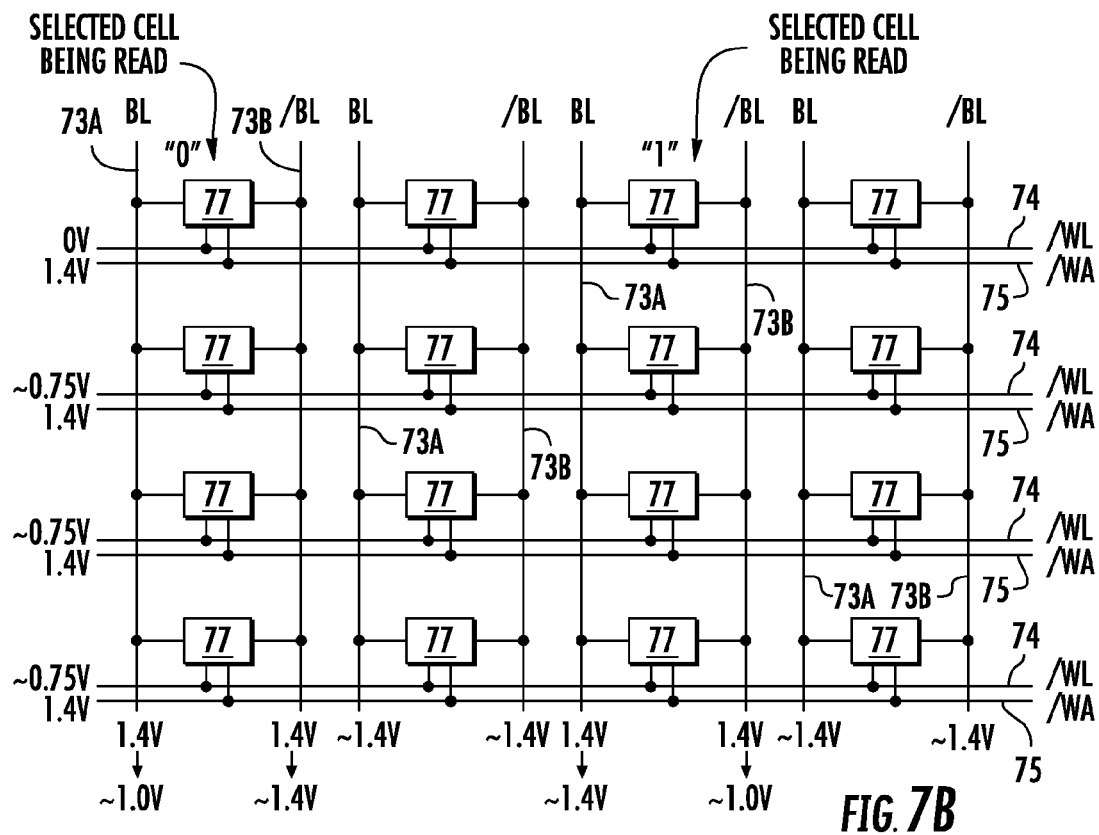
FIG. 7B illustrates a cross point array of FIG. 7A memory cells with voltages on bit lines and word lines for a Read operation.
Figure 7C:
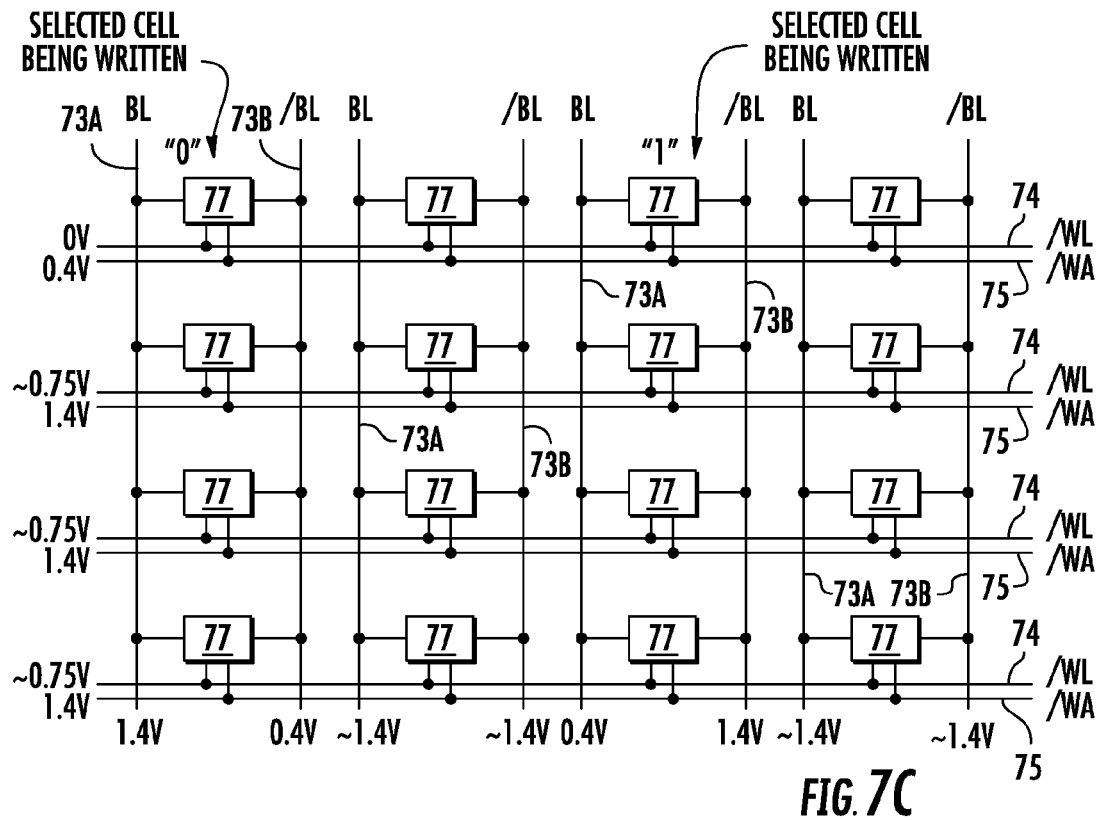
FIG. 7C illustrates a cross point array of FIG. 7A memory cells with voltages on bit lines and word lines for a Write operation.
Figure 7D:
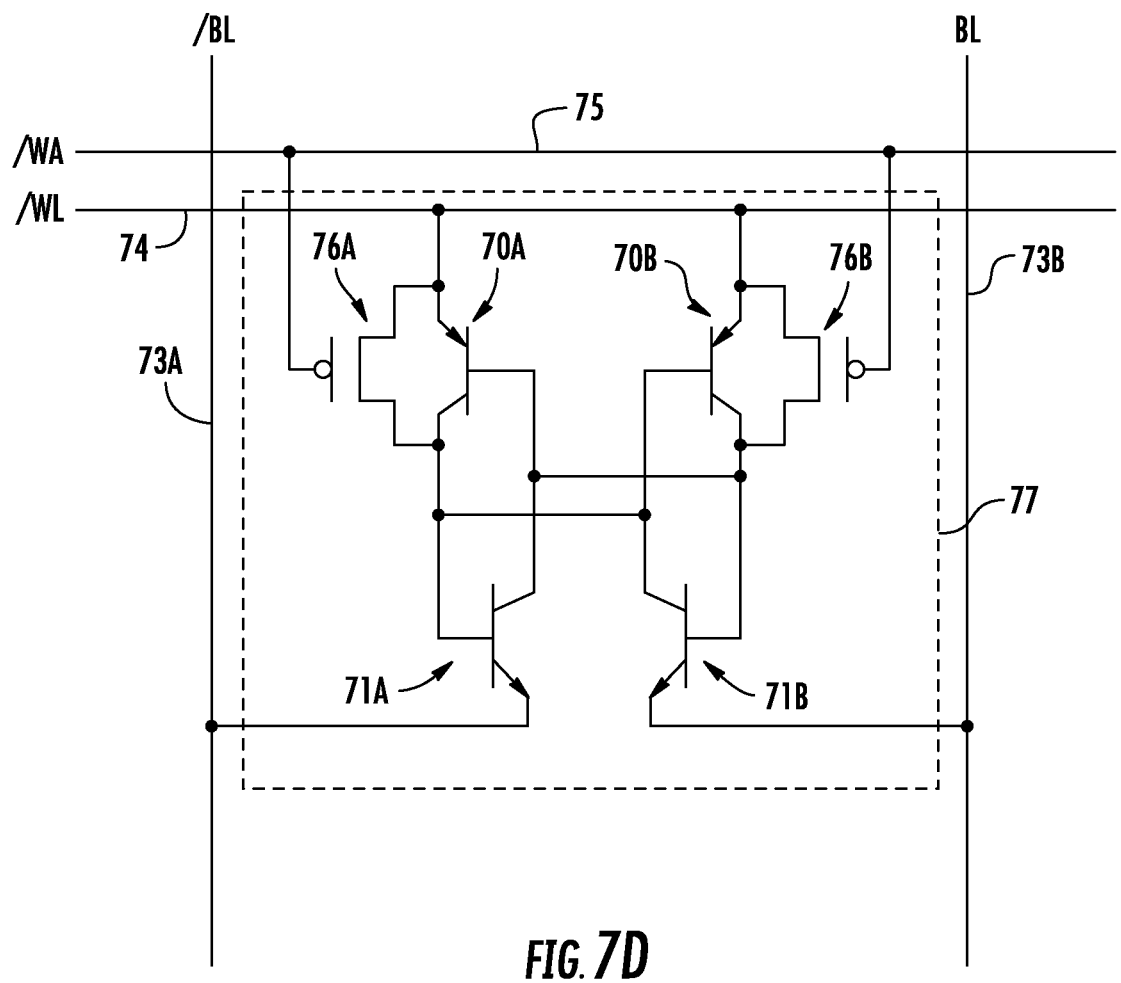
FIG. 7D is a circuit diagram of a cross-coupled thyristor SRAM memory cell with PMOS write-assist transistors.
Figure 7E:
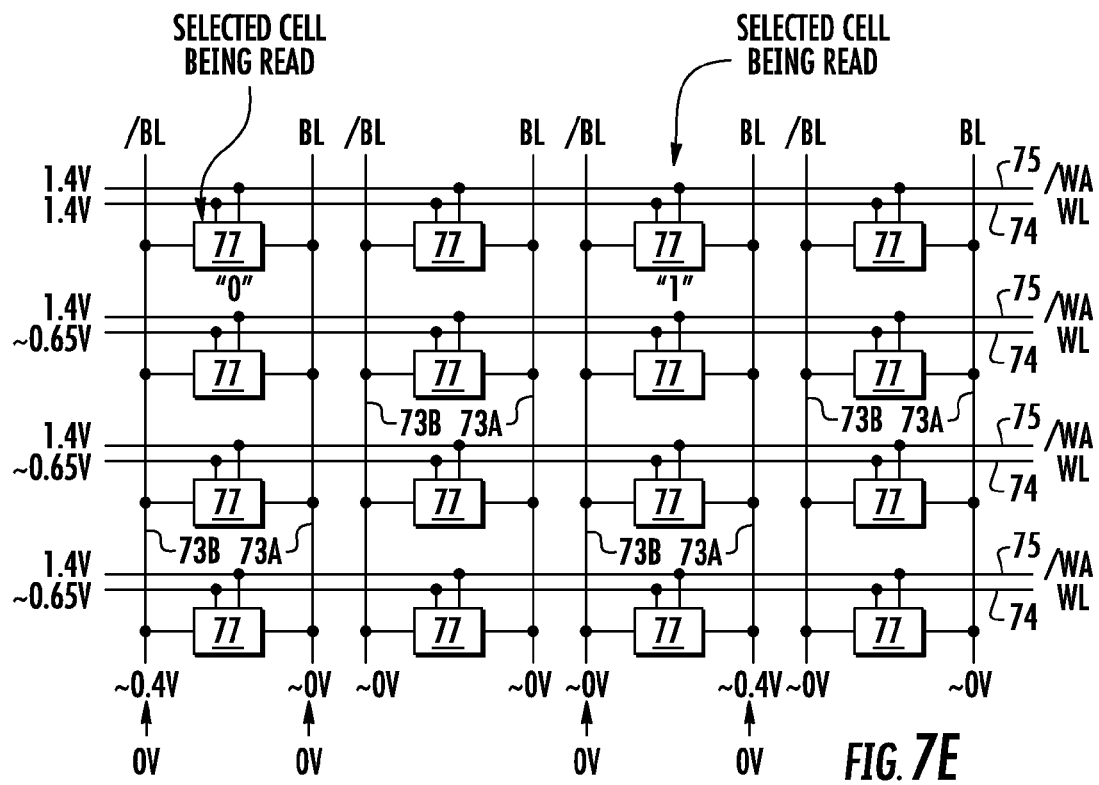
FIG. 7E illustrates a cross point array of FIG. 7D memory cells with voltages on bit lines and word lines for a Read operation.
Figure 7F:
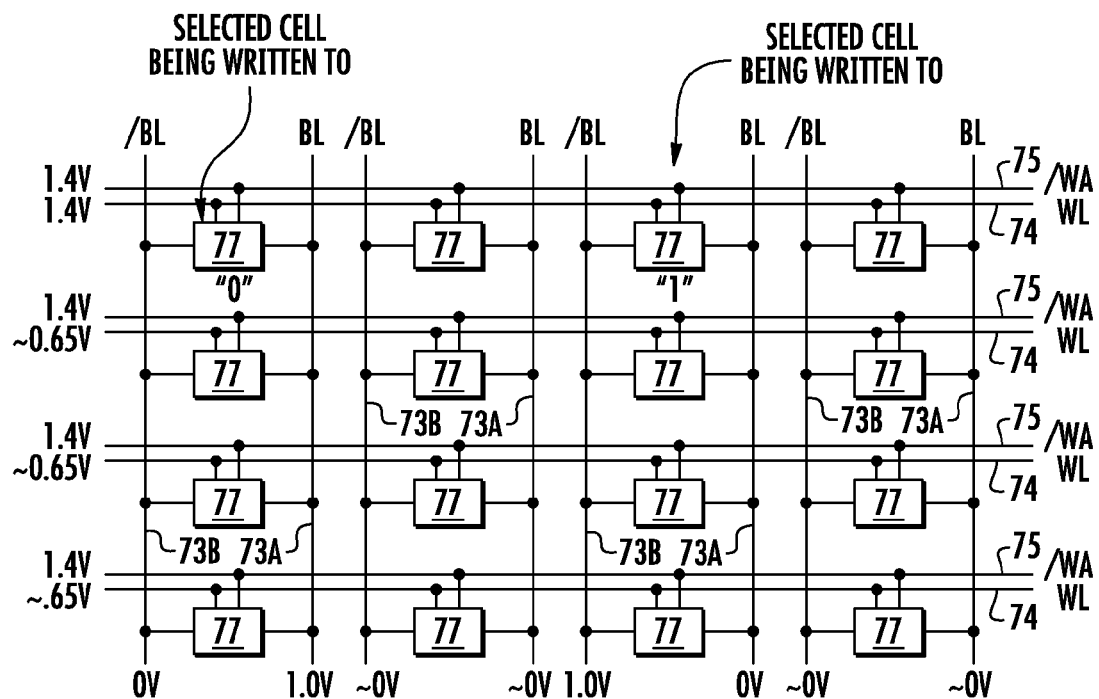
FIG. 7F illustrates a cross point array of FIG. 7F memory cells with voltages on bit lines and word lines for a Write operation.

Read and Write operations for the cross point array of FIG. 7A memory cells 77 are illustrated in FIGS. 7B and 7C. The conditions for Standby are also implicitly illustrated. In these exemplary operations, a digital "0" and "1" is read from and written into respectively the first and third memory cells 77 in the first row of the array. Similar to the memory cell of FIG. 7A, FIG. 7D shows a cross-coupled thyristor memory cell for a cross point array. In this example, the anodes of the cross-coupled thyristors are connected to the word line 74 and the cathodes of the thyristors are respectively connected to the complementary bit lines 73A, 73B. Read and Write operations for the cross point array of FIG. 7D memory cells 77 are illustrated in FIGS. 7E and 7F with a digital "0" and "1" is read from and written into respectively the first and third memory cells 77 in the first row of the array. Again, it should be noted the voltage values shown represent a range of values and are used to best illustrate the described operations. Optimum values are dependent upon the particular characteristics of the devices of an integrated circuit.

FIG. 36 et seq. illustrate the structure and method of manufacture of a memory cell with Write assist MOS(FET) s.

h. SRAM Cell with Single Thyristor

Figure 8A:
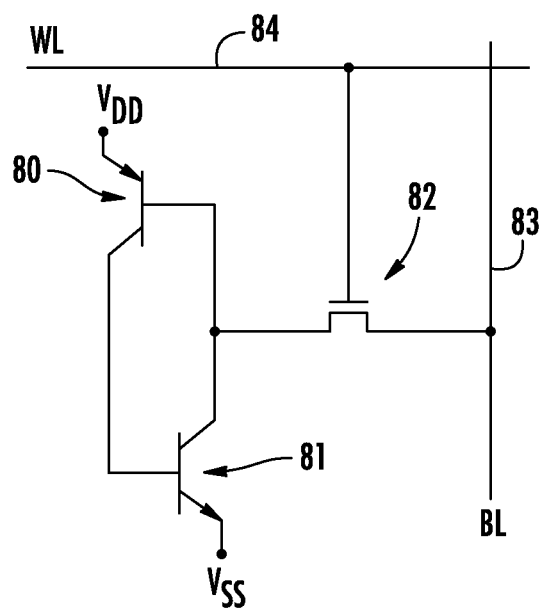
FIG. 8A is a circuit diagram of a single thyristor SRAM memory cell with a select transistor.
Figure 8B:
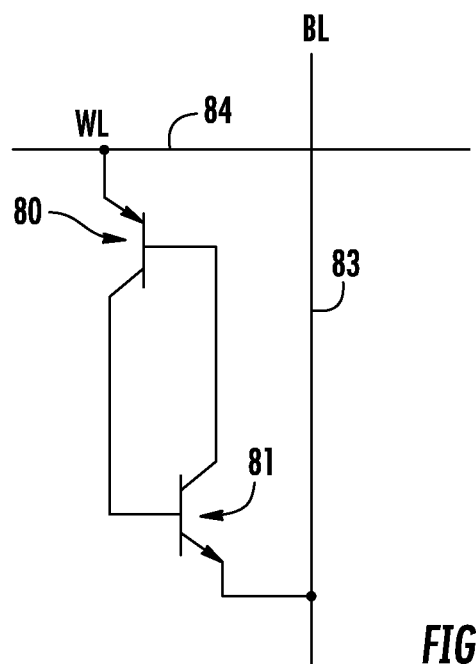
FIG. 8B is a circuit diagram of a single thyristor SRAM memory cell with no select transistor.

A memory cell comprising a single thyristor can also be used. FIGS. 8A and 8B show some basic configurations of a single thyristor SRAM memory cell. FIG. 8A shows one embodiment of the present invention in which a memory cell having a thyristor represented by a PNP transistor 80 and NPN transistor 81 connected between an upper voltage supply line at $V_{DD}$ and lower voltage supply line at $V_{SS}$. A select NMOS(FET) transistor 82 connects the single bit line 83 to the base region of the PNP transistor 80/collector region of the NPN transistor 81. The gate of the NMOS transistor 82 is connected to the word line 84. FIG. 8B shows another embodiment of the present invention. In this case the select transistor is eliminated so that the emitter region of the PNP transistor 80 is connected directly to the word line 84 and the emitter region of the NPN transistor 81 is connected to the bit line 83.

i. Single Thyristor SRAM Cell with Write Assist Transistors

Figure 9A:
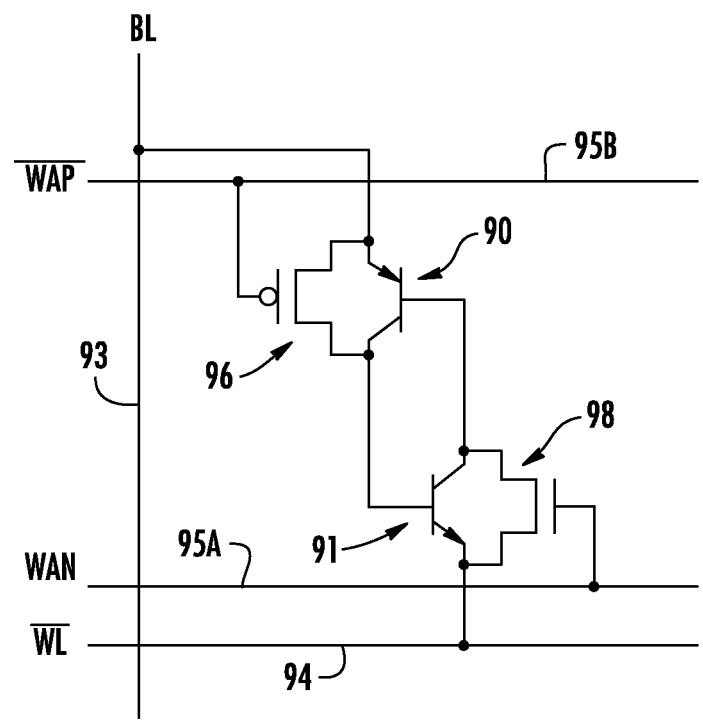
FIG. 9A illustrates a single thyristor SRAM memory cell with a PMOS and NMOS Write assist transistors for a cross point array.
Figure 9B:
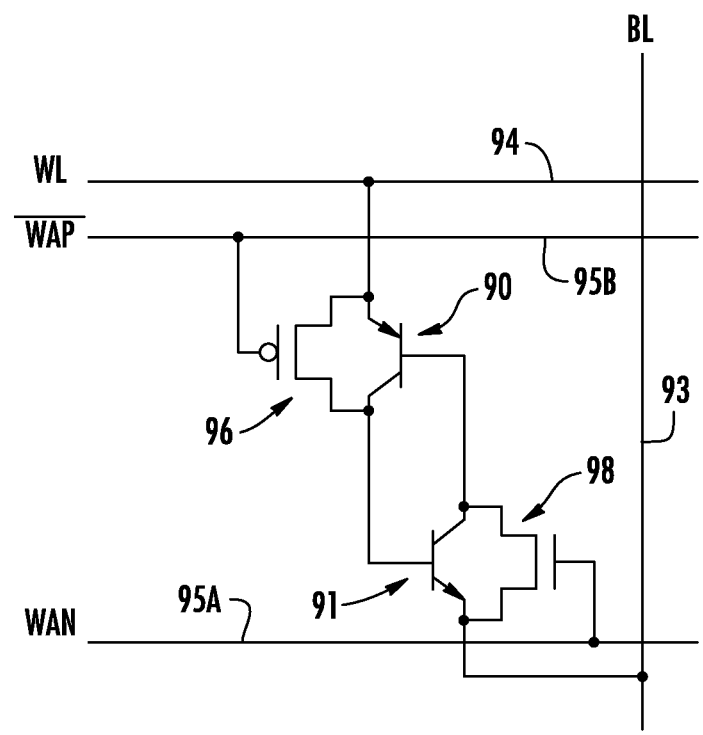
FIG. 9B shows another single thyristor memory cell similar to that of FIG. 9A with anode and cathode connections reversed.

The single thyristor memory cell can be arranged in many configurations. FIG. 9A shows a single thyristor memory cell in which the thyristor anode is connected to the bit line and the cathode connected to the word line. To speed operations, two Write assist MOS transistors are connected to the thyristor. A PMOS Write assist transistor 96 has a source/drain connected to the anode of thyristor and a second source/drain connected to the collector region of the PNP transistor 90/base region of the NPN transistor 91. Its MOS transistor gate is connected to a Write assist line 95B. An NMOS Write assist transistor 98 has a source/drain connected to the cathode and the collector region of the NPN transistor 91/base region of the PNP transistor 90. Its gate is connected to another Write assist line 95A. FIG. 9B shows another single thyristor memory cell similar to that of FIG. 9A. In this example the anode of the thyristor is connected to the word line and the cathode connected to the bit line. Two MOS transistors, a PMOS transistor and NMOS transistor, are connected to the thyristor to act as Write assist transistors as described for the FIG. 9A memory cell.

Figure 9C:
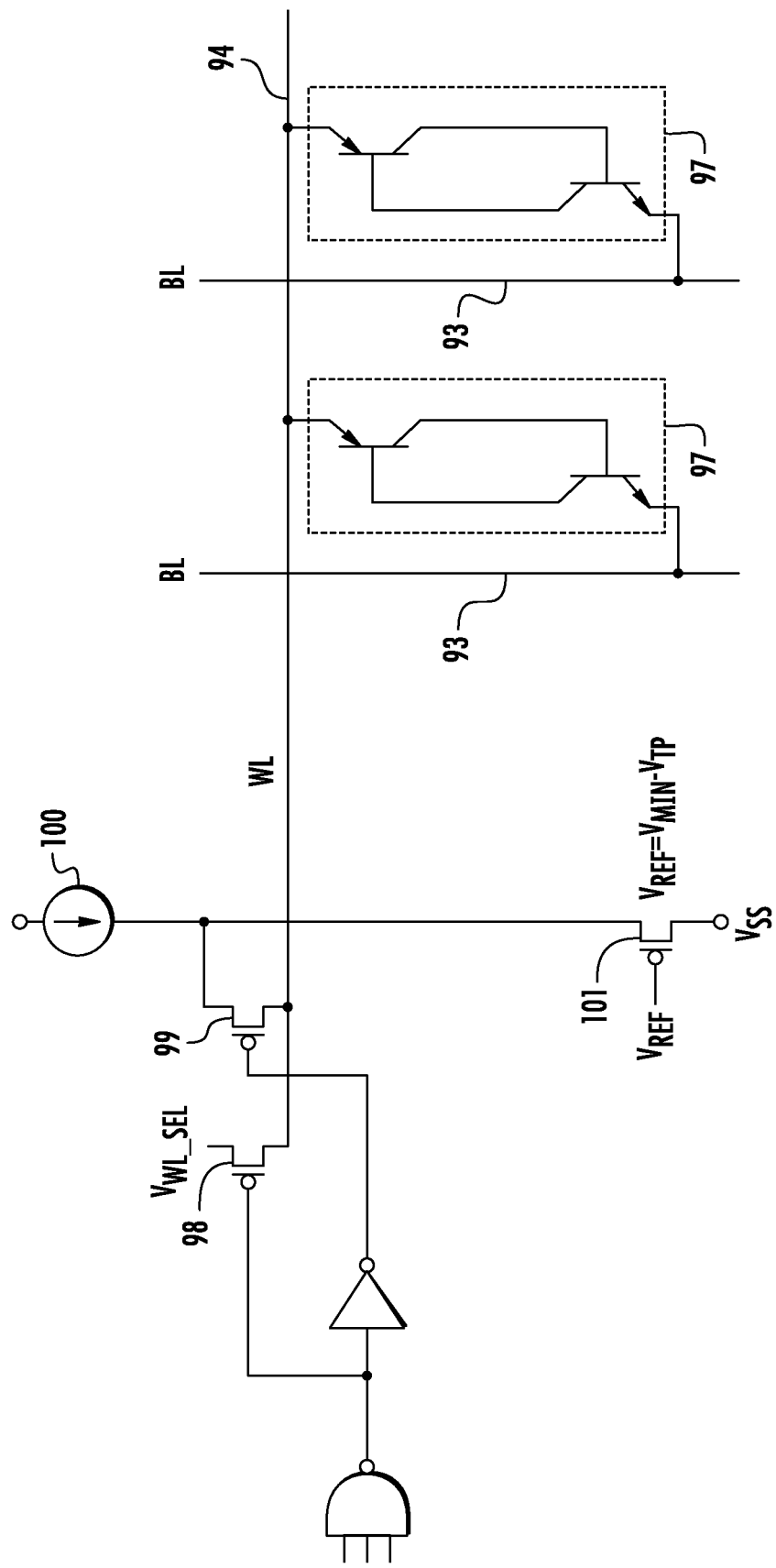
FIG. 9C is a circuit schematic for a standby current source for a single thyristor SRAM memory cell in a cross point array.
Figure 9D:
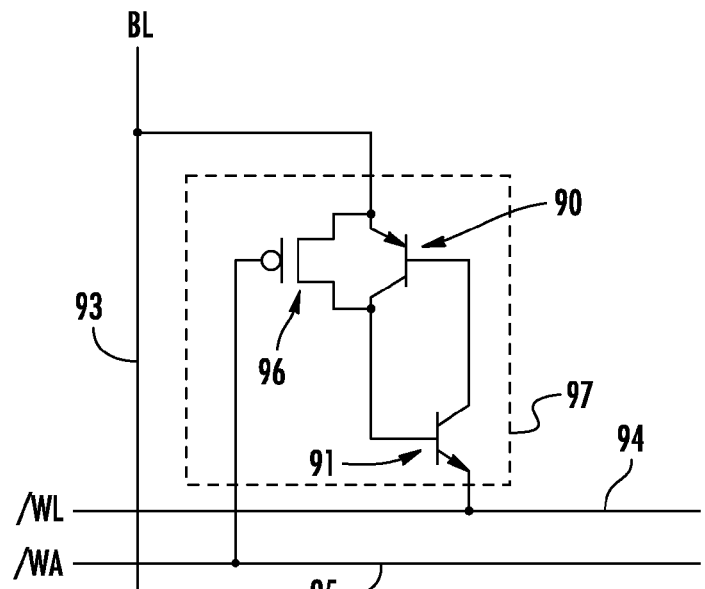
FIG. 9D shows a circuit diagram of a single thyristor SRAM memory cell having its anode connected to the bit line and its cathode connected to the word line with a PMOS Write assist transistor.
Figure 9E:
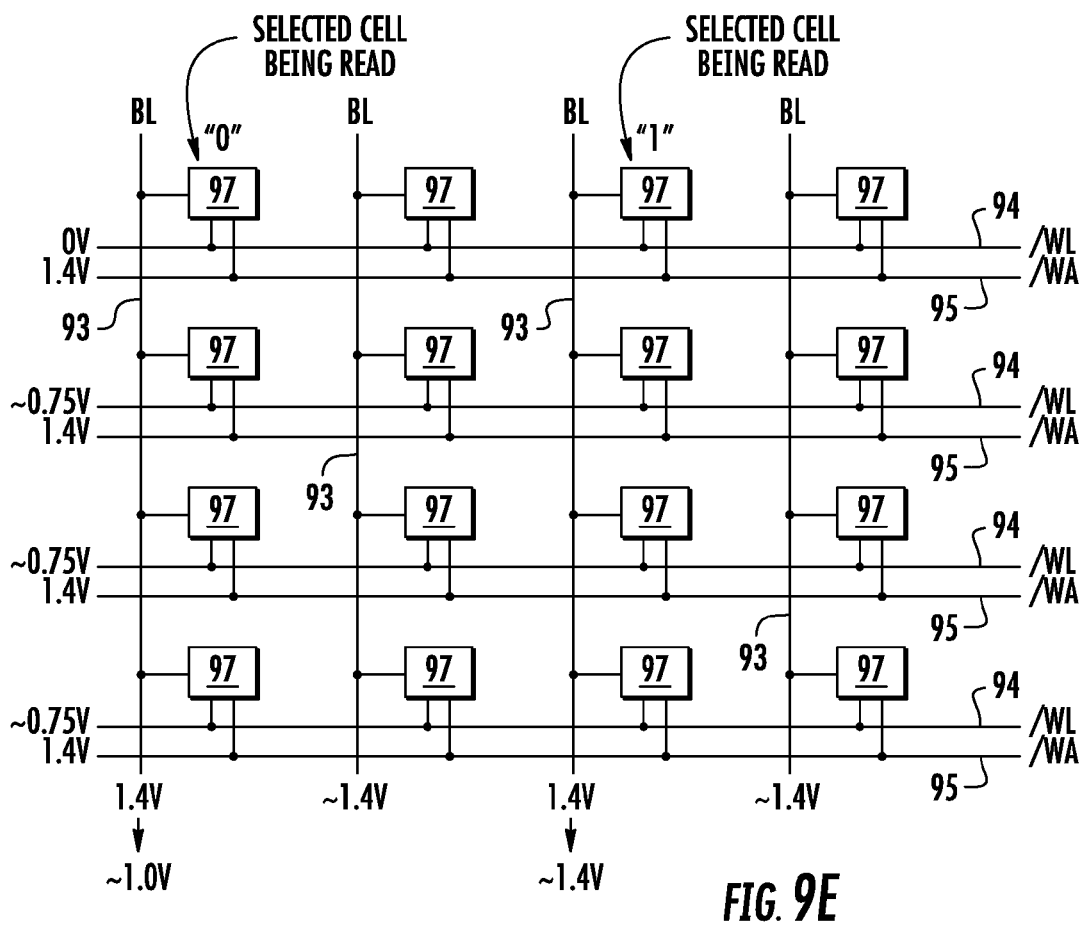
FIG. 9E shows a cross point array of FIG. 9D memory cells with voltages on bit lines and word lines for a Read operation.

The memory cell of FIG. 9D shows a single thyristor with its anode connected to the bit line and the cathode connected to the word line. A single PMOS transistor 96 having a source/drain region connected to the anode and the second source/drain connected to the collector region of the PNP transistor 90/base region of the NPN transistor 91 acts as a Write assist transistor. The gate of the PMOS transistor 96 is connected to a single Write assist line 95. FIG. 9H shows another single thyristor memory cell which has its anode and cathode connections reversed compared to that of FIG. 9D.

j. Reduced Power Standby Operation for Single Thyristor SRAM Cells

The operation of the single thyristor cell in a cross-point array is very similar to that of the earlier described cross-coupled thyristor memory cell. In Standby the single bit line 93, BL, is maintained at its "pre-charge" level (0V if the BL connects to the cathode, the array "high" voltage (~1.4V) if the BL connects to the anode of the thyristor.) The word line 94, WL, is held an intermediate voltage which is sufficient to maintain the "ON" state of "ON" thyristors in the memory array but low enough to keep the current flow through the "ON" thyristors at a minimum level in the range of pico-amperes or 10's of pico-amperes per bit. This is tricky because the current drawn by an deselected row in deselect now depends on the number of "ON" cells contained in the row. With the cross-coupled thyristor cell, each cell always has one "ON" thyristor and one "OFF" thyristor, so the row Standby current is always the same which allows the necessary Standby current to be supplied with a pre-set constant current source as described earlier.

With a single thyristor cell, a memory cell with digital bit D=1 has a single "OFF" thyristor and a memory cell with digital bit D=0 has a single "ON" thyristor, so the total current drawn in Standby now depends on the data pattern stored in the row, so the constant current source described elsewhere doesn't work correctly. If a constant current source is used to maintain the row in Standby, the supplied constant current must be sufficiently large to supply the current required if ALL the cells in the row are "ON", otherwise the current draw of all the cells would pull the voltage on the word line too far towards the bit line voltage and at least some cells on the row would be starved of current and eventually flip to the "OFF" state. But if the current source feeding the word line in Standby sends the current required when all the cells are "ON," a problem occurs when many of the cells are actually off. Then the current supplied is larger than the current being pulled out by the "ON" cells and this causes the WL voltage to move away from the BL voltage, increasing the voltage drop across the cells in the row. This would not cause a Standby current draw problem because the total current would still be equal to the worst-case current when all cells are "ON". The problem occurs when only a very few or perhaps none of the cells on the row are in the "ON" state. In this case the word line voltage is pulled all the way to the supply voltage that connects to the other side of the current source (presumably either the array "high" voltage of ~1.4 v if the bit lines are connected to the memory cell cathodes, or to 0V if the bit lines are connect to the memory cell anodes). This can be tolerated for some period of time (perhaps 100's of microseconds, but very prolonged exposure to this full voltage drop across the cells eventually causes some of the "OFF" cells to flip to the "ON" state, disturbing the data in the memory array.

Hence with the single thyristor cell, if a current source is to control the Standby condition (i.e.—the word line WL voltage), then some sort of "clamp" must be provided on the wire driven by the current source that prevents the Standby voltage on the word lines from increasing (if the word line WL is connected to the cell's thyristor anode) or decreasing (if the word line WL is connected to the cell's thyristor cathode) beyond the minimum disturb voltage when there are few or no "ON" cells in the group of cells being held in Standby. This "clamp" consists of some cascode-type device (FET or BJT) that turns on when the Standby voltage crosses a designated threshold and then shunts away the excess current being provided by the Standby constant current source. For example, FIG. 9C shows a Standby current source arrangement for memory cells with single thyristors in a cross point array. In this embodiment the cathode of the cell thyristor is connected to the bit line 93 and the anode of the thyristor is connected to the word line 94. The current source 100 is connected to the word line 94 through a PMOS transistor 99. In another embodiment (not shown) the anode and cathode connections to the bit and word lines are reversed. Another more brute force approach uses an analog voltage regulator, such as an op-amp comparing the stand-by voltage to a reference voltage, and activating a shunt transistor (FET or BJT) when the reference voltage is exceeded.

k. Read and Write Operations in a Single Thyristor Cell

In Read operations the single thyristor cell operates identically to the cross-coupled thyristor cell. Before the word line WL is selected, the bit line BL is pre-charged (low if the word line is connected to the memory cell thyristor anode (e.g., see FIGS. 9B and 9H), high if the word line is connected to the thyristor cathode (e.g., see FIGS. 9A and 9D)) and then left floating. Then the word line WL is selected. If the selected cell is "OFF", the bit line BL is left floating at the pre-charge voltage. If the selected cell is "ON," then the bit line BL is pulled toward the WL voltage thru the "ON" thyristor of the selected cell. See FIGS. 9E and 9I for some representative voltages for Read operations for memory arrays for FIGS. 9D and 9H cells respectively.

In Write operations, the Write-to-ON operation is identical to the bit line BL connected to the "OFF" thyristor in the cross-coupled thyristor memory cell. The bit line BL is driven to the opposite voltage from the word line WL (low if the word line is connected to the thyristor anode (e.g., see FIGS. 9B and 9H), high if the word line is connected to the thyristor cathode (e.g., see FIGS. 9A and 9D)) and a PMOS Write assist transistor 96 (see FIG. 9D) is turned on by dropping the voltage on the Write-assist line. The cell is flipped to the ON state just as described above.

For the Write-to-OFF operation in a single thyristor cell, the useful cross-coupling effect to help remove charge of a cross-coupled thyristor cell is not present. Instead, the Write-to-ON and the Write-to-OFF operations are segregated into two separate voltage bias schemes. In the Write-to-OFF operation, the selected bit line BL is driven toward the normal word line WL select voltage (~1.0 v if the word line is connected to the cell anodes, ~0.2V if the word line is connected to the cell cathodes), just as for the cross-coupled thyristor cell arrays. The difference is that the selected word line WL is also driven toward an intermediate voltage near or at the Standby level. This applies a negative anode-cathode voltage across the cell to maximize the leakage currents trying to dissipate the charge stored in the shallow N-well, the base region of the PNP transistor 90/collector region of the NPN transistor 91, of the thyristor. The PMOS Write assist transistor 96 still works to remove charge from the P-well, the collector region of the PNP transistor 90/base region of the NPN transistor 91, of the thyristor as described above.

Therefore, a Write operation for a data pattern into a row is performed in two stages, one in which the word line WL is driven to the select voltage and the selected bit lines BLs are driven pre-charge levels to flip the "OFF" cells to "ON's". Then the word line WL is switched to the fully OFF voltage (not just the Standby level) and the "other" selected bit lines BLs are driven to the opposite voltage from the pre-charge level to flip "ON" cells to "OFF's". When writing the "ON's" on the selected bit lines, the non-selected bit lines (including the BLs to be subsequently written to "OFF") need to be driven to near the WL level to prevent non-selected "OFF" cells on the row from being flipped to "ON". Then when writing the "OFF's" on the "other" selected bit lines, the non-selected bit lines BLs (including the bit lines just written to "ON") need to be driven to the pre-charge level to prevent the non-selected "ON" cells on the row from being flipped to the "OFF" state. In this second case, the word line WL voltage is set at some intermediate level near the Stand-by voltage so that there is enough current in the "ON" cell(s) to keep the cells alive when the Write assist gate is turned on. This is the cross-point memory "half-select" condition.

Figure 9F:
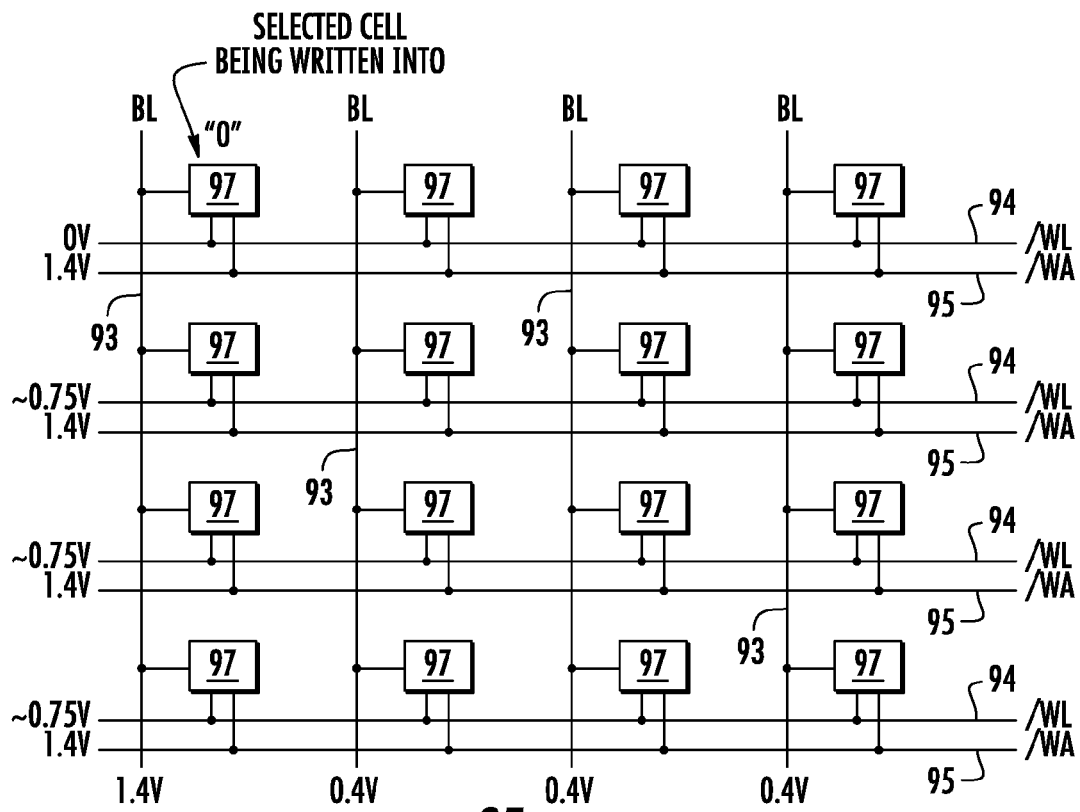
FIGS. 9F and 9G show a cross point array of FIG. 9D memory cells with voltages on bit lines and word lines for a two-stage Write operation.
Figure 9G:
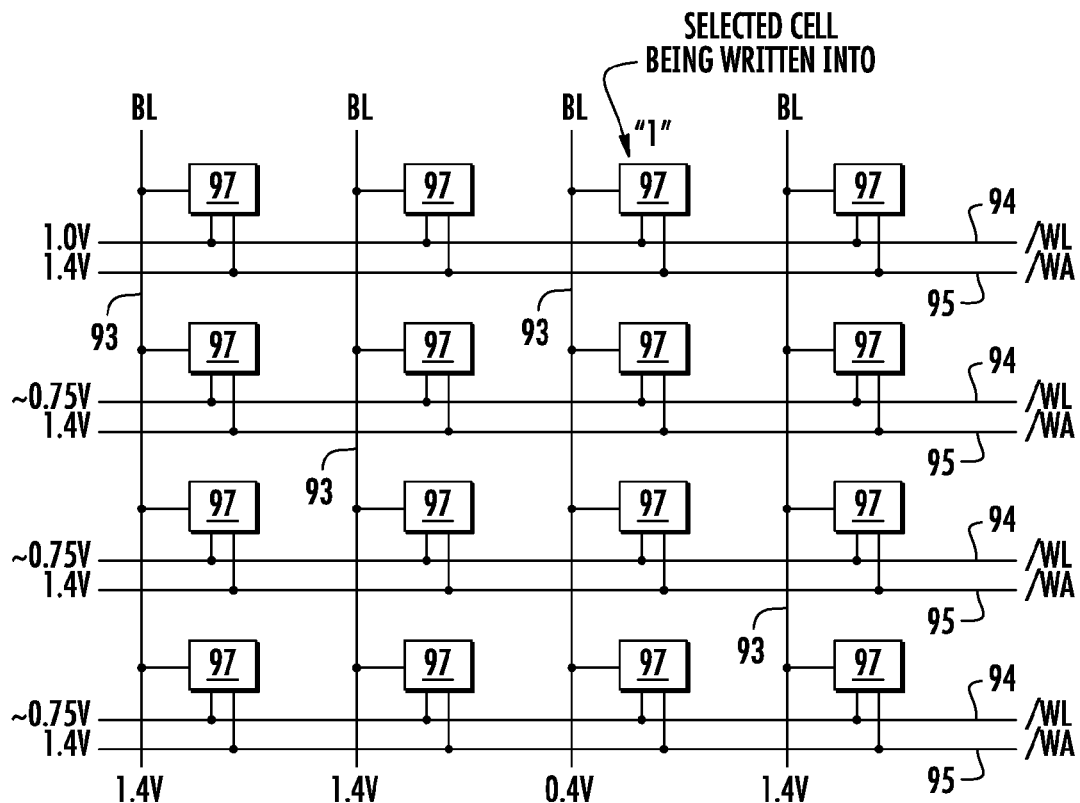
Figure 9H:
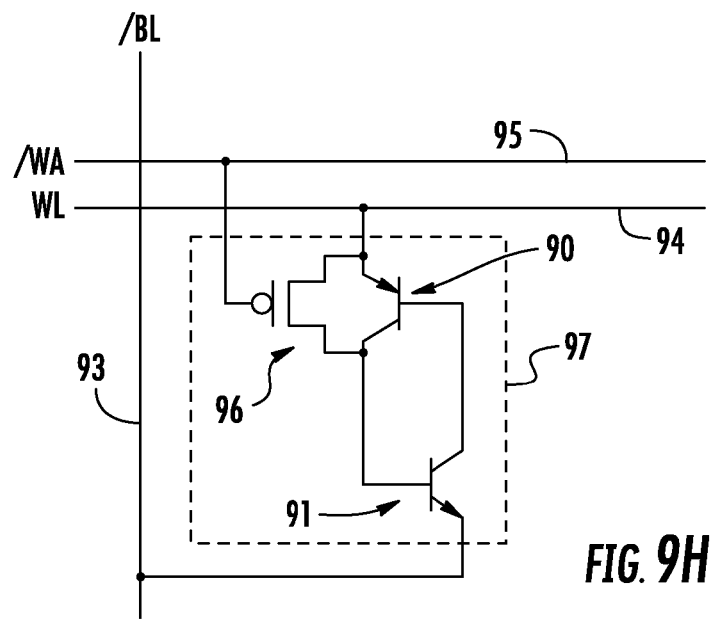
FIG. 9H shows a circuit diagram of a single thyristor SRAM memory cell having its anode connected to the word line and its cathode connected to the bit line with a PMOS Write assist transistor.
Figure 9I:
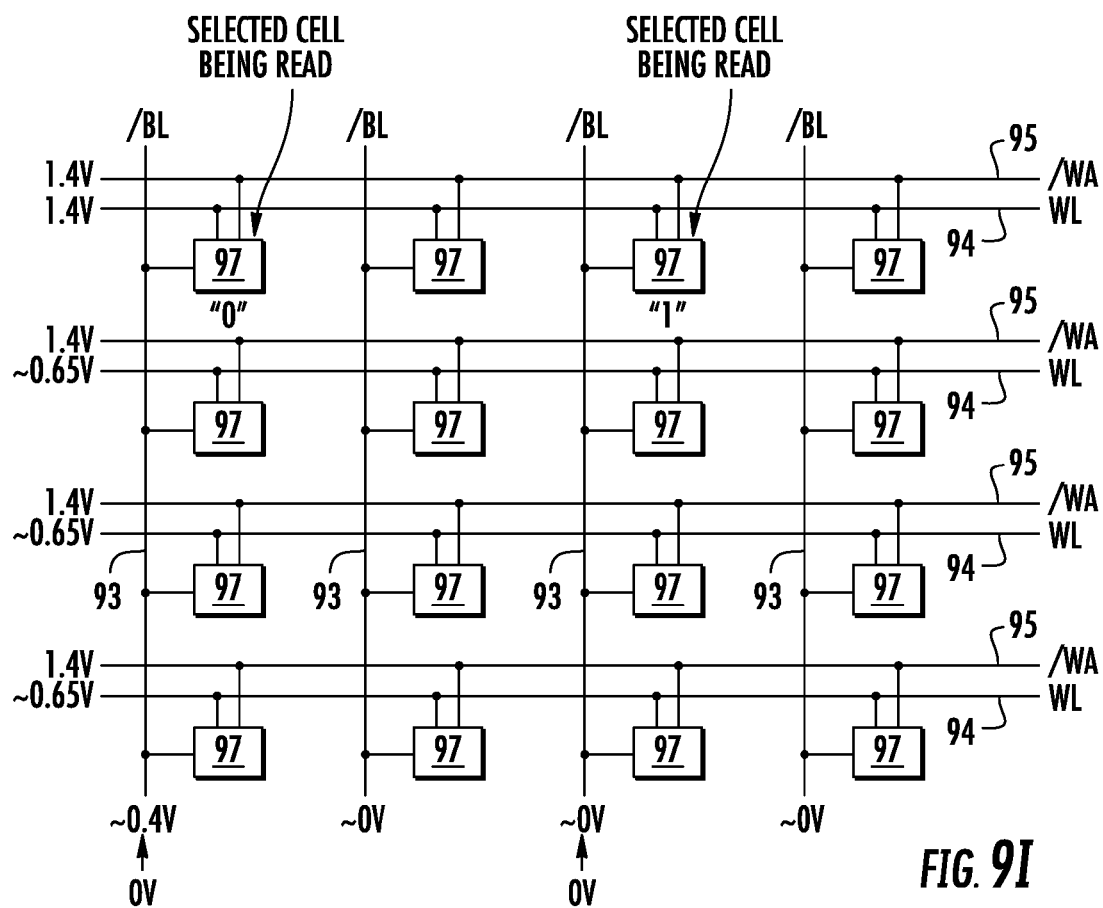
FIG. 9I shows a cross point array of FIG. 9H memory cells with voltages on bit lines and word lines for a Read operation.
Figure 9J:
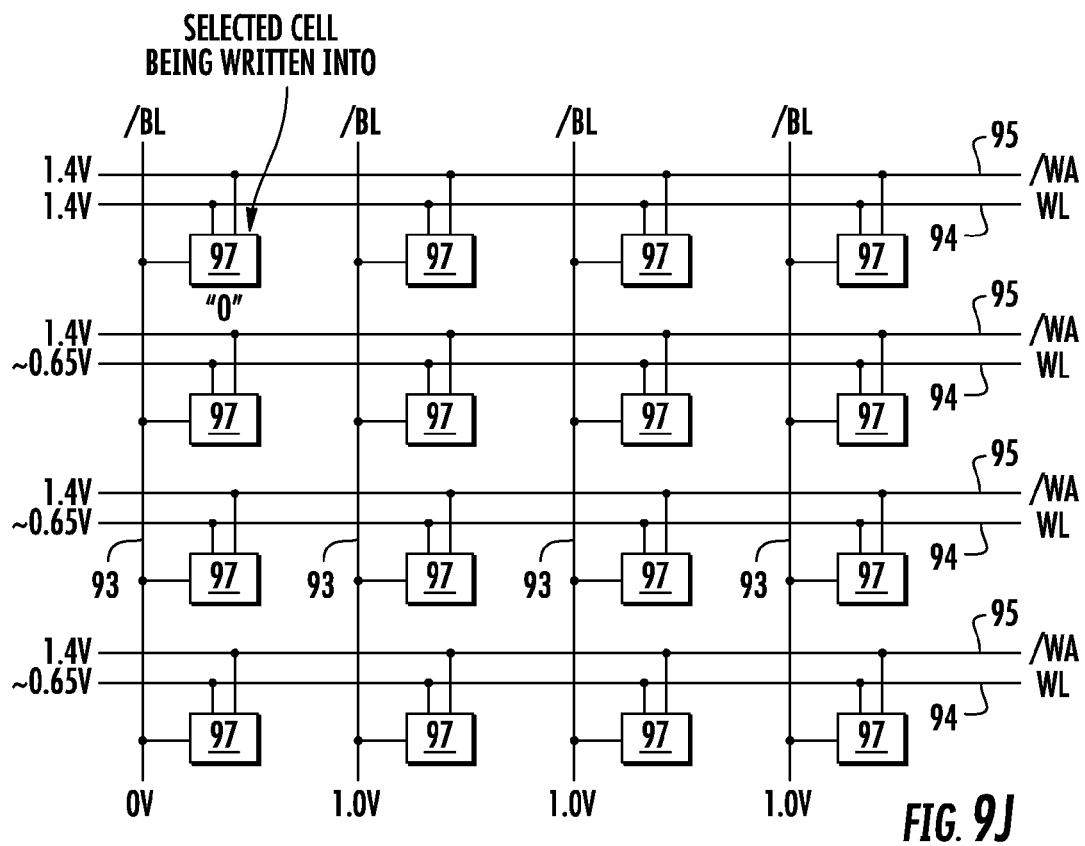
FIGS. 9J and 9K show a cross point array of FIG. 9H memory cells with voltages on bit lines and word lines for a two-stage Write operation.
Figure 9K:
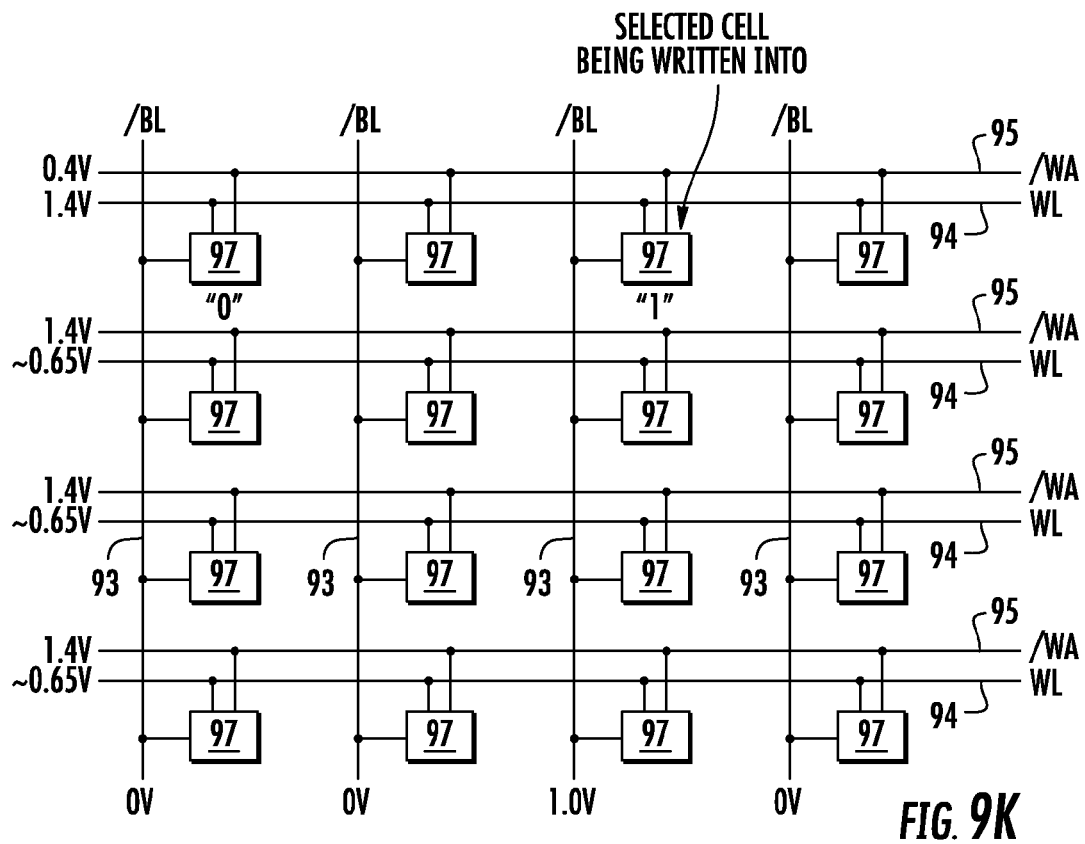

FIGS. 9F and 9G show some representative voltages for the described two-stage Write operations for FIG. 9D memory cell arrays. FIGS. 9J and 9K show some representative voltages for the described two-stage Write operations for FIG. 9H memory cell arrays.

1. Reduced Power Write Operations for Single Thyristor SRAM Cell

The Write operation stage in which the "OFF" single thyristor memory cells are turned "ON" can benefit from the previously described reduced power Write operation for cross-coupled thyristor SRAM cells. In the Write operation description above the bit line connected to the "OFF"

thyristor memory cell which is to be written to an "ON" state is held high to guarantee that the thyristor receives the maximum Write voltage during the duration of the Write operation pulse to turn the thyristor "ON". Once the thyristor turns "ON", the newly "ON" thyristor conducts the maximum "ON" current while the thyristor's bit line is held high. This increases the power consumption during the Write operation. More importantly, the word line must carry away the current from all the cells on the row so that this current can be very large. This can cause a significant voltage drop along the word line due to the electrical resistance of the line and may result in instability in the memory array.

This situation can be ameliorated by pre-charging the bit line to the "OFF" cell high prior to the Write pulse in a fashion similar to a Read operation described above as illustrated in FIG. 9L. FIG. 9M is a representation of the voltages at various locations of the FIG. 9L memory cell. After the pre-charge, the pre-charge is turned off to allow the bit line to "float" until the memory cell flips state. At that point the current through the newly "ON" thyristor pulls the bit line low (similar to a Read operation). As the bit line voltage falls, the voltage drop across the thyristor decreases and the current falls toward the minimum holding current. Again, there are three benefits. First, the peak current is reduced because the bit line voltage starts to drop before the internal voltages in the memory cell turn the thyristor fully "ON". Secondly, the now narrow current pulse (shown by the shape of $I_{ThyL}$ in FIG. 9M) reduces the power dissipated in the Write operation. Thirdly, since from a statistical standpoint the various cells in the row being written flip at different times, the peak current in the word line is reduced and spread over a larger time interval, further minimizing the undesirable voltage drop along the word line.

Figure 9L:
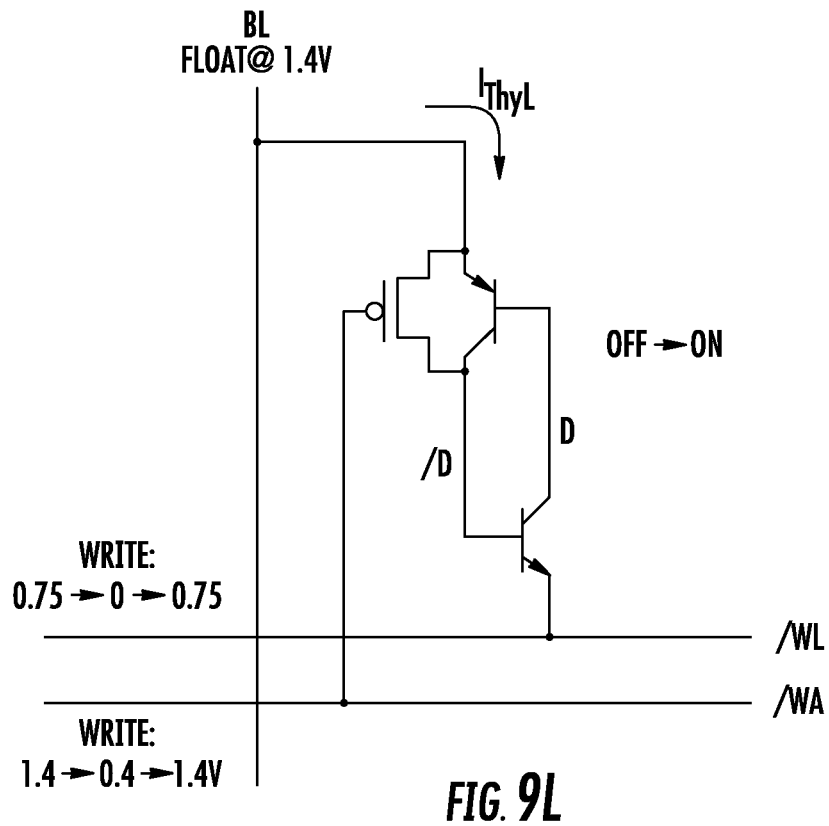
FIG. 9L shows a low-power Write operation for a single thyristor memory cell array connected to bit lines and word lines in one configuration.
Figure 9M:
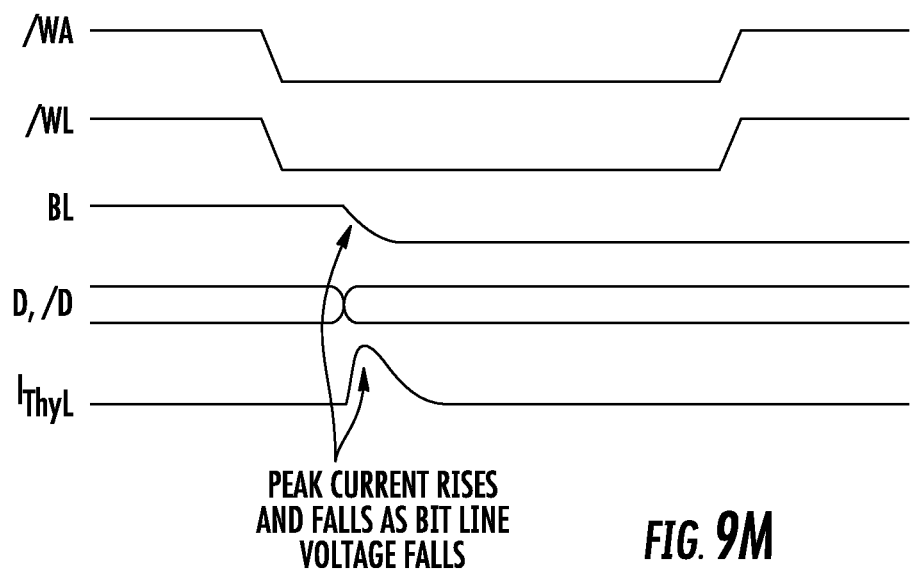
FIG. 9M is a representative timing diagram at various points of the memory cell in FIG. 9L; and Figure N shows a low-power Write operation for a single thyristor memory cell array connected to bit lines and word lines in a reverse configuration to that of FIG. 9M.
Figure 9N:
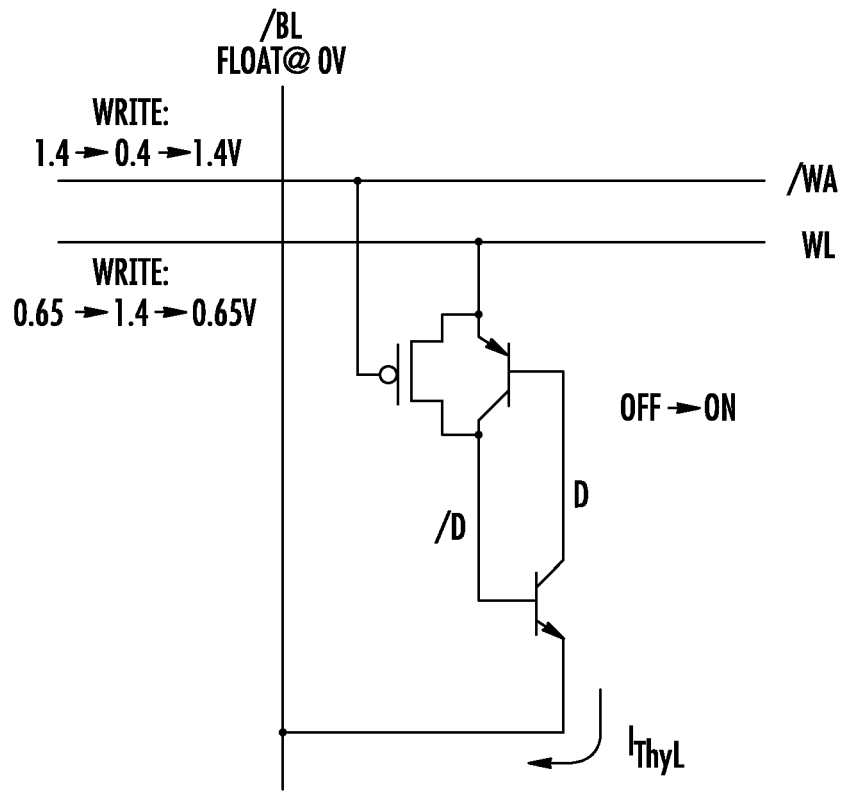
FIG. 9O is a representative timing diagram at various points of the memory cell in FIG. 9N.
Figure 9O:
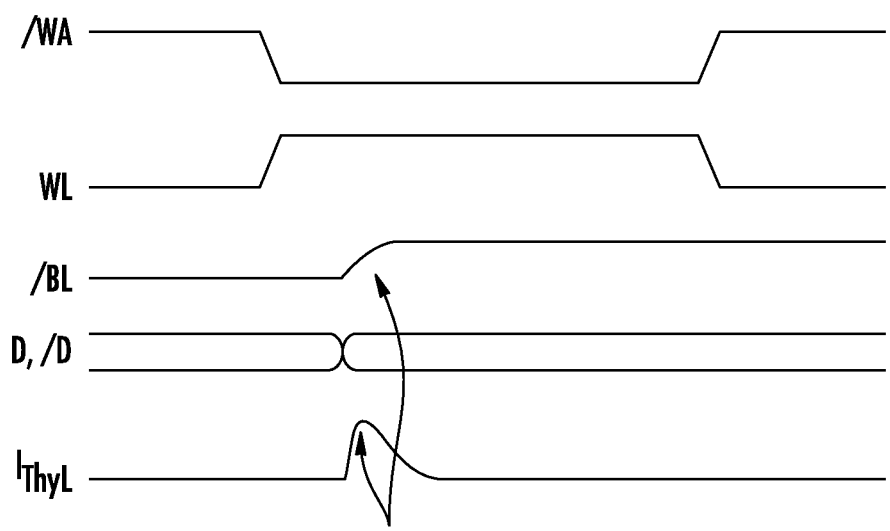

FIG. 9N illustrates the low power Write operation for a single thyristor cell in which the connections to the word and bit lines are reversed compared to that of FIG. 9L. That is, the FIG. 9N memory cell has its thyristor anode connected to the word line and its cathode to the bit line. FIG. 9O is a representation of the voltages at various locations of the FIG. 9N memory cell. In this example, the bit line to the "OFF" cell is pre-charged low prior to the Write pulse (similar to a Read operation). Then the pre-charge path is turned off to allow the bit line to "float" until the memory cell flips state. At that point current through the newly "ON" thyristor pulls the bit line high (similar to a Read operation). As the bit line rises, the voltage drop across the thyristor decreases and the current drops toward the minimum holding current. The same benefits as described in the previous paragraph are achieved. First, the peak current is reduced because the bit line voltage starts to rise before the internal voltages in the memory cell turn the thyristor fully "ON". Secondly, the now narrow current pulse (shown by the shape of $I_{ThyL}$ in FIG. 9O) reduces the power dissipated in the Write operation. Thirdly, since from a statistical standpoint the various cells in the row being written flip at different times, the peak current in the word line is reduced and spread over a larger time interval, further minimizing the undesirable voltage drop along the word line.

II. Description of Integrated Circuit Structures and Manufacture

Figure 10:
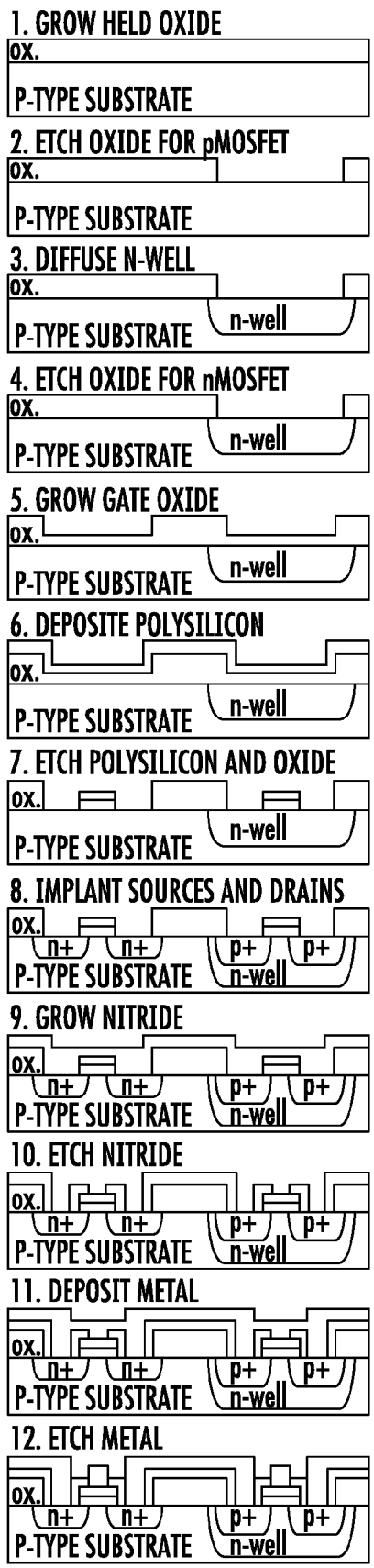
FIG. 10 illustrates a prior art complementary metal oxide semiconductor (CMOS) process.

The memory cells described above can be manufactured using existing manufacturing technology. New semiconductor fabrication operations are not required, eliminating the expense and complication associated with new process development steps. As a point of departure, FIG. 10 illustrates the basic steps in a CMOS process commonly used today. FIG. 10 illustrates a well-known prior art complementary metal oxide semiconductor (CMOS) process employing a P-conductivity type substrate. In the discussion that follows, the process illustrated in FIG. 10 is referred to herein as a "standard CMOS process." The process begins with formation of an annular region of insulating material (not shown), typically silicon dioxide, to isolate regions of the semiconductor from each other prior to formation of the transistors in the substrate. (This process is discussed below in conjunction with FIG. 11.) FIG. 10 illustrates one such isolated region. Then as shown in step 1, a layer of silicon dioxide is grown on the P conductivity type silicon substrate providing a field oxide. Next, in step 2, using conventional semiconductor manufacturing techniques, a layer of photoresist (not shown) is defined over the field oxide to enable removal of the field oxide in a location where an N-conductivity type well is to be formed. Then, using ion implantation, or other well-known technology, N-conductivity type impurity is implanted into the substrate to define the N-well.

As next shown by step 4, another masking operation is performed to expose the substrate and the location where the NMOS transistor is to be formed. Gate oxide is then formed over this portion of the substrate as well as over the N-well. The appearance of the structure at this stage of the process is shown by step 5. As shown in step 6, a layer of polycrystalline silicon is deposited across the surface of the semiconductor. This layer will ultimately become the gates of the complementary MOS transistors.

Using another masking operation, the polysilicon layer and the gate oxide layer are etched to remove them in the locations where the sources and drains are to be formed for the complementary MOS transistors. The appearance of the structure is shown at step 7. Next, in separate operations the N-conductivity type and P-conductivity type impurity used to form the sources and drains of the transistors are implanted into the substrate. This is shown at step 8.

A dielectric layer such as silicon dioxide or silicon nitride is then deposited across the surface of the structure, and etched to expose the locations for ohmic contacts to the sources and drains. These operations are shown in steps 9 and 10. As shown by step 11, a metal layer, for example aluminum, or other electrically conductive material, is then deposited across the surface of the structure to provide electrical connections to the sources and drains, as well as the gates. Finally, as shown by step 12, the metal is etched to provide the metal interconnections to the CMOS transistors.

a. Shallow Trench Isolation

FIG. 11 illustrates a well-known process for forming shallow trench oxide isolation regions in integrated circuits. These regions are shown in many of the figures here, for example, region 111 in FIG. 13. The process shown in FIG. 11, as well as similar variants, is commonly referred to as shallow trench isolation, and is preferred over the previous technique, commonly referred to as local oxidation of silicon (LOCOS). In the shallow trench process a thin layer of silicon dioxide formed on the upper surface of the silicon substrate and then a layer of silicon nitride over that. Photoresist is then used to define areas where the shallow trenches are to be formed. The combined layers of silicon oxide, silicon nitride and photoresist are illustrated as a single layer 170 in FIG. 11A. At locations desired for isolation regions, trenches 171 are etched into the substrate as shown in FIG. 11B. The trench is then oxidized to fill it with silicon dioxide before chemical-mechanical planarization. For SRAM cells in this invention, a slight modification of the conventional trench isolation process can be optionally used for better isolation between the buried n-wells serving as thyristor cathodes. Here a conformal oxide or nitride is deposited and anisotropically etched to form a spacer of silicon dioxide 172 on the sidewalls of the trenches. If desired, an optional P-conductivity type impurity 173 is implanted into the structure to provide buried P regions for improved isolation of the "tubs" formed between the trenches. This procedure is then followed by the conventional trench fill and planarization.

b. Bipolar Transistor

Figure 12:
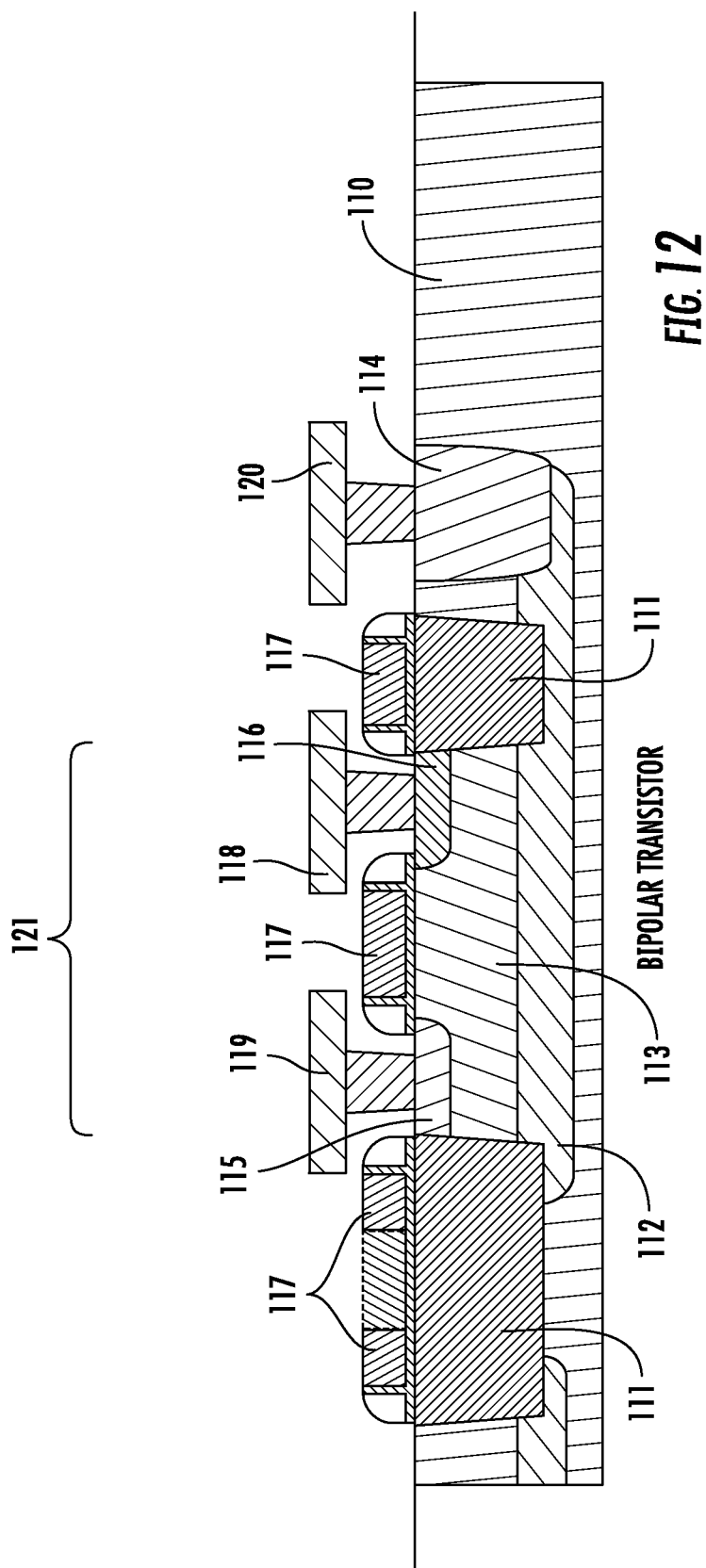
FIG. 12 illustrates a vertical bipolar transistor.

A collateral development from the thyristor-based SRAM cells described above is described next. The SRAM cells described below preferably employ bipolar transistors, usually embodied as thyristors formed by merged PNP and NPN bipolar transistors. For this reason we first describe a preferred implementation for a bipolar transistor and a process for making it. FIG. 12 illustrates a semiconductor structure in cross-section for a bipolar transistor/thyristor manufactured using a CMOS process. The use of a CMOS process for manufacture of bipolar transistors is particularly advantageous to the preferred embodiments here. That approach enables a CMOS logic circuit to be formed on a common substrate with high speed bipolar SRAM, for example, providing a cache memory for such a logic circuit, without need for more complicated and expensive BiCMOS process technology.

The structure depicted in FIG. 12 includes a P-type substrate 110 having shallow trench isolation regions 111. The annular shallow trench isolation shown in cross-section in FIG. 12 encircles a region 121 of the substrate within which the bipolar transistor is disposed. Not shown are other isolation regions at cross-sections in front of, and behind, the one illustrated in FIG. 12 that isolate this region of the semiconductor from other portions of the chip. Isolation 121 defines the sides of a "tub" in the substrate, with the bottom of the tub being defined by a buried N-conductivity type well 112. The buried N-type well 112 is preferably implanted into the substrate through both the silicon and the trench isolation 111. The tub 121 electrically isolates active or passive devices formed therein.

Note that in the depicted embodiment an electrical contact 114 to the buried n-well 112 is made by extending the n-type layer beneath a portion of the isolation region 111 to join more highly doped N-type region 114 that provides electrical contact to well 112 from the surface of the semiconductor. In an alternate embodiment the contact 114 is placed inside the annular trench isolation region 111. This contact to the buried N-well 112 could also be made within the isolation region 121.

A strongly doped N-type region 115 provides the emitter of the vertical bipolar transistor, with region 113 providing the base and region 112 the collector. Metal contacts 119, 118, and 120 provide electrical connections to the emitter, base, and collector, respectively. The regions 117 are unused (dummy) CMOS gate regions used to define separation spacing among the various components of the bipolar transistor shown in FIG. 12. The purpose of these dummy gate regions is discussed further in conjunction with the figures below.

Figure 13:
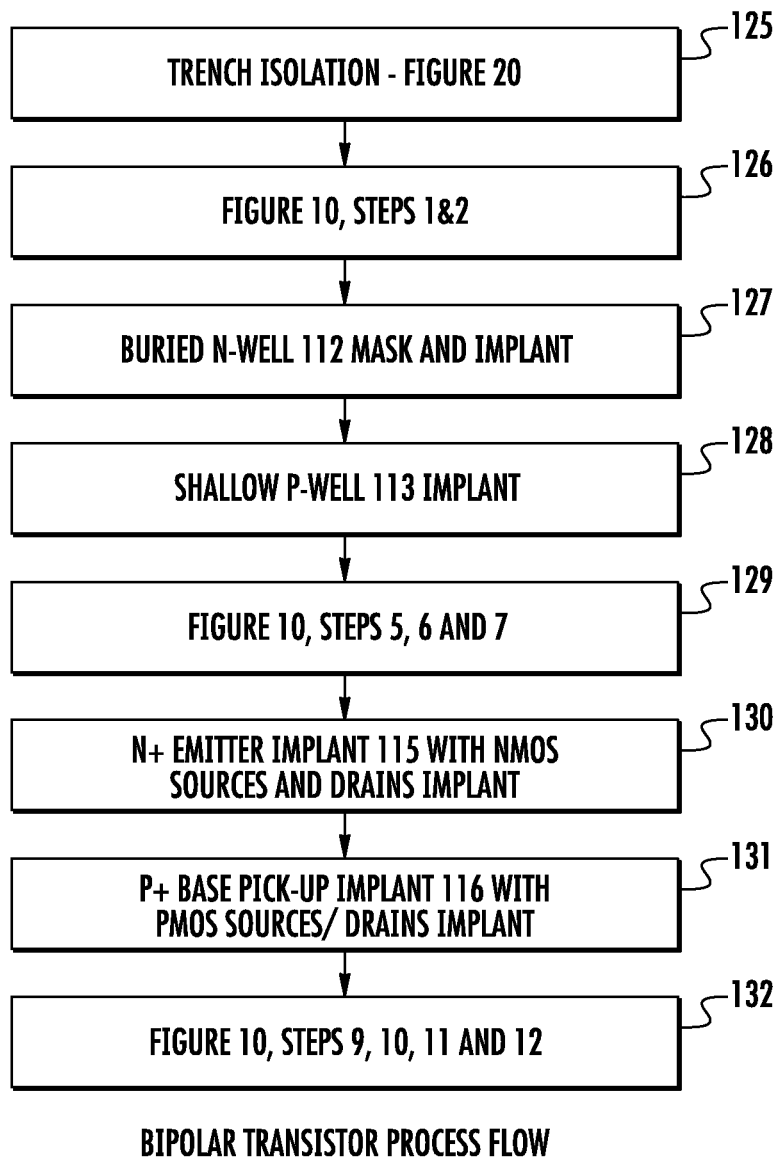
FIG. 13 is a flowchart of a process for fabricating the structure illustrated in FIG. 12.

FIG. 13 is a flowchart illustrating the steps in a process for fabricating the semiconductor structure illustrated in FIG. 11. The process begins with formation of trench isolation regions in step 125 as described above in conjunction with FIG. 11. Next, in step 126, operations 1 and 2 as described with respect to FIG. 10 are performed. Then the buried N-well 112 is masked and implanted as shown by step 127.

Figure 14A:
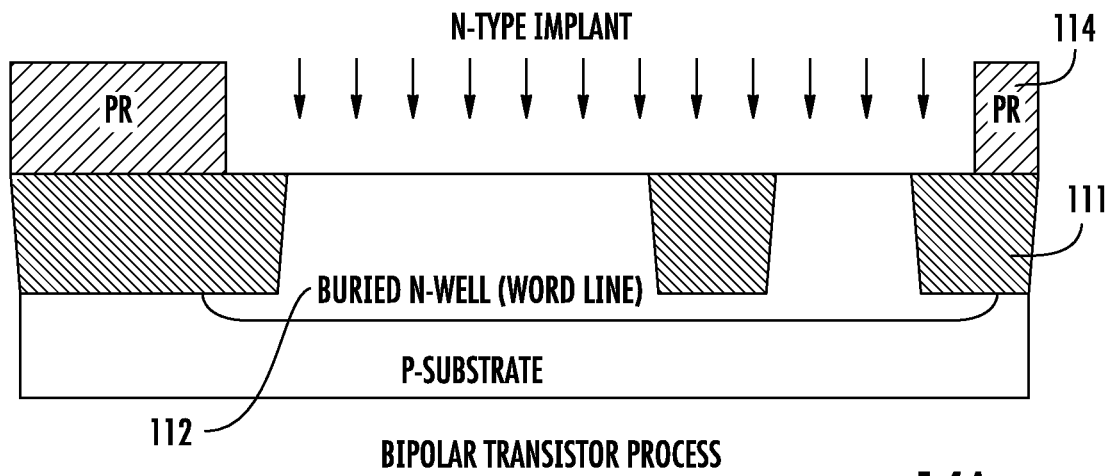
FIGS. 14A-14D illustrate some of the steps of FIG. 13 in more detail.
Figure 14B:
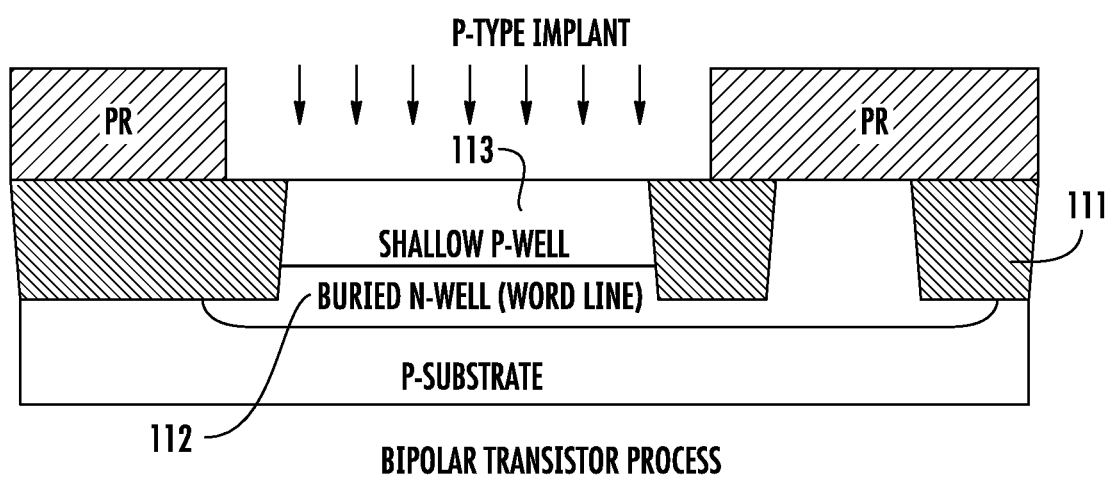

This step is shown in more detail in FIG. 14A illustrating the photoresist mask 114 and the N-well implant that will ultimately provide a word line (or other functionality). Then step 128 is performed to implant the P-type well 113, as also illustrated in FIG. 14B.

Figure 14C:
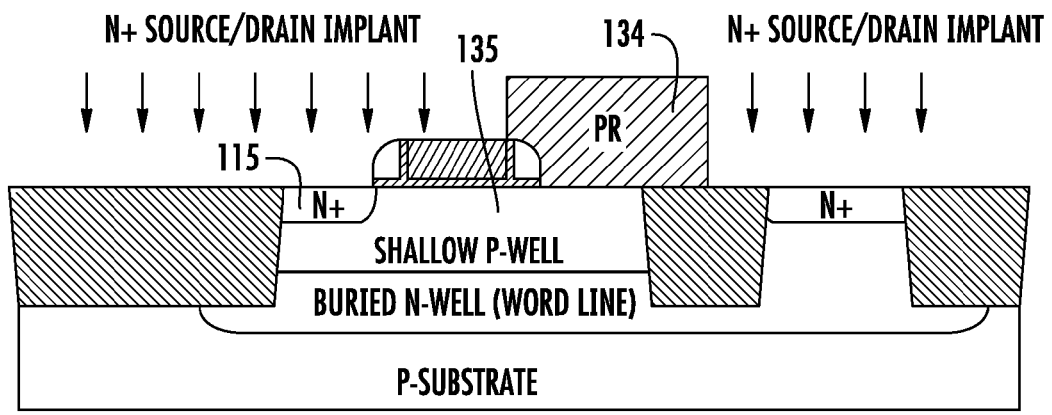

Next, as shown by step 129, conventional CMOS processing to form a field effect transistor gate is performed as per steps 5, 6, and 7 in FIG. 10. In the illustration of FIG. 14C, the gate thus formed includes gate oxide 136, a conductive electrode 137 (typically polycrystalline silicon) and nitride spacer 138. The gate region includes the residual silicon nitride 138 that remains on the sidewalls of the gate electrode 137 after the nitride layer is masked and etched away in a well-known manner.

Importantly in our process, however, the FET gate and gate oxide formed by this process are not used later as a gate electrode. Instead the gate is used to provide a "hard mask" which is later used to enable a self-aligned doping of the bipolar transistor emitter and the transistor base contact. As shown in FIG. 14C a photoresist mask 134 is used to protect one side of the gate region while an emitter implant is introduced on the other side of the gate 137. This N-conductivity type bipolar emitter 115 is implanted in the same operation as the N-type sources and drains for MOS transistors being formed on the same integrated circuit. Note that the hard mask formed by the gate 137 provides the left edge of the photoresist 134 to have wide tolerance in its positioning, i.e. this left edge can fall anywhere over the gate, yet still protect the base contact region 116 from receiving the N-type dopant of the emitter 115. In the various embodiments described below a "dummy" gate electrode is used to define the spacing between various regions. It will be appreciated, however, that it is not necessary to actually form a gate electrode. Instead a silicon dioxide/silicon nitride sandwich structure can be used, or other layers. One advantage of using a gate electrode is that this electrode is being formed in the same process operations as gates for CMOS logic are being formed elsewhere on the integrated circuit.

Figure 14D:
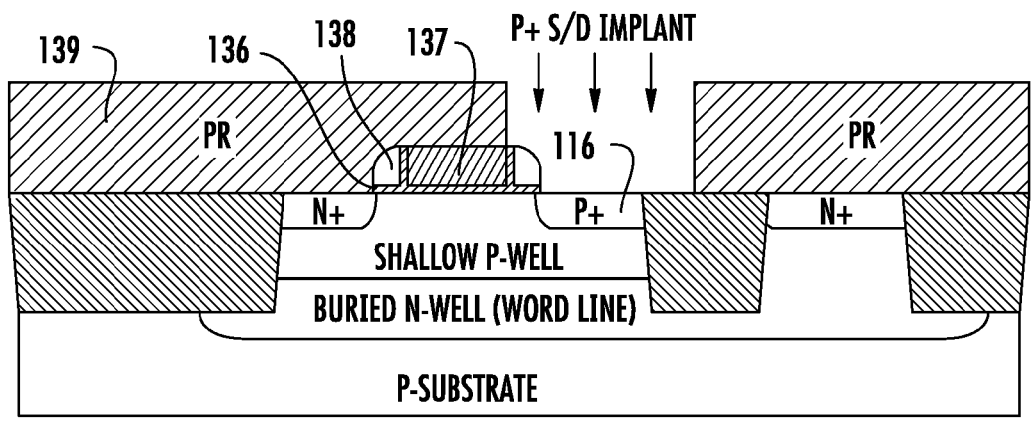

Referring to FIG. 14D, at step 131 of FIG. 13, the P-type base pick-up implant 116 is introduced. As with the emitter doping, the use of the dummy gate enables a large tolerance for the location of the right edge of photoresist 139. The bipolar base connection is shown in FIG. 14D by base contact region 116. Conventional CMOS processes are then used to provide metal electrical connections as needed among the various regions. Examples of these metal connections are illustrated below.

c. Lateral Bipolar Transistor

Instead of a vertical bipolar transistor, FIG. 15 illustrates an embodiment of the invention in which a lateral NPN bipolar transistor is provided. This is achieved by using the same N-type implant by which the emitter 115 was formed in the process described immediately above, to also form the collector region 140 in FIG. 15. An electrical contact to the P-well base region is formed either outside the annular trench isolation as depicted, or internally to that region at a cross-section other than the one depicted in FIG. 15. Because they require more substrate surface area, lateral bipolar transistors have increased base width, and thus usually have poorer performance than vertical bipolar transistors. In some applications where the number of masking steps is important, however, lateral bipolar transistors can be advantageous.

Figure 16:
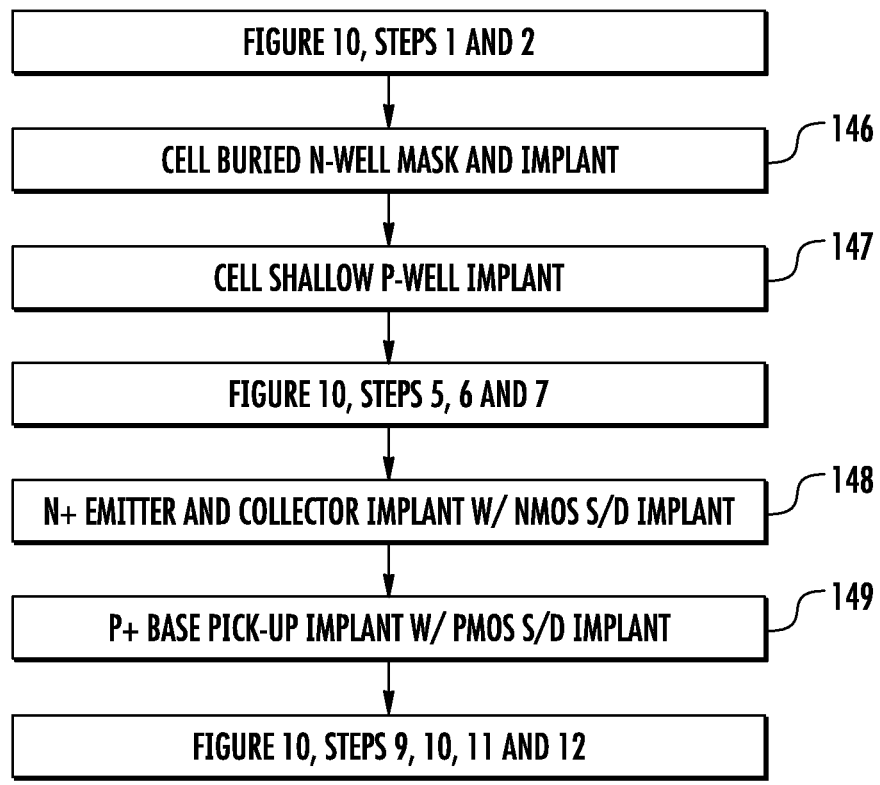
FIG. 16 is a flowchart of a process for fabricating the structure illustrated in FIG. 15.

FIG. 16 illustrates a process for forming the structure shown in FIG. 15. In the case of FIG. 16, and all subsequent figures here, the step of forming the trench isolation is not described, but is carried out before the process illustrated by the flowchart in the figure. In addition, the conventional steps of the CMOS process such as forming metal contacts, e.g. as illustrated by FIG. 10, are not described again here.

d. NMOS FET Merged Bipolar Transistor

FIGS. 17A-17D illustrate a process for forming an NMOS transistor merged with a vertical NPN bipolar transistor. Such a structure can be used in many applications beyond SRAMs, for example, voltage controlled oscillators, phase lock loop circuits, amplifiers, etc. The merged PMOS and/or NMOS structures recognizes that when we use the standard CMOS NFET/PFET self-aligned source/drain processing sequence to define the surface connections to the bipolar junction transistors (P+ anode, N+ shallow N-well connection, P+P-well connection), the resulting "un-intended FET" formed between the BJT terminals can be used advantageously to enhance the operation of the BJT circuit—in the situations described herein, in assisting the write operation of the thyristor as described above.

Figure 17A:
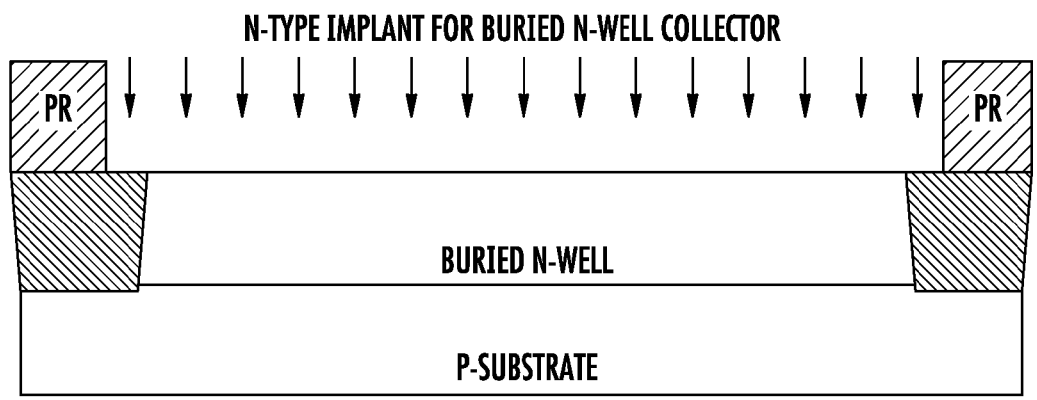
FIGS. 17A-17D illustrate a process for forming a merged NMOS-NPN structure.
Figure 17B:
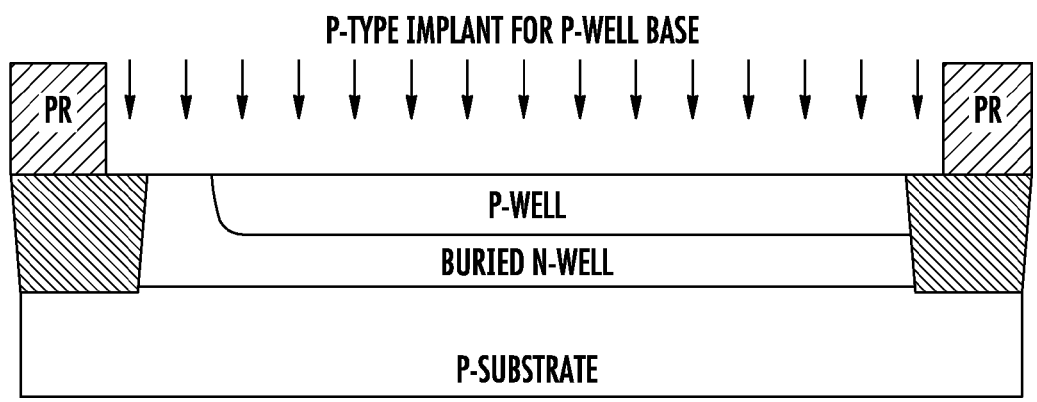
Figure 17C:
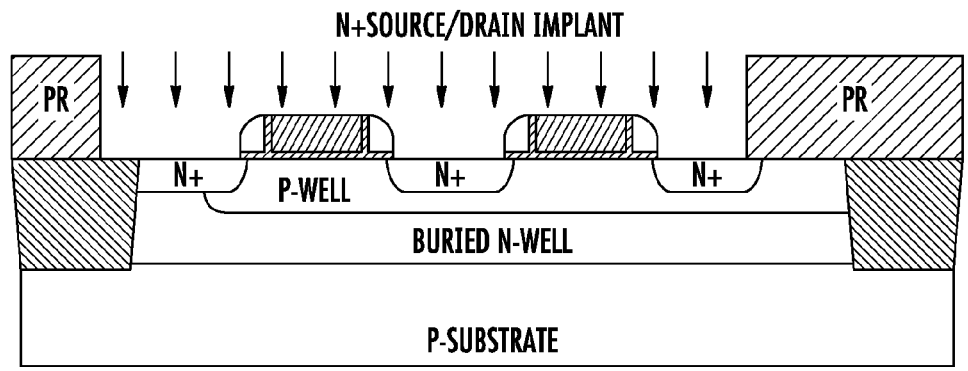
Figure 17D:
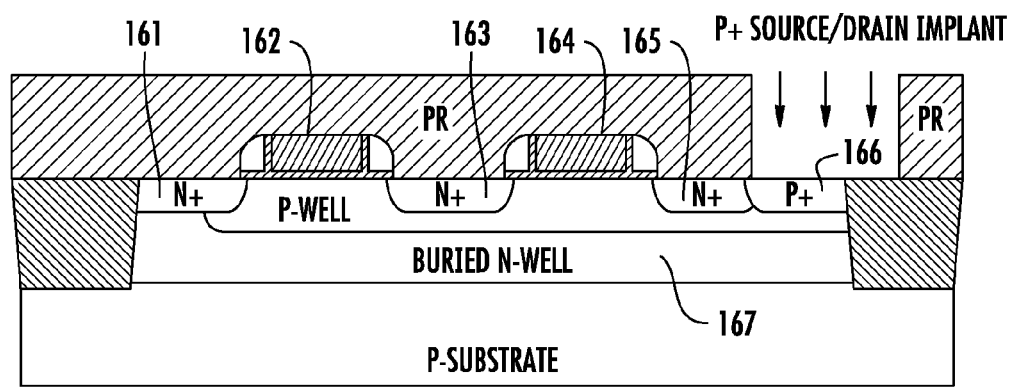

In the same manner as described above, FIG. 17A illustrates the implantation of a buried N-well which will become the NPN collector, and FIG. 17B the implantation of a shallow P-type well providing the NPN base. In FIG. 17C, FET gate regions have been formed which function as masks for the implantation of the N-type impurity for the NMOS source and drain. As shown in FIG. 17D, this N-type dopant also forms the emitter 163 and collector contact 161 for the vertical bipolar transistor. The dummy MOS gate 162 establishes the separation between the collector contact and the emitter. Regions 163 and 165 are the NMOS transistor source and drain, with a (functional) gate 164. Implant 166 provides a connection to the P-type region forming the base of the vertical NPN transistor. The NPN collector 167 is provided by the buried N-well.

e. SRAM Cell with FET Select Transistors

Figure 18A:
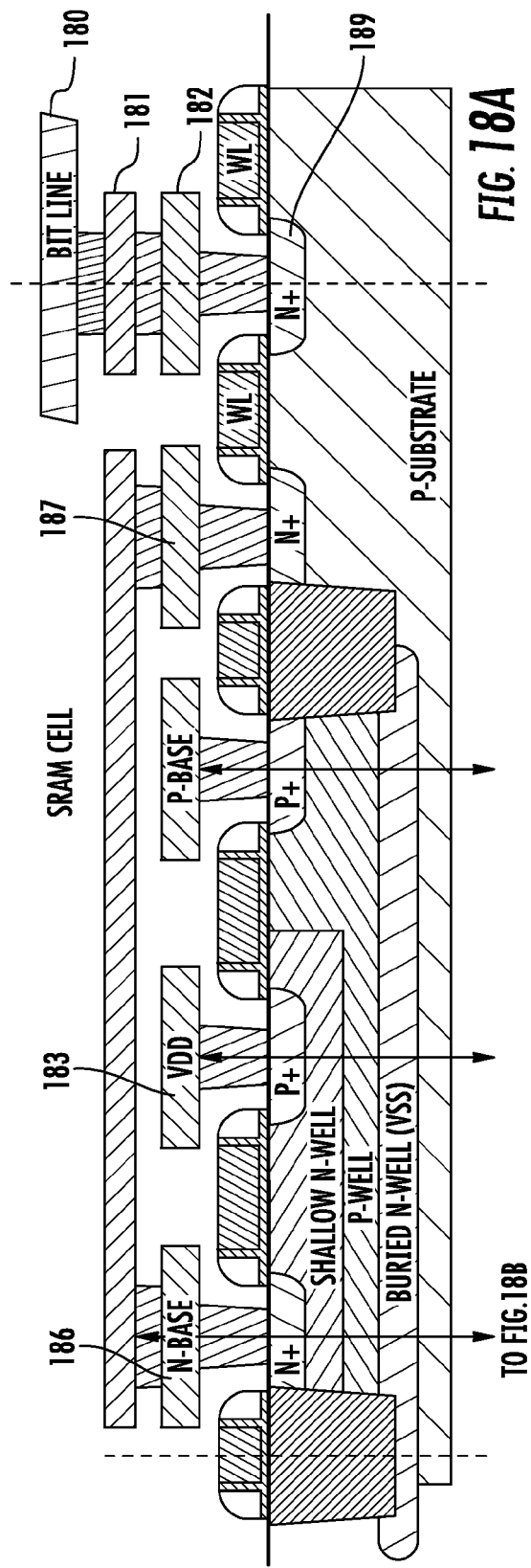
FIGS. 18A and 18B illustrate cross-sections of an SRAM cell.
Figure 18B:
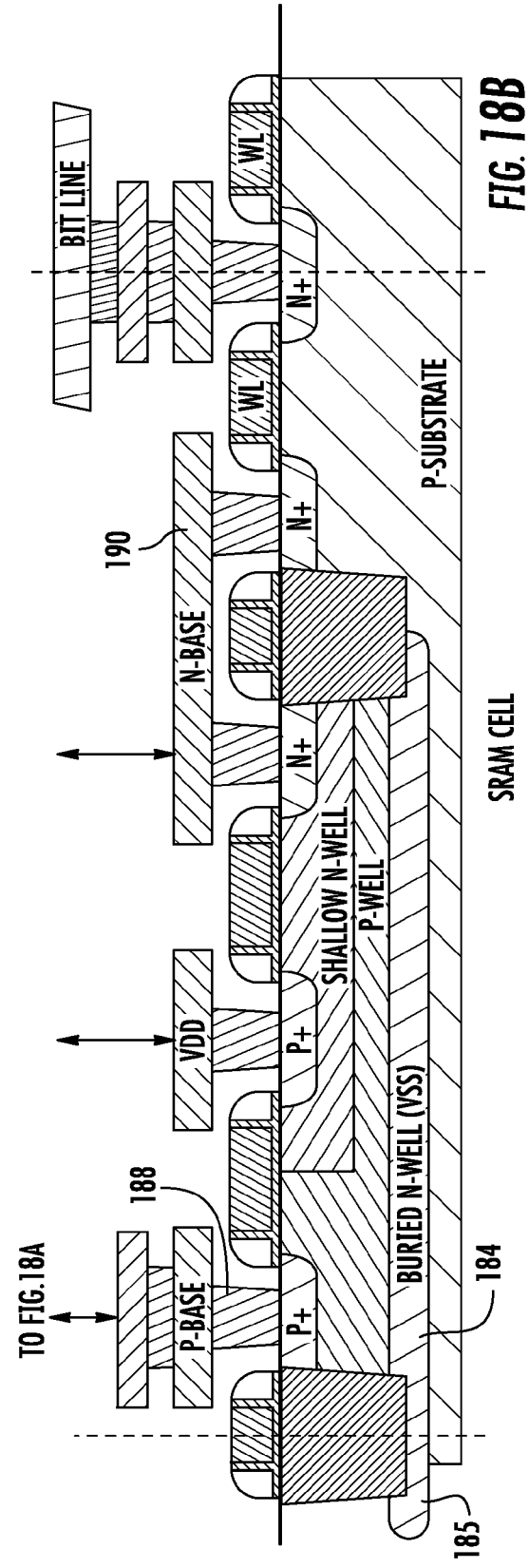

FIGS. 18A and 18B illustrate in cross-section the SRAM cell whose circuit schematic is shown in FIG. 3B. The SRAM cell consists of two pairs of cross-coupled bipolar transistors with MOS selection transistors coupled to the word line. The structure shown in FIG. 18A is formed in one tub isolated by shallow trench isolation regions, while the structure shown in FIG. 18B is formed in an adjacent tub. Connections between the two tubs are provided by metal interconnections shown at the top of each of FIGS. 18A and 18B and indicated as commonly connected by the double headed arrows between them. In FIG. 18A, a first layer of metal 182 provides a connection between the voltage supply VDD and the PNP emitter regions 186. Other separate regions of the first metal 182 provide a connection 188 between the transistor bases. The buried N-well region 184 provides a connection to the emitters of the NPN transistors. An electrical connection to this buried N-well is provided by a separate contact to that region 185 to the left of the figure where the buried well extends under the trench isolation region.

A second layer of metal 181 provides an electrical connection to the shallow N-well that provides the base of the NPN transistor 186 and one node of the NMOS selection transistor 187. The second layer of metal 181 also provides another connection (in a cross section not depicted in FIG. 18A or 18B) between the base of the PNP transistors 188 and the other node of the NMOS selection transistor 189. A third layer of metal 180 provides the bit line connections to the SRAM cell, with the bit line shown in FIG. 18A being coupled to one of the cross-coupled bipolar pairs, and the bit line shown in FIG. 18B being coupled to the other of the cross coupled bipolar pairs. FIG. 19 is a top view of the SRAM cell illustrating its layout on an integrated circuit.

Figure 20A:
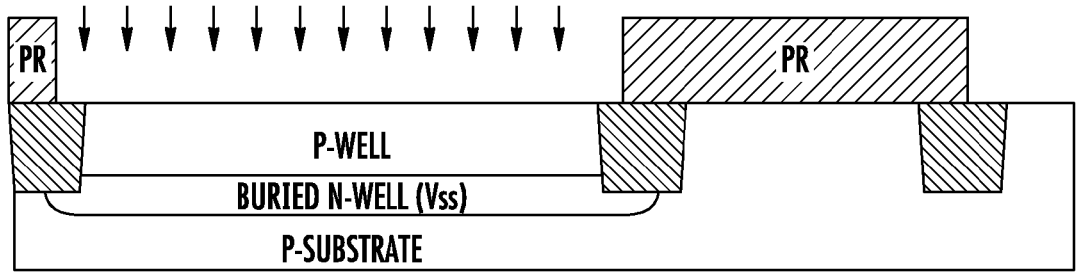
FIGS. 20A-20D illustrate portions of the process for forming the SRAM cell of FIGS. 18 and 19.
Figure 20B:
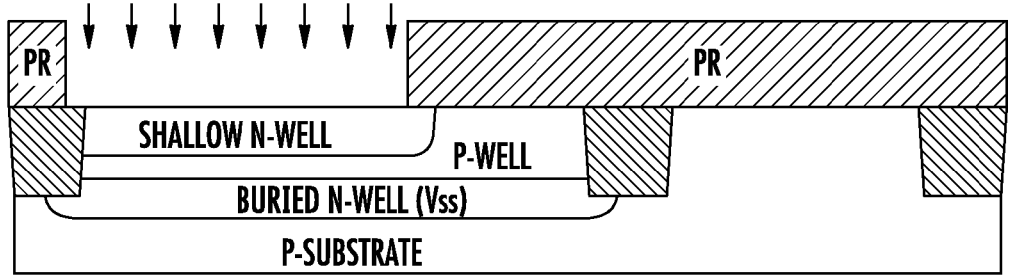
Figure 20C:
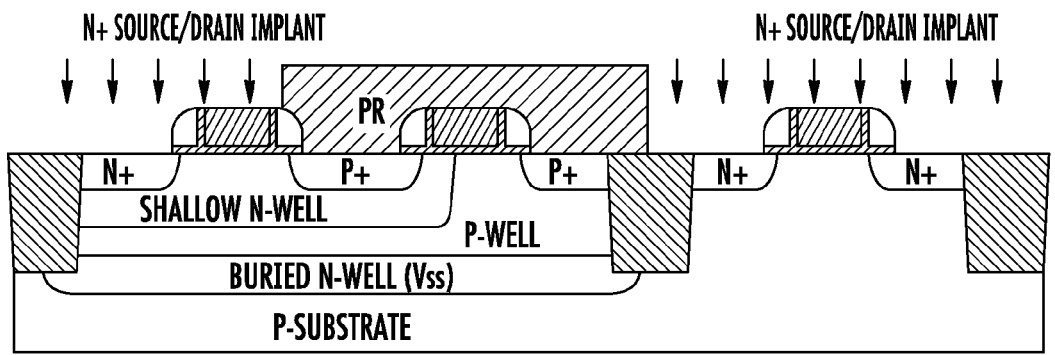
Figure 20D:
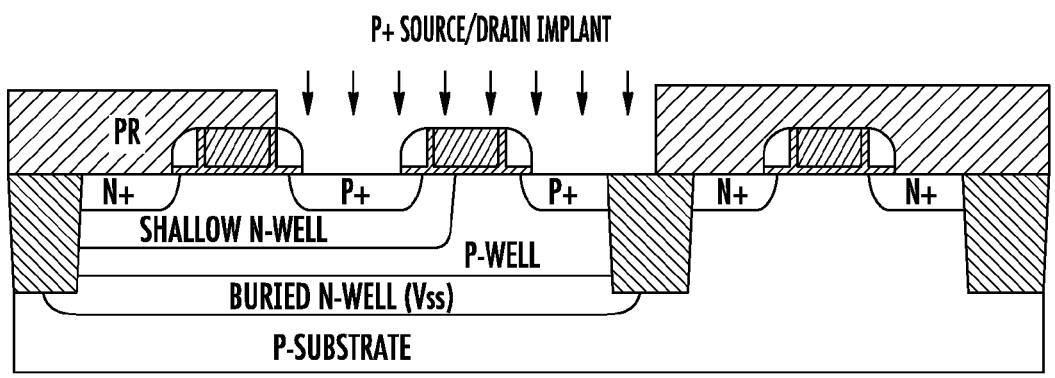

FIGS. 20A-20D illustrate in more detail portions of the process for forming the SRAM cell shown in FIGS. 18 and 19 above. As shown in FIG. 20A, after formation of the buried N-well to provide a VSS connection, the P-well is implanted through an opening in photoresist mask PR. Then, using another mask as shown by FIG. 20B, an N-type implant is performed to create the shallow N-well. As shown in FIG. 20C, after formation of dummy gate regions for the bipolar (left) side of the structure and functional gate regions for the FET (right) side of the structure, the NPN bipolar emitters, and the N-type sources and drains for the FETs are implanted in one operation with N-conductivity type impurity. Following that step, as shown in FIG. 20D, appropriate masking is performed to enable implantation of the P-type dopants to form the other electrodes of the bipolar (thyristor) devices. This step also forms PFET sources and drains elsewhere on the integrated circuit. The result is a compact fast SRAM cell that employs FETs as select transistors.

f. SRAM Cell with Bipolar Select Transistors

Figures 21A, 21B:
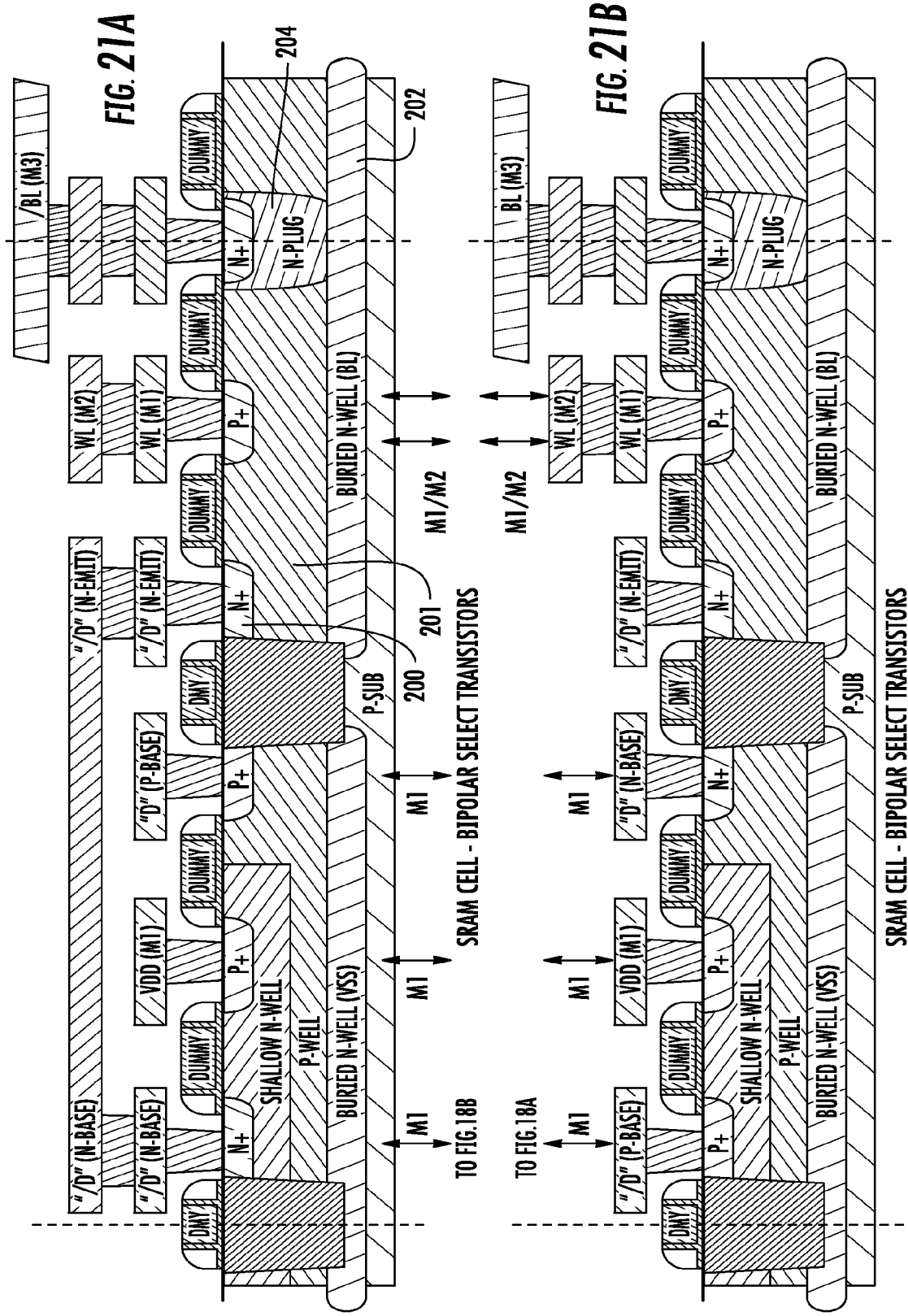
FIGS. 21A and 21B illustrates cross-sections of an SRAM cell with bipolar select transistors.

FIGS. 21A and 21B illustrate cross-sections of an SRAM cell in which bipolar transistors are used as select transistors. (FIG. 3A is a circuit schematic for this cell.) As with the figures above, the devices illustrated in the cross-section of FIG. 21A are formed in one tub and the devices illustrated in the cross-section of FIG. 21B are formed in an adjacent tub, with metal interconnections between the two. The left-hand portion of FIGS. 21A and 21B correspond to the bipolar structure described in FIGS. 18A and 18B (in which MOS transistors are used as select transistors). The right-hand portion of FIGS. 21A and 21B illustrate the use of bipolar selection transistors instead of the FETs illustrated in FIGS. 18A and 18B. These bipolar select transistors correspond to those depicted in the circuit schematic of FIG. 3A. In FIGS. 21A and 21B, the select transistors are vertical NPN bipolar transistors. Emitter 200, base 201, and collector 202 form one of the NPN select transistors. A strongly doped N-conductivity type region is used to provide a connection to the buried N-well 202, which also provides the bit line. Of course, vertical PNP bipolar transistors or lateral bipolar transistors could also be used as select transistors.

Figure 22:
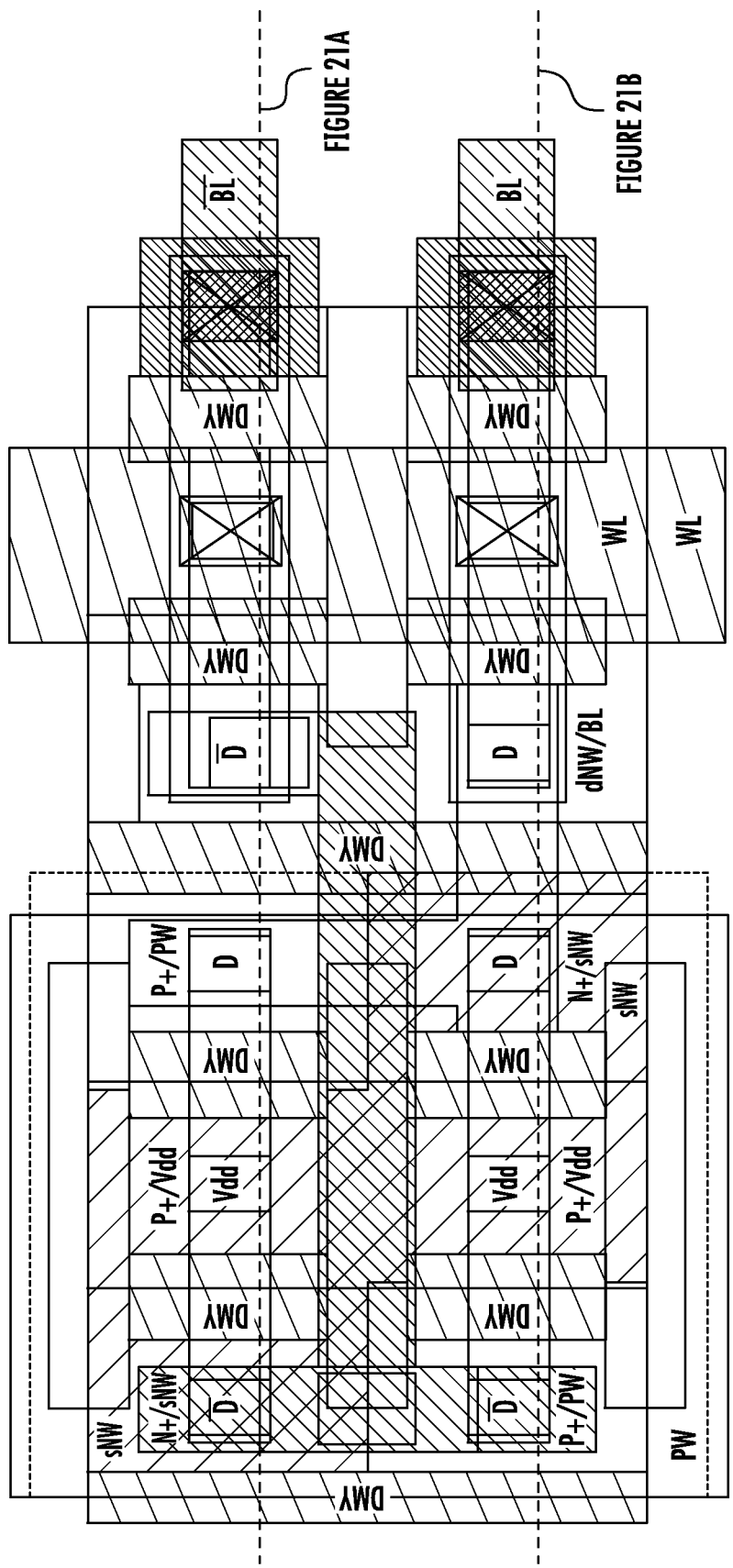
FIG. 22 is a top view of the structure shown in FIGS. 21A and 21B.
Figure 23A:
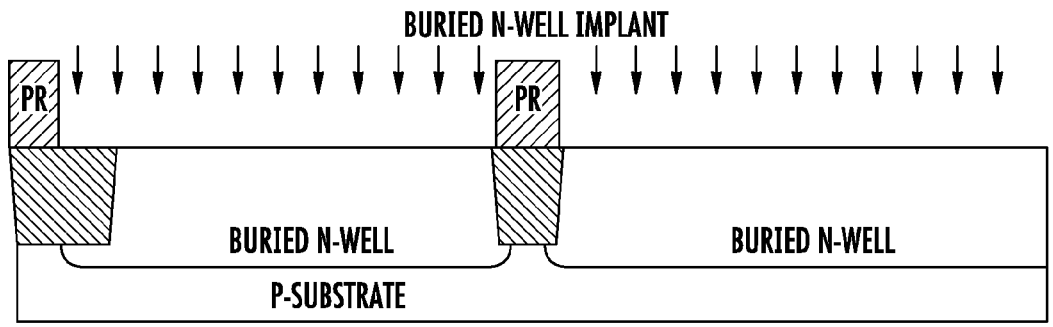
FIGS. 23A-23E illustrate process steps for making the structure of FIGS. 21 and 22.
Figure 23B:
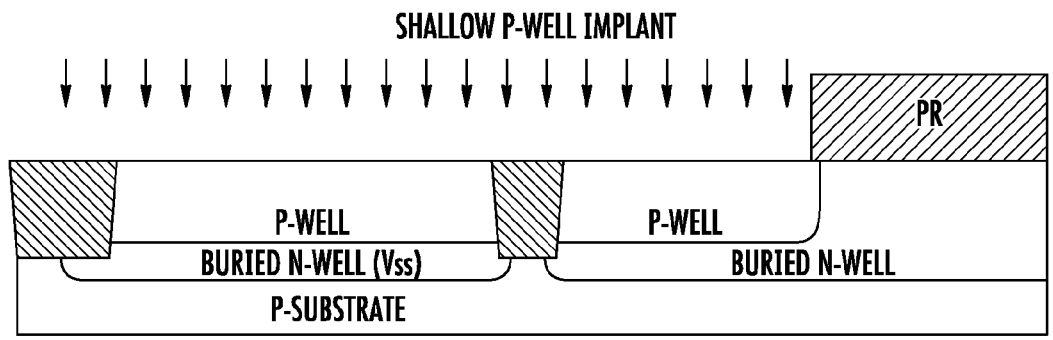
Figure 23C:
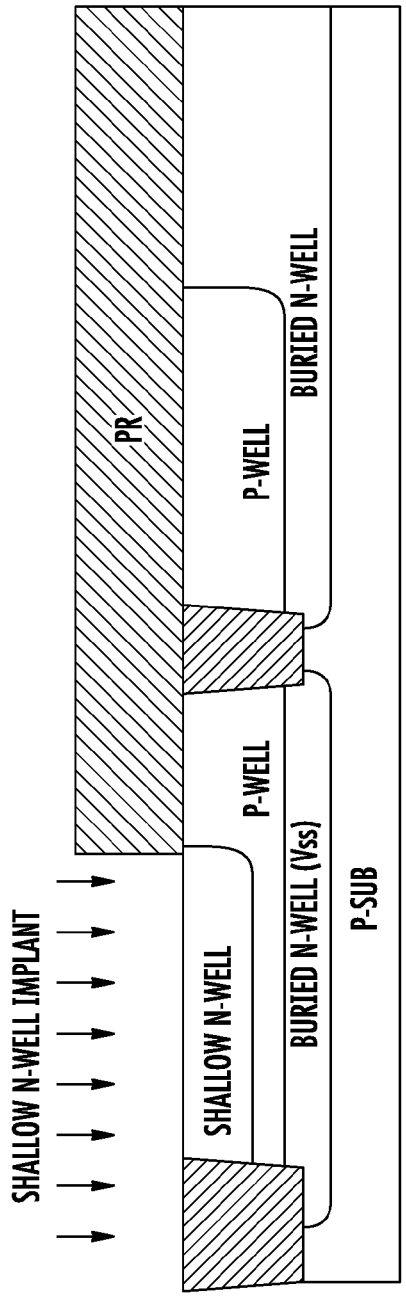
Figure 23D:
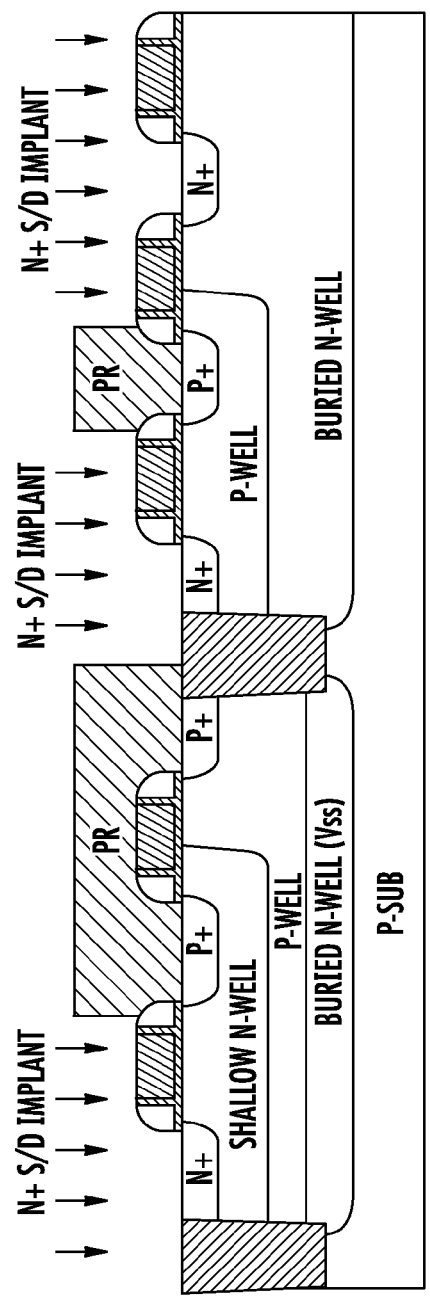
Figure 23E:
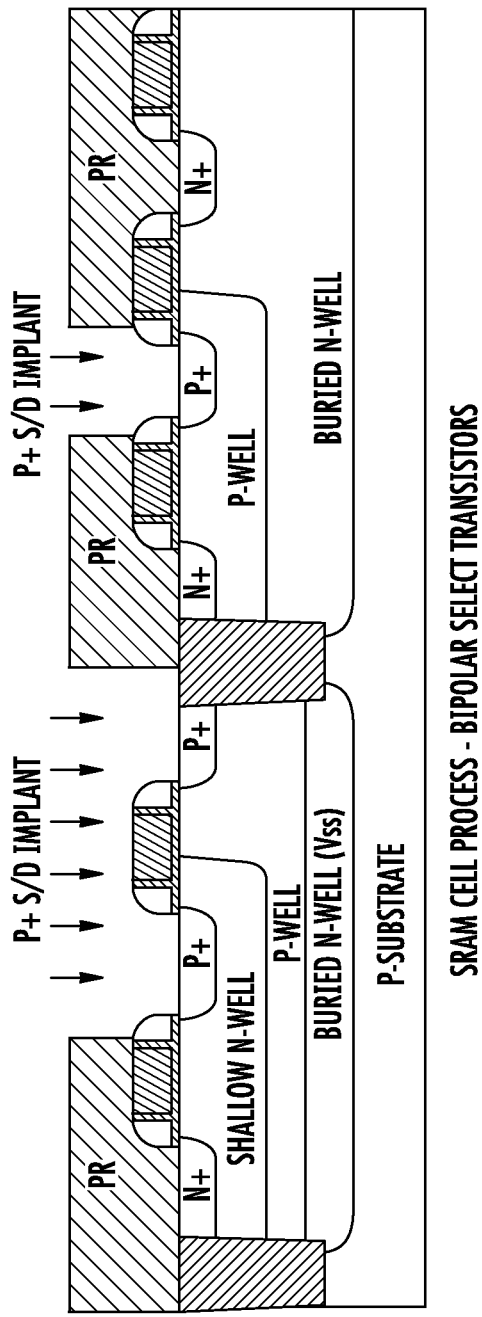

A top view of the SRAM cell in FIGS. 21A and 21B is shown in FIG. 22. The SRAM cell can be manufactured using the process flow operations described with respect to FIG. 18 et seq. Particular masking and implantation steps are shown in more detail in FIGS. 23A-23E. As shown in FIG. 23A, after formation of shallow trench isolation regions, the deep buried N-wells are implanted. Then, as shown in FIG. 23B, following appropriate masking operations, a shallow P-well implant is performed. Next, as shown in FIG. 23C, the shallow N-well is implanted into only a portion of one of the shallow P-well regions, thus leaving room for a later contact to the P-well. As shown by FIG. 23D, after formation of dummy FET gates and functional FET gates elsewhere on the integrated circuit, appropriate masking steps are performed and an N-type implant is used to dope the emitters of the vertical NPN bipolar transistors, as well as the sources and drains of the NMOS transistors elsewhere on the substrate. Then, as shown in FIG. 23E, after another masking step, P-type dopant is implanted to form the P-type emitters the PNP bipolar transistors, as well as the sources and drains of the PMOS transistors situated elsewhere on the substrate.

e. SRAM Cell in Deep Well

Figure 24:
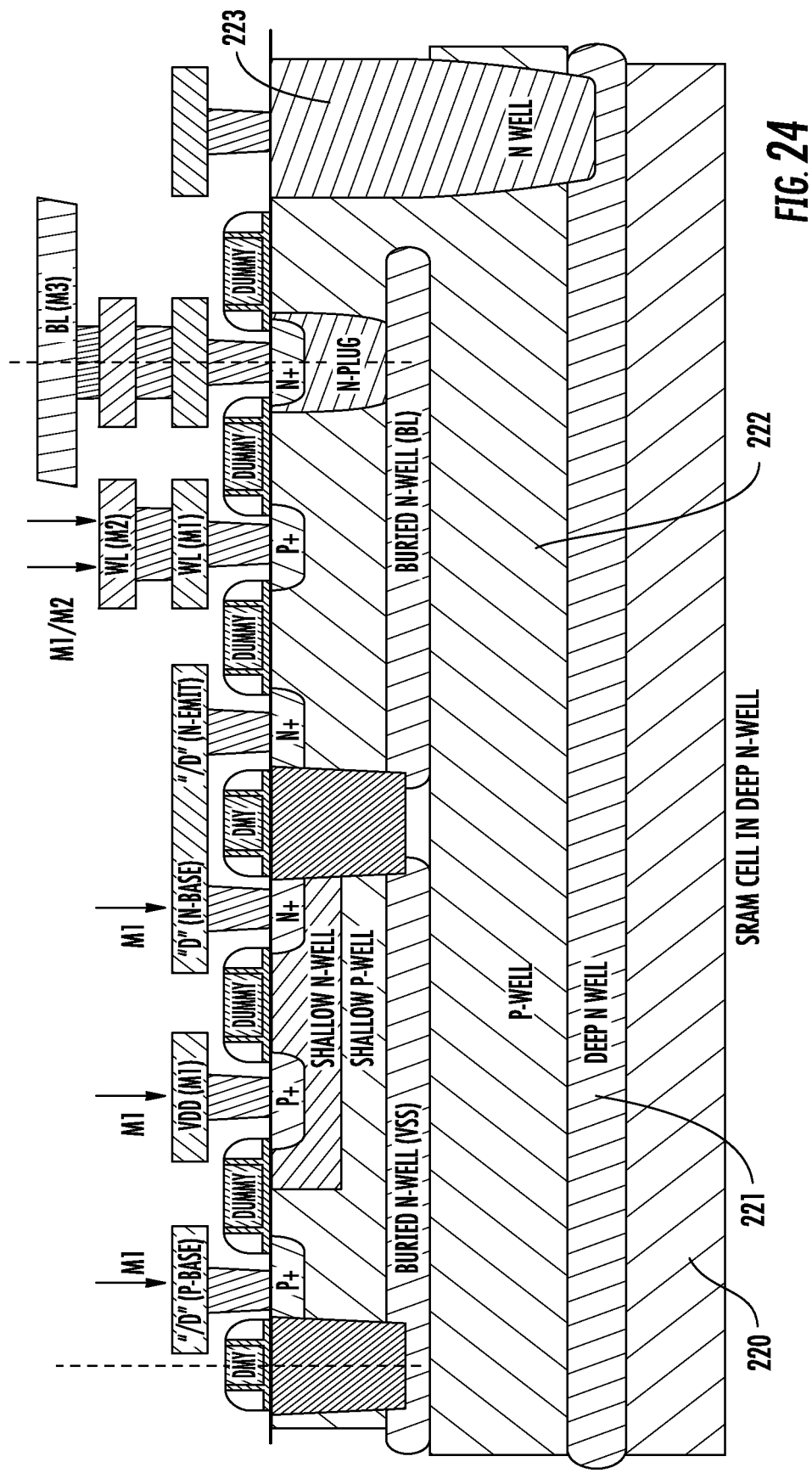
FIG. 24 illustrates a cross-section of an SRAM cell structure formed using a deep N-well.

FIG. 24 illustrates another embodiment of the invention in which an SRAM cell structure is formed using a deep N-well. To function more efficiently, a bipolar SRAM cell prefers a voltage higher than standard logic core voltage, as described earlier. One way to achieve this is to use a higher voltage as the SRAM power supply, for example, VDDIO or a voltage derived from VDDIO, i.e. about 1.5-2.5 volts with present technology of 28 nanometer design rules. Another approach is illustrated in FIG. 24. In this approach the SRAM cell is formed in a deep P-well 222 in a deep N-well 221 in the substrate 220. This allows the P-well 222 to be biased negatively. With bipolar select transistors, this approach allows the word line driver circuits to use core logic levels, e.g., voltage swings from 0 volts to 1.0 volts. A deep strongly doped region 223 is used to provide electrical contact to the deep N-well 221. First introducing the deep N-well implant 221, and then doping the P-well 222 form the structure illustrated in FIG. 31. Semiconductor processing as described above can then form the SRAM cell. In an appropriate stage of the process a heavily doped implant is used to provide the connection 223 to the deep N-well 221.

f. Three Transistor SRAM Cell

Figure 25:
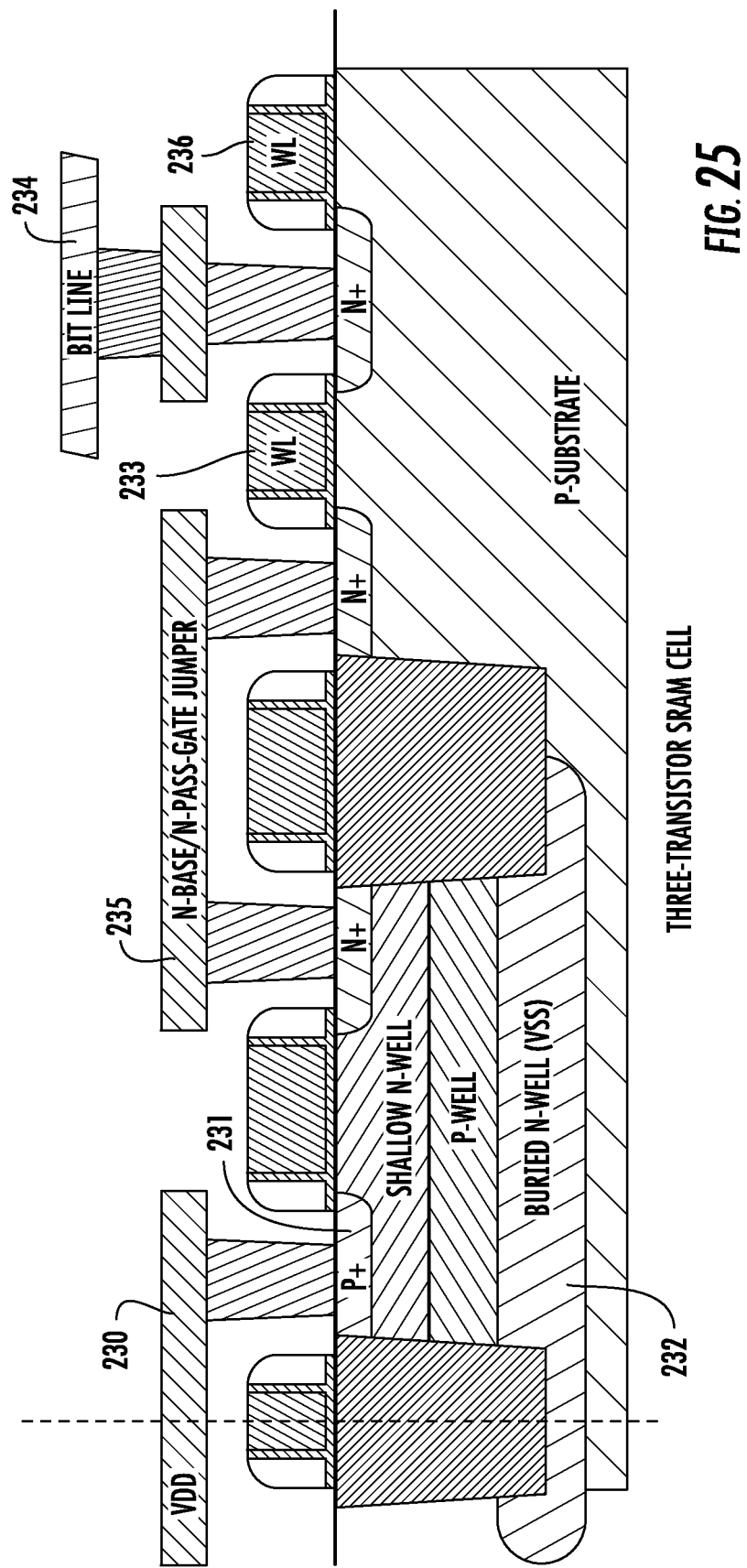
FIG. 25 is a cross-section of a three-transistor SRAM cell.

FIG. 25 is a cross-section of a 3-transistor SRAM cell whose circuit schematic is shown in FIG. 8A. This cell has cross-coupled NPN and PNP bipolar transistors which are illustrated as being in the left-hand portion of the figure. An MOS select transistor is shown on the right hand side of the illustration. The power supply $V_{DD}$ 230 is coupled to the emitter 231 of the PNP transistor, while the ground connection is coupled through a buried N-well 232 to the collector of the NPN transistor. The word line 233 is coupled to the gate of the MOS transistor, while the bit line 234 is coupled to an electrode of the MOS transistor. A connection 235 in the first layer metal couples the N-type base of the PNP transistor to the other electrode of the MOS transistor. A word line 236 for the SRAM cell next to the illustrated SRAM cell is shown on the right hand side of the figure.

Figure 26:
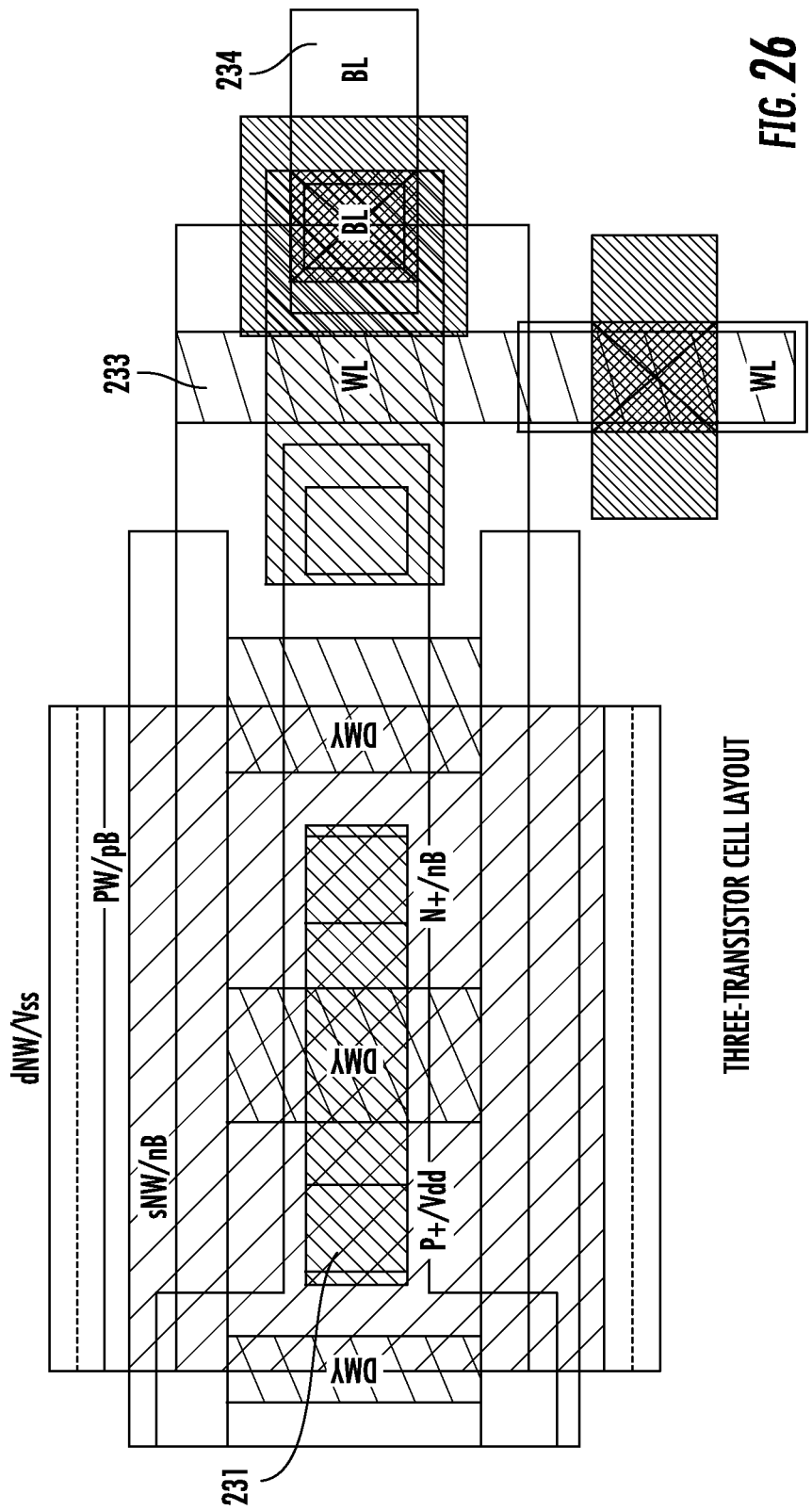
FIG. 26 is a top view of the layout of the three-transistor SRAM cell shown in FIG. 25.

FIG. 26 is a top view of the layout of the 3-transistor SRAM cell illustrated in FIG. 25. Regions illustrated in FIG. 26 that correspond to regions in FIG. 25 are given the same reference numerals as those in FIG. 25.

g. Four Transistor SRAM Cell

Figure 28:
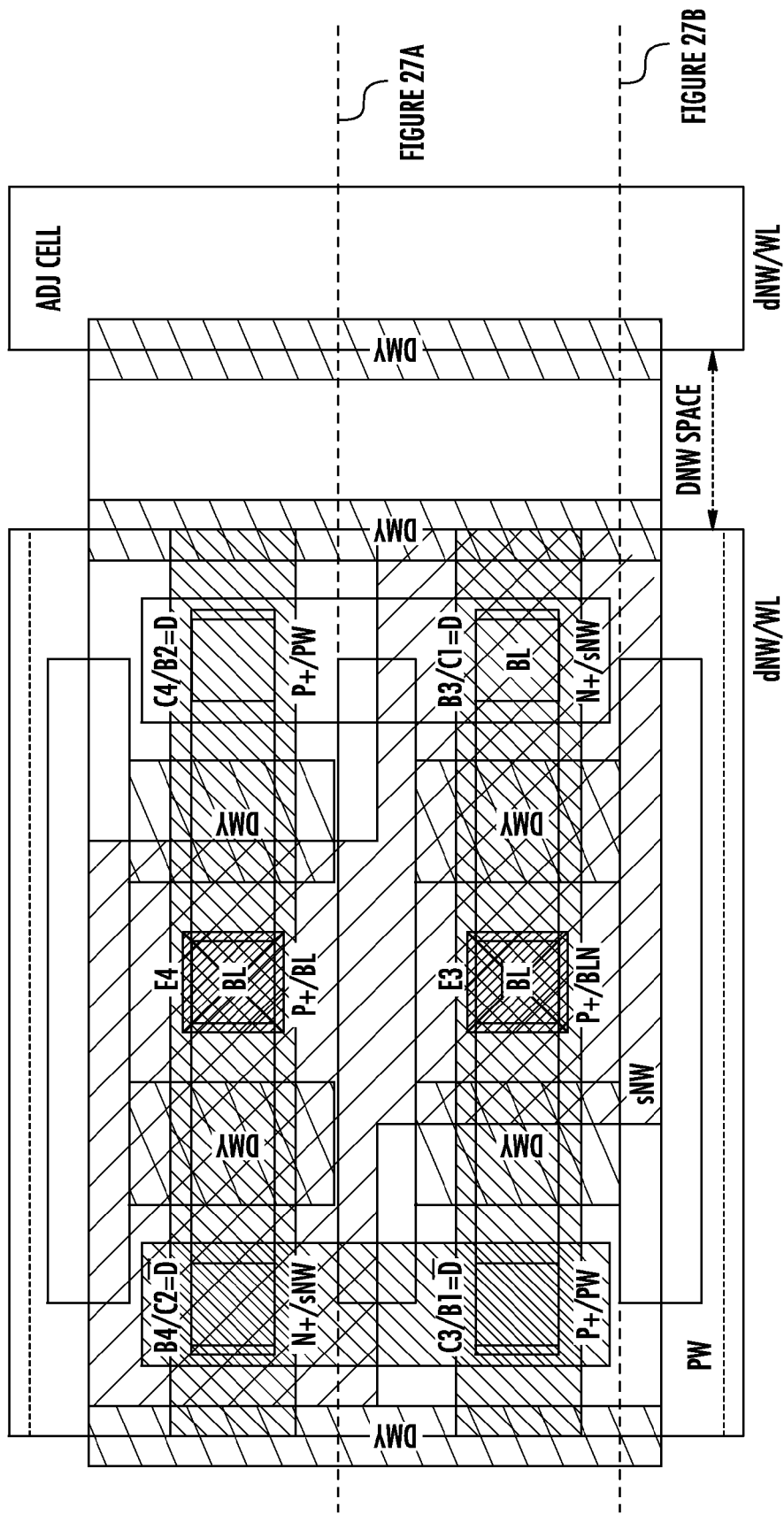
FIG. 28 is a top view of the structure shown in FIGS. 27A and 27B.

FIGS. 27A and 27B are cross-sectional views at two locations of a 4-transistor SRAM cell. The structure is almost identical to that described with respect to FIG. 18. In contrast with that structure, however, the structure of FIGS. 27A and 27B use the buried N-well 240 to provide the word line, and requires only two layers of metal, instead of three. A circuit schematic for the 4-transistor cell is shown in FIG. 4A. The bit line (FIG. 27B), and complementary bit line (FIG. 27A), are coupled to the emitters 242 of the PNP bipolar transistors. The arrows labeled "Ml" illustrate the use of the first layer metal to provide cross coupling between the base of the PNP transistor and the collector of the NPN transistor, and between the base of the NPN transistors and the collector of the PNP transistors. FIG. 28 is a top view of the structure shown in FIGS. 27A and 27B.

h. Four Transistor SRAM Cell with Write Assist FETs

Figure 29A:
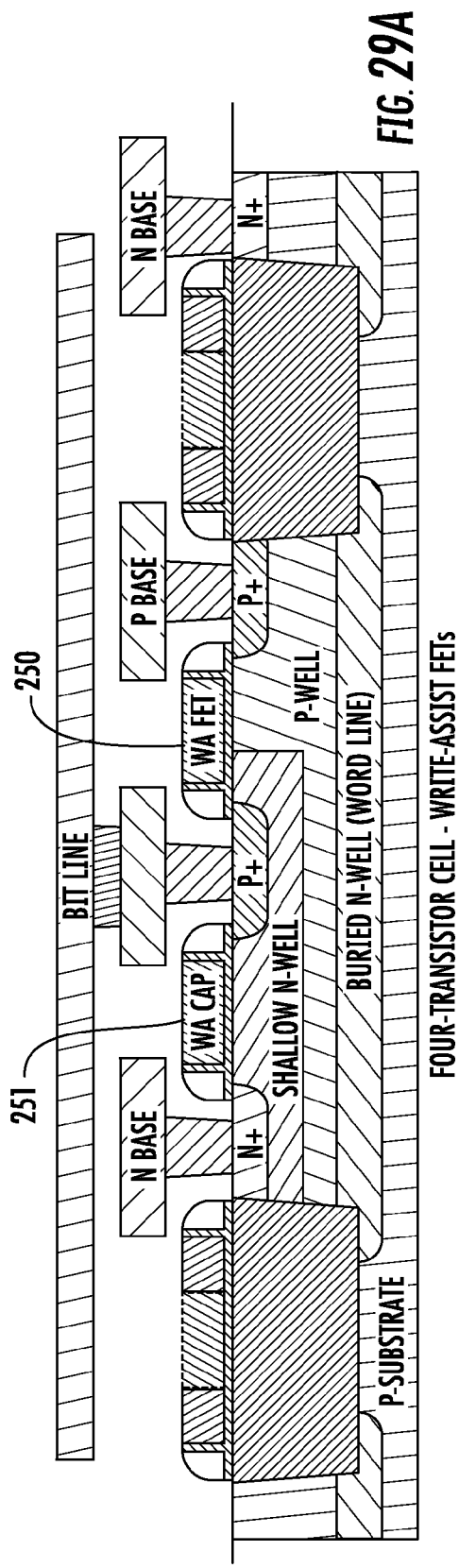
FIGS. 29A and 29B illustrate cross-sectional view of a four-transistor SRAM cell with write assist FETs.
Figure 29B:
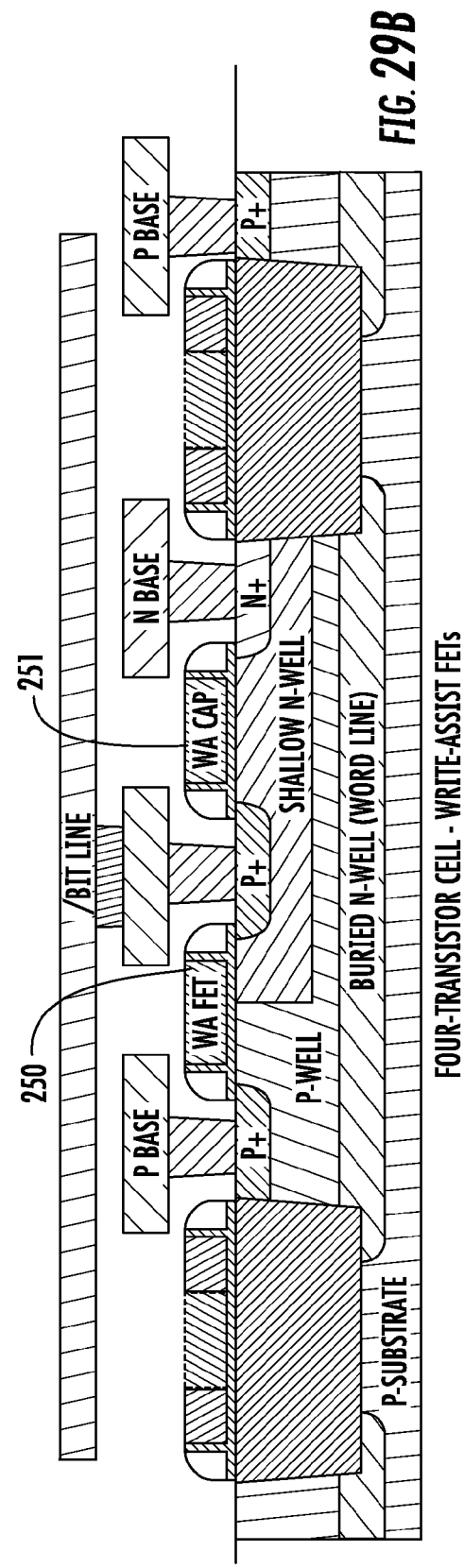
Figure 30:
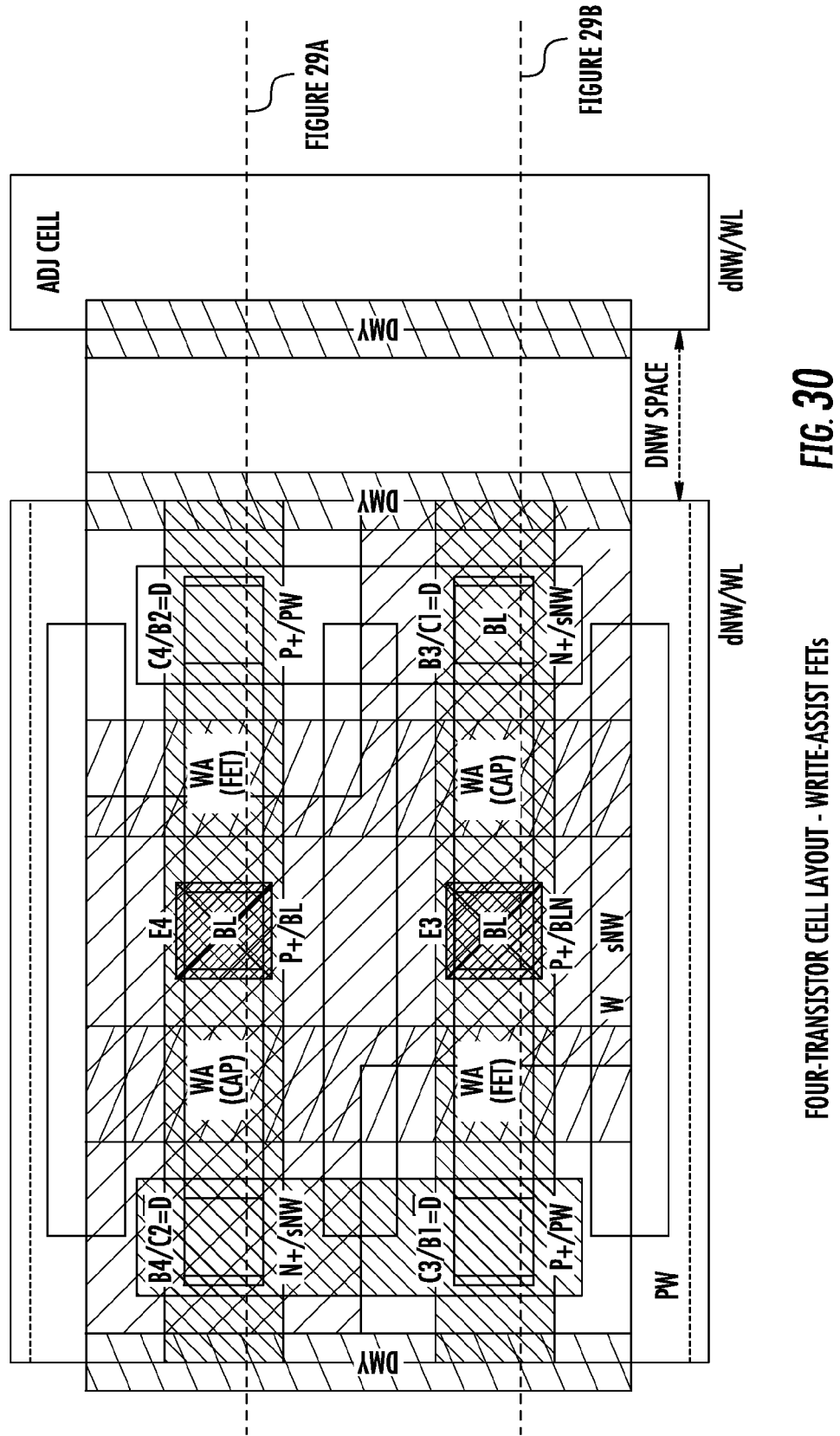
FIG. 30 is a top view of the structure shown in FIGS. 29A and 29B.

FIGS. 29A and 29B illustrate cross-sectional views of a 4-transistor SRAM cell with the additional write assist FETs 250 earlier described in conjunction with the circuit schematic shown in FIG. 7. The write assist FETs 250 (PMOS transistors 46A and 46B in FIG. 7), when turned on, short the collector to the base of the lateral PNP bipolar transistors. The write assist capacitors 251 (capacitors 47A and 47B in FIG. 7) described above are also illustrated in the figure. FIG. 30 is a top view of the structure shown in FIGS. 29A and 29B.

g. Two Transistor SRAM Cell

Figure 31:
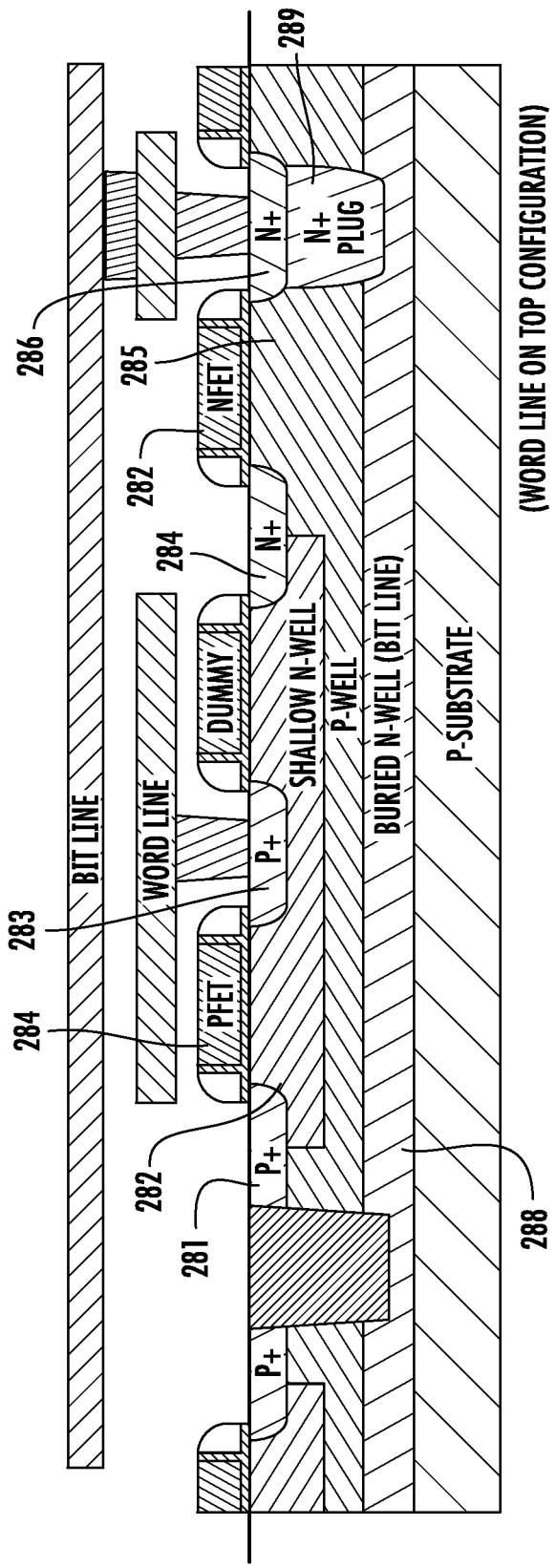
FIG. 31 is a cross-sectional view of a two-transistor SRAM cell.

FIG. 31 is cross-sectional views of a two bipolar transistor memory cell with write assist FETs provided to short the bipolar transistors, as needed, for writing data. The cell circuit was discussed above with regard to FIG. 9B. The upper PNP transistor in FIG. 31 includes emitter 281, base 282 and collector 283 with the gate (PFET) 284 able to short the emitter and collector. Similarly the lower NPN transistor includes collector 284, base 285 and emitter 286. The gate (NFET) can short the emitter and collector. Note that the shallow N-well cross-couples the PNP base 282 to the NPN collector 284, while the P-well cross-couples the NPN base 285 to the PNP emitter 281. The buried N-well 288 and its coupling 289 to the second layer of metal provides the bit line, while the word line is coupled to the PNP emitter. In an alternative embodiment with the word line on the bottom, the word line is coupled to the NPN collector. The structure shown in FIG. 31 can be manufactured using the process described with regard to FIG. 18.

i. Manufacturing Process Details

Figure 32:
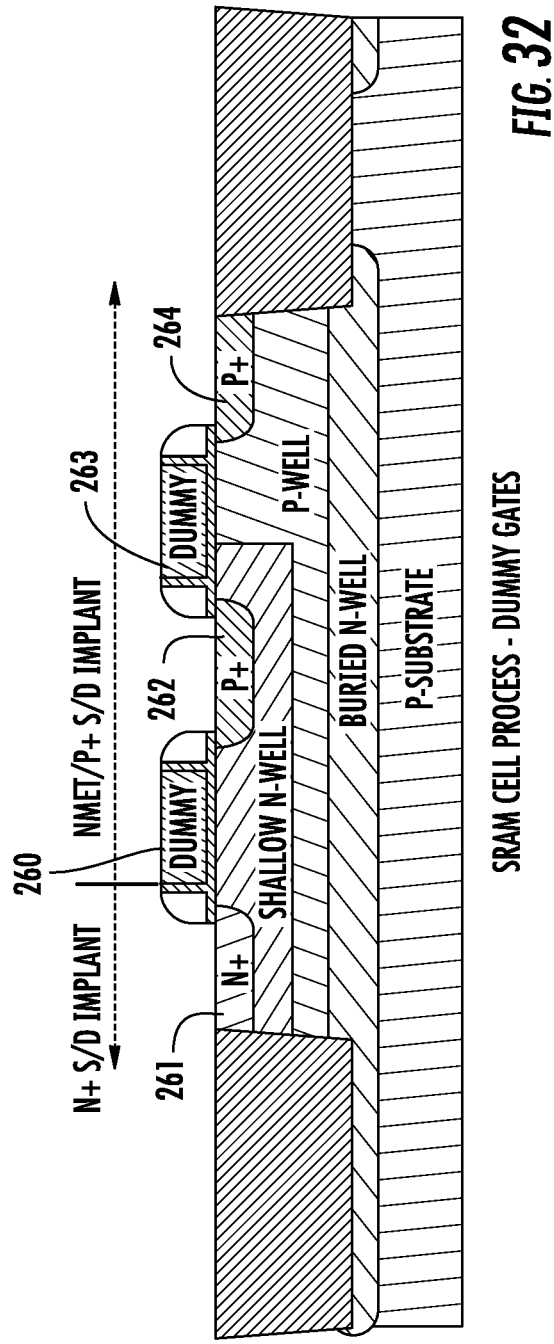
FIG. 32 is a cross-sectional view of the SRAM cell processes with dummy gates.

FIG. 32 illustrates a detail of the manufacturing process used throughout the various embodiments described above. In particular, using CMOS technology, the gates for the MOS transistors can be used in the process in which bipolar transistors are formed. Using CMOS technology to define gate regions, instead of being used as gates, those regions can be used to define the spacing of the various bipolar transistor regions. In FIG. 32 a first "dummy" gate 260 is used to set the spacing between N doped emitter 261 and a nearby P-doped region 262. In a similar manner, another "dummy" gate 263 is used to define the spacing between a P doped contact region 264 for a well and the P-doped region 262. This technique allows the use of CMOS process technology to form bipolar transistors, yet have those bipolar regions self-aligned to various other desired regions in the integrated circuit.

Figure 33:
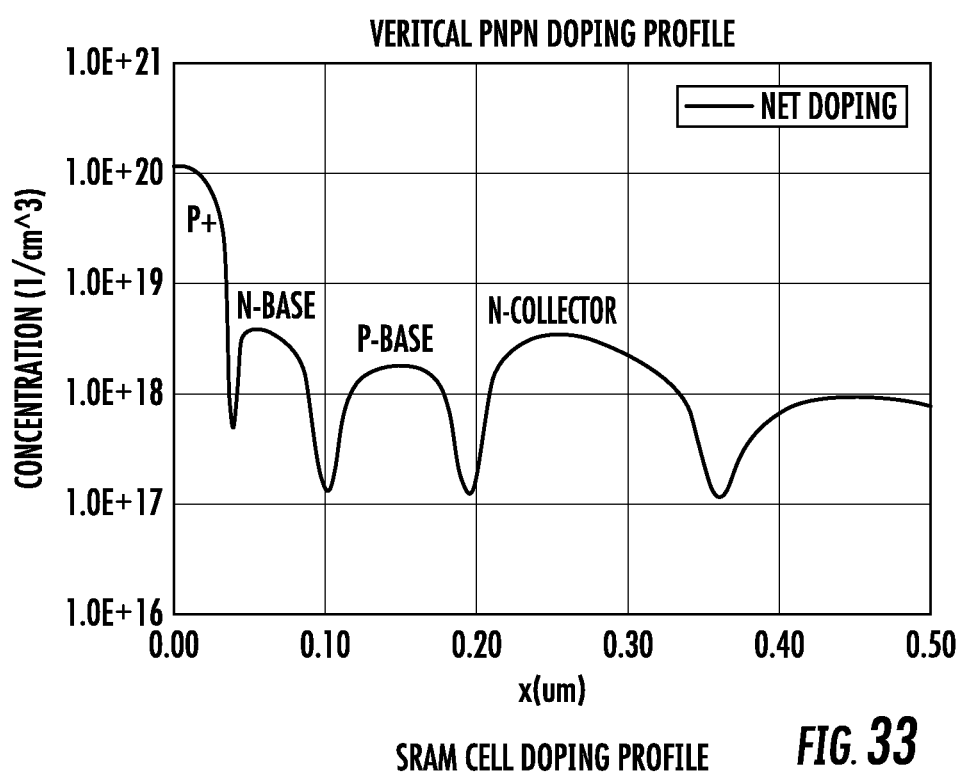
FIG. 33 is a graph illustrating typical dopant concentrations for vertical bipolar transistors.

FIG. 33 is a graph illustrating typical dopant concentrations for the vertical bipolar transistors described with regard to the figures above. The graph shows the net doping of the various regions used to form the bipolar transistors in preferred embodiments of the invention.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

The invention claimed is:

1. For an integrated circuit having an array of SRAM cells interconnected by a plurality of complementary bit line pairs and a plurality of word lines, each SRAM cell having a pair of cross-coupled thyristors, each thyristor having first and second semiconductor regions intermediate an anode and a cathode, a first intermediate region of one thyristor connected to the second intermediate region of the other thyristor and a second intermediate region of the one thyristor connected to the first intermediate region of the other thyristor, each thyristor having an anode connected to a first supply voltage and a cathode connected to a second supply voltage, and a pair of bipolar select transistors, each bipolar select transistor having a collector region connected to one of a complementary bit line pair, and an emitter region connected to the first intermediate region of one of the thyristors, and having a base region connected to a word line, a method of reading an SRAM cell in the array comprising:
  selecting at least one SRAM cell;
  raising the first supply voltage from a standby mode voltage of the at least one selected SRAM cell; and
  raising the voltage on the word line connected to the bipolar select transistors of the at least one selected SRAM cell with a delay after the step of raising the first supply voltage;
  whereby a state of the at least one selected SRAM cell is read through a complementary bit line pair connected to the bipolar select transistors of the at least one selected SRAM cell.

2. The method of claim 1 wherein the delay is in the range of 10-60 picoseconds.

3. The method of claim 1 wherein the step of raising the first supply voltage comprises raising the first supply voltage from 0.6 volts to 1.4 volts.

4. The method of claim 1 further comprising raising a voltage on the complementary bit line pair from a standby voltage before the step of raising the word line voltage.

5. The method of claim 4 wherein the step of raising the complementary bit line pair voltage comprises raising the voltage from 0.6 volts to 1.4 volts.

6. For an integrated circuit having an array of SRAM cells interconnected by a plurality of complementary bit line pairs and a plurality of word lines, each SRAM cell having a pair of cross-coupled thyristors, each thyristor having first and second semiconductor regions intermediate an anode and a cathode, a first intermediate region of one thyristor connected to the second intermediate region of the other thyristor and a second intermediate region of the one thyristor connected to the first intermediate region of the other thyristor, each thyristor having an anode connected to a first supply voltage and a cathode connected to a second supply voltage, and a pair of bipolar select transistors, each bipolar select transistor having a collector region connected to one of a complementary bit line pair, and an emitter region connected to the first intermediate region of one of the thyristors, and having a base region connected to a word line, a method of reading an SRAM cell in the array, comprising:
  selecting at least one SRAM cell;
  raising the voltage on the word line connected to the bipolar select transistors of the selected SRAM cell from a word line standby voltage;
  raising a voltage on the complementary bit line pair from a standby voltage before the step of raising the word line voltage; and
  raising the first supply voltage from a first supply standby voltage, the first supply voltage below the raised word line voltage;
  whereby a state of the at least one selected SRAM cell is read through a complementary bit line pair connected to the bipolar select transistors of the at least one selected SRAM cell.

7. The method of claim 6 wherein the step of raising the word line voltage comprises raising the word line voltage from 0.0 volts to 1.6 volts.

8. The method of claim 6 wherein the step of raising the first supply voltage comprises raising the first supply voltage from 0.6 volts to 1.4 volts.

9. The method of claim 6 wherein the step of raising the complementary bit line pair voltage comprises raising the voltage from 0.6 volts to 1.4 volts.

10. For an integrated circuit having an array of SRAM cells interconnected by a plurality of complementary bit line pairs and a plurality of word lines, each SRAM cell having a pair of cross-coupled thyristors, each thyristor having first and second semiconductor regions intermediate an anode and a cathode, a first intermediate region of one thyristor connected to the second intermediate region of the other thyristor and a second intermediate region of the one thyristor connected to the first intermediate region of the other thyristor, each thyristor having an anode connected to a first supply voltage and a cathode connected to a second supply voltage, and a pair of bipolar select transistors, each bipolar select transistor having a collector region connected to one of a complementary bit line pair, and an emitter region connected to the first intermediate region of one of the thyristors, and having a base region connected to a word line, a method of reading an SRAM cell in the array, comprising:
  selecting at least one SRAM cell;
  raising the voltage on the word line connected to the bipolar select transistors of the selected SRAM cell from a word line standby voltage; and
  raising the first supply voltage from a first supply standby voltage, the first supply voltage below the raised word line voltage, the step of raising the word line voltage delayed with respect to the step of raising the first supply voltage;
  whereby a state of the at least one selected SRAM cell is read through a complementary bit line pair connected to the bipolar select transistors of the at least one selected SRAM cell.

11. The method of claim 10 wherein the step of raising the word line voltage comprises raising the word line voltage from 0.0 volts to 1.6 volts.

12. The method of claim 10 wherein the step of raising the first supply voltage comprises raising the first supply voltage from 0.6 volts to 1.4 volts.

13. The method of claim 10 further comprising raising a voltage on the complementary bit line pair from a standby voltage before the step of raising the word line voltage.

14. The method of claim 13 wherein the step of raising the complementary bit line pair voltage comprises raising the voltage from 0.6 volts to 1.4 volts.

15. The method of claim 10 wherein the step of raising the word line voltage is delayed with respect to the step of raising the first supply voltage from 10-60 picoseconds.

16. The method of claim 15 wherein the step of raising the word line voltage comprises raising the word line voltage from 0 volts to 1.6 volts.

17. The method of claim 15 wherein the step of raising the first supply voltage comprises raising the first supply voltage from 0.6 volts to 1.4 volts.

18. The method of claim 10 further comprising raising a voltage on the complementary bit line pair from a standby voltage before the step of raising the word line voltage.

19. The method of claim 18 wherein the step of raising the complementary bit line pair voltage comprises raising the voltage from 0.6 volts to 1.4 volts.

* * * * *